United States Patent
Waldern et al.

(10) Patent No.: US 11,402,801 B2
(45) Date of Patent: Aug. 2, 2022

(54) SYSTEMS AND METHODS FOR FABRICATING A MULTILAYER OPTICAL STRUCTURE

(71) Applicant: DigiLens Inc., Sunnyvale, CA (US)

(72) Inventors: Jonathan David Waldern, Los Altos Hills, CA (US); Alastair John Grant, San Jose, CA (US); Milan Momcilo Popovich, Leicester (GB)

(73) Assignee: DigiLens Inc., Sunnyvale, CA (US)

( * ) Notice: Subject to any disclaimer, the term of this patent is extended or adjusted under 35 U.S.C. 154(b) by 471 days.

(21) Appl. No.: 16/522,491

(22) Filed: Jul. 25, 2019

(65) Prior Publication Data

US 2020/0033801 A1 Jan. 30, 2020

Related U.S. Application Data

(60) Provisional application No. 62/703,329, filed on Jul. 25, 2018.

(51) Int. Cl.
*G02B 5/18* (2006.01)
*G03H 1/02* (2006.01)
(Continued)

(52) U.S. Cl.
CPC .......... *G03H 1/0248* (2013.01); *B05D 1/005* (2013.01); *B05D 1/02* (2013.01); *B05D 5/061* (2013.01); *G02B 5/1857* (2013.01); *G02B 6/0065* (2013.01); *G03F 7/001* (2013.01); *G03H 2001/0441* (2013.01);
(Continued)

(58) Field of Classification Search
CPC .................................................. G02B 5/1857
See application file for complete search history.

(56) References Cited

U.S. PATENT DOCUMENTS

| 1,043,938 A | 11/1912 | Huttenlocher |
| 2,141,884 A | 12/1938 | Sonnefeld |

(Continued)

FOREIGN PATENT DOCUMENTS

| BR | PI0720469 A2 | 1/2014 |
| CA | 2889727 A1 | 6/2014 |

(Continued)

OTHER PUBLICATIONS

Extended European Search Report for European Application No. 18898154.2, Search completed Aug. 13, 2021, dated Aug. 23, 2021, 7 Pgs.

(Continued)

*Primary Examiner* — Joseph L Williams
(74) *Attorney, Agent, or Firm* — KPPB LLP

(57) ABSTRACT

Systems and methods for fabricating optical elements in accordance with various embodiments of the invention are illustrated. One embodiment includes a method for fabricating an optical element, the method including providing a first optical substrate, depositing a first layer of a first optical recording material onto the first optical substrate, applying an optical exposure process to the first layer to form a first optical structure, temporarily erasing the first optical structure, depositing a second layer of a second optical recording material, and applying an optical exposure process to the second layer to form a second optical structure, wherein the optical exposure process includes using at least one light beam traversing the first layer.

20 Claims, 6 Drawing Sheets

(51) Int. Cl.
  *B05D 1/02* (2006.01)
  *B05D 1/00* (2006.01)
  *G03F 7/00* (2006.01)
  *B05D 5/06* (2006.01)
  *F21V 8/00* (2006.01)
  *G03H 1/04* (2006.01)
  *G03H 1/26* (2006.01)

(52) U.S. Cl.
  CPC . *G03H 2001/2605* (2013.01); *G03H 2260/12* (2013.01); *G03H 2260/33* (2013.01)

(56) References Cited

U.S. PATENT DOCUMENTS

| | | |
|---|---|---|
| 3,482,498 A | 12/1969 | Becker |
| 3,620,601 A | 11/1971 | Leonard et al. |
| 3,741,716 A | 6/1973 | Johne et al. |
| 3,843,231 A | 10/1974 | Borel et al. |
| 3,851,303 A | 11/1974 | Muller |
| 3,885,095 A | 5/1975 | Wolfson et al. |
| 3,940,204 A | 2/1976 | Withrington |
| 3,965,029 A | 6/1976 | Arora |
| 3,975,711 A | 8/1976 | McMahon |
| 4,035,068 A | 7/1977 | Rawson |
| 4,066,334 A | 1/1978 | Fray et al. |
| 4,082,432 A | 4/1978 | Kirschner |
| 4,099,841 A | 7/1978 | Ellis |
| 4,178,074 A | 12/1979 | Heller |
| 4,218,111 A | 8/1980 | Withrington et al. |
| 4,232,943 A | 11/1980 | Rogers |
| 4,248,093 A | 2/1981 | Andersson et al. |
| 4,251,137 A | 2/1981 | Knop et al. |
| 4,309,070 A | 1/1982 | St. Leger Searle |
| 4,322,163 A | 3/1982 | Schiller |
| 4,386,361 A | 5/1983 | Simmonds |
| 4,389,612 A | 6/1983 | Simmonds et al. |
| 4,403,189 A | 9/1983 | Simmonds |
| 4,418,993 A | 12/1983 | Lipton |
| 4,472,037 A | 9/1984 | Lipton |
| 4,523,226 A | 6/1985 | Lipton et al. |
| 4,544,267 A | 10/1985 | Schiller |
| 4,562,463 A | 12/1985 | Lipton |
| 4,566,758 A | 1/1986 | Bos et al. |
| 4,583,117 A | 4/1986 | Lipton et al. |
| 4,643,515 A | 2/1987 | Upatnieks |
| 4,647,967 A | 3/1987 | Kirschner et al. |
| 4,688,900 A | 8/1987 | Doane et al. |
| 4,711,512 A | 12/1987 | Upatnieks |
| 4,714,320 A | 12/1987 | Banbury |
| 4,728,547 A | 3/1988 | Vaz et al. |
| 4,729,640 A | 3/1988 | Sakata et al. |
| 4,743,083 A | 5/1988 | Schimpe |
| 4,749,256 A | 6/1988 | Bell et al. |
| 4,765,703 A | 8/1988 | Suzuki et al. |
| 4,775,218 A | 10/1988 | Wood et al. |
| 4,791,788 A | 12/1988 | Simmonds et al. |
| 4,792,850 A | 12/1988 | Liptoh et al. |
| 4,799,765 A | 1/1989 | Ferrer |
| 4,811,414 A | 3/1989 | Fishbine et al. |
| 4,848,093 A | 7/1989 | Simmonds et al. |
| 4,854,688 A | 8/1989 | Hayford et al. |
| 4,884,876 A | 12/1989 | Lipton et al. |
| 4,890,902 A | 1/1990 | Doane et al. |
| 4,928,301 A | 5/1990 | Smoot |
| 4,933,976 A | 6/1990 | Fishbine et al. |
| 4,938,568 A | 7/1990 | Margerum et al. |
| 4,946,245 A | 8/1990 | Chamberlin et al. |
| 4,960,311 A | 10/1990 | Moss et al. |
| 4,964,701 A | 10/1990 | Dorschner et al. |
| 4,967,268 A | 10/1990 | Lipton et al. |
| 4,970,129 A | 11/1990 | Ingwall et al. |
| 4,971,719 A | 11/1990 | Vaz et al. |
| 4,994,204 A | 2/1991 | Doane et al. |
| 5,004,323 A | 4/1991 | West |
| 5,007,711 A | 4/1991 | Wood et al. |
| 5,009,483 A | 4/1991 | Rockwell et al. |
| 5,011,624 A | 4/1991 | Yamagishi et al. |
| 5,016,953 A | 5/1991 | Moss et al. |
| 5,033,814 A | 7/1991 | Brown et al. |
| 5,035,734 A | 7/1991 | Honkanen et al. |
| 5,053,834 A | 10/1991 | Simmonds |
| 5,063,441 A | 11/1991 | Lipton et al. |
| 5,076,664 A | 12/1991 | Migozzi |
| 5,079,416 A | 1/1992 | Filipovich |
| 5,096,282 A | 3/1992 | Margerum et al. |
| 5,099,343 A | 3/1992 | Margerum et al. |
| 5,109,465 A | 4/1992 | Klopotek |
| 5,110,034 A | 5/1992 | Simmonds et al. |
| 5,117,285 A | 5/1992 | Nelson et al. |
| 5,117,302 A | 5/1992 | Lipton |
| 5,119,454 A | 6/1992 | McMahon et al. |
| 5,124,821 A | 6/1992 | Antier et al. |
| 5,139,192 A | 8/1992 | Simmonds et al. |
| 5,142,357 A | 8/1992 | Lipton et al. |
| 5,142,644 A | 8/1992 | Vansteenkiste et al. |
| 5,148,302 A | 9/1992 | Nagano et al. |
| 5,150,234 A | 9/1992 | Takahashi et al. |
| 5,151,958 A | 9/1992 | Honkanen |
| 5,153,751 A | 10/1992 | Ishikawa et al. |
| 5,159,445 A | 10/1992 | Gitlin et al. |
| 5,160,523 A | 11/1992 | Honkanen et al. |
| 5,181,133 A | 1/1993 | Lipton |
| 5,183,545 A | 2/1993 | Branca et al. |
| 5,187,597 A | 2/1993 | Kato et al. |
| 5,193,000 A | 3/1993 | Lipton et al. |
| 5,198,912 A | 3/1993 | Ingwall et al. |
| 5,198,914 A | 3/1993 | Arns |
| 5,200,861 A | 4/1993 | Moskovich et al. |
| 5,210,624 A | 5/1993 | Matsumoto et al. |
| 5,218,360 A | 6/1993 | Goetz et al. |
| 5,218,480 A | 6/1993 | Moskovich et al. |
| 5,224,198 A | 6/1993 | Jachimowicz et al. |
| 5,225,918 A | 7/1993 | Taniguchi et al. |
| 5,239,372 A | 8/1993 | Lipton |
| 5,240,636 A | 8/1993 | Doane et al. |
| 5,241,337 A | 8/1993 | Betensky et al. |
| 5,242,476 A | 9/1993 | Bartel et al. |
| 5,243,413 A | 9/1993 | Gitlin et al. |
| 5,251,048 A | 10/1993 | Doane et al. |
| 5,264,950 A | 11/1993 | West et al. |
| 5,268,792 A | 12/1993 | Kreitzer et al. |
| 5,284,499 A | 2/1994 | Harvey et al. |
| 5,289,315 A | 2/1994 | Makita et al. |
| 5,295,208 A | 3/1994 | Caulfield et al. |
| 5,296,967 A | 3/1994 | Moskovich et al. |
| 5,299,289 A | 3/1994 | Omae et al. |
| 5,303,085 A | 4/1994 | Rallison |
| 5,309,283 A | 5/1994 | Kreitzer et al. |
| 5,313,330 A | 5/1994 | Betensky |
| 5,315,324 A | 5/1994 | Kubelik et al. |
| 5,315,419 A | 5/1994 | Saupe et al. |
| 5,315,440 A | 5/1994 | Betensky et al. |
| 5,317,405 A | 5/1994 | Kuriki et al. |
| 5,327,269 A | 7/1994 | Tilton et al. |
| 5,329,363 A | 7/1994 | Moskovich et al. |
| 5,341,230 A | 8/1994 | Smith |
| 5,343,147 A | 8/1994 | Sager et al. |
| 5,351,151 A | 9/1994 | Levy |
| 5,359,362 A | 10/1994 | Lewis et al. |
| 5,363,220 A | 11/1994 | Kuwayama et al. |
| 5,368,770 A | 11/1994 | Saupe et al. |
| 5,369,511 A | 11/1994 | Amos |
| 5,371,626 A | 12/1994 | Betensky |
| 5,400,069 A | 3/1995 | Braun et al. |
| 5,408,346 A | 4/1995 | Trissel et al. |
| 5,410,370 A | 4/1995 | Janssen |
| 5,416,510 A | 5/1995 | Lipton et al. |
| 5,416,514 A | 5/1995 | Janssen et al. |
| 5,418,584 A | 5/1995 | Larson |
| 5,418,871 A | 5/1995 | Revelli et al. |
| 5,428,480 A | 6/1995 | Betensky et al. |
| 5,437,811 A | 8/1995 | Doane et al. |
| 5,438,357 A | 8/1995 | McNelley |
| 5,452,385 A | 9/1995 | Izumi et al. |

(56) References Cited

U.S. PATENT DOCUMENTS

| | | |
|---|---|---|
| 5,453,863 A | 9/1995 | West et al. |
| 5,455,693 A | 10/1995 | Wreede et al. |
| 5,455,713 A | 10/1995 | Kreitzer et al. |
| 5,463,428 A | 10/1995 | Lipton et al. |
| 5,465,311 A | 11/1995 | Caulfield et al. |
| 5,471,326 A | 11/1995 | Hall et al. |
| 5,473,222 A | 12/1995 | Thoeny et al. |
| 5,476,611 A | 12/1995 | Nolan et al. |
| 5,481,321 A | 1/1996 | Lipton |
| 5,485,313 A | 1/1996 | Betensky |
| 5,493,430 A | 2/1996 | Lu et al. |
| 5,493,448 A | 2/1996 | Betensky et al. |
| 5,496,621 A | 3/1996 | Makita et al. |
| 5,499,140 A | 3/1996 | Betensky |
| 5,500,671 A | 3/1996 | Andersson et al. |
| 5,500,769 A | 3/1996 | Betensky |
| 5,510,913 A | 4/1996 | Hashimoto et al. |
| 5,515,184 A | 5/1996 | Caulfield et al. |
| 5,516,455 A | 5/1996 | Jacobine et al. |
| 5,524,272 A | 6/1996 | Podowski et al. |
| 5,530,566 A | 6/1996 | Kumar |
| 5,532,736 A | 7/1996 | Kuriki et al. |
| 5,532,875 A | 7/1996 | Betemsky |
| 5,537,232 A | 7/1996 | Biles |
| RE35,310 E | 8/1996 | Moskovich |
| 5,543,950 A | 8/1996 | Lavrentovich et al. |
| 5,559,637 A | 9/1996 | Moskovich et al. |
| 5,572,248 A | 11/1996 | Allen et al. |
| 5,572,250 A | 11/1996 | Lipton et al. |
| 5,576,888 A | 11/1996 | Betensky |
| 5,579,026 A | 11/1996 | Tabata |
| 5,583,795 A | 12/1996 | Smyth |
| 5,585,035 A | 12/1996 | Nerad et al. |
| 5,593,615 A | 1/1997 | Nerad et al. |
| 5,604,611 A | 2/1997 | Saburi et al. |
| 5,606,433 A | 2/1997 | Yin et al. |
| 5,612,733 A | 3/1997 | Flohr |
| 5,612,734 A | 3/1997 | Nelson et al. |
| 5,619,254 A | 4/1997 | McNelley |
| 5,619,586 A | 4/1997 | Sibbald et al. |
| 5,621,529 A | 4/1997 | Gordon et al. |
| 5,621,552 A | 4/1997 | Coates et al. |
| 5,625,495 A | 4/1997 | Moskovich et al. |
| 5,629,259 A | 5/1997 | Akada et al. |
| 5,631,107 A | 5/1997 | Tarumi et al. |
| 5,633,100 A | 5/1997 | Mickish et al. |
| 5,646,785 A | 7/1997 | Gilboa et al. |
| 5,648,857 A | 7/1997 | Ando et al. |
| 5,661,577 A | 8/1997 | Jenkins et al. |
| 5,661,603 A | 8/1997 | Hanano et al. |
| 5,665,494 A | 9/1997 | Kawabata et al. |
| 5,668,614 A | 9/1997 | Chien et al. |
| 5,668,907 A | 9/1997 | Veligdan |
| 5,677,797 A | 10/1997 | Betensky et al. |
| 5,680,231 A | 10/1997 | Grinberg et al. |
| 5,682,255 A | 10/1997 | Friesem et al. |
| 5,686,931 A | 11/1997 | Fuenfschilling et al. |
| 5,686,975 A | 11/1997 | Lipton |
| 5,691,795 A | 11/1997 | Doane et al. |
| 5,694,230 A | 12/1997 | Welch |
| 5,695,682 A | 12/1997 | Doane et al. |
| 5,701,132 A | 12/1997 | Kollin et al. |
| 5,706,108 A | 1/1998 | Ando et al. |
| 5,706,136 A | 1/1998 | Okuyama et al. |
| 5,707,925 A | 1/1998 | Akada et al. |
| 5,710,645 A | 1/1998 | Phillips et al. |
| 5,724,189 A | 3/1998 | Ferrante |
| 5,724,463 A | 3/1998 | Deacon et al. |
| 5,726,782 A | 3/1998 | Kato et al. |
| 5,727,098 A | 3/1998 | Jacobson |
| 5,729,242 A | 3/1998 | Margerum et al. |
| 5,731,060 A | 3/1998 | Hirukawa et al. |
| 5,731,853 A | 3/1998 | Taketomi et al. |
| 5,742,262 A | 4/1998 | Tabata et al. |
| 5,745,266 A | 4/1998 | Smith et al. |
| 5,745,301 A | 4/1998 | Betensky et al. |
| 5,748,272 A | 5/1998 | Tanaka et al. |
| 5,748,277 A | 5/1998 | Huang et al. |
| 5,751,452 A | 5/1998 | Tanaka et al. |
| 5,757,546 A | 5/1998 | Lipton et al. |
| 5,760,931 A | 6/1998 | Saburi et al. |
| 5,764,414 A | 6/1998 | King et al. |
| 5,790,288 A | 8/1998 | Jager et al. |
| 5,790,314 A | 8/1998 | Duck et al. |
| 5,798,641 A | 8/1998 | Spagna et al. |
| 5,804,609 A | 9/1998 | Ohnishi et al. |
| 5,808,804 A | 9/1998 | Moskovich |
| 5,812,608 A | 9/1998 | Valimaki et al. |
| 5,822,089 A | 10/1998 | Phillips et al. |
| 5,822,127 A | 10/1998 | Chen et al. |
| 5,825,448 A | 10/1998 | Bos et al. |
| 5,831,700 A | 11/1998 | Li et al. |
| 5,835,661 A | 11/1998 | Tai et al. |
| 5,841,507 A | 11/1998 | Barnes |
| 5,841,587 A | 11/1998 | Moskovich et al. |
| 5,847,787 A | 12/1998 | Fredley et al. |
| 5,856,842 A | 1/1999 | Tedesco |
| 5,857,043 A | 1/1999 | Cook et al. |
| 5,867,238 A | 2/1999 | Miller et al. |
| 5,868,951 A | 2/1999 | Schuck, III et al. |
| 5,870,228 A | 2/1999 | Kreitzer et al. |
| 5,875,012 A | 2/1999 | Crawford et al. |
| 5,877,826 A | 3/1999 | Yang et al. |
| 5,886,822 A | 3/1999 | Spitzer |
| 5,892,598 A | 4/1999 | Asakawa et al. |
| 5,892,599 A | 4/1999 | Bahuguna |
| 5,898,511 A | 4/1999 | Mizutani et al. |
| 5,900,987 A | 5/1999 | Kreitzer et al. |
| 5,900,989 A | 5/1999 | Kreitzer |
| 5,903,395 A | 5/1999 | Rallison et al. |
| 5,903,396 A | 5/1999 | Rallison |
| 5,907,416 A | 5/1999 | Hegg et al. |
| 5,907,436 A | 5/1999 | Perry et al. |
| 5,917,459 A | 6/1999 | Son et al. |
| 5,926,147 A | 7/1999 | Sehm et al. |
| 5,929,946 A | 7/1999 | Sharp et al. |
| 5,929,960 A | 7/1999 | West et al. |
| 5,930,433 A | 7/1999 | Williamson et al. |
| 5,936,776 A | 8/1999 | Kreitzer |
| 5,937,115 A | 8/1999 | Domash |
| 5,942,157 A | 8/1999 | Sutherland et al. |
| 5,945,893 A | 8/1999 | Plessky et al. |
| 5,949,302 A | 9/1999 | Sarkka |
| 5,949,508 A | 9/1999 | Kumar et al. |
| 5,956,113 A | 9/1999 | Crawford |
| 5,962,147 A | 10/1999 | Shalhub et al. |
| 5,963,375 A | 10/1999 | Kreitzer |
| 5,966,223 A | 10/1999 | Friesem et al. |
| 5,969,874 A | 10/1999 | Moskovich |
| 5,969,876 A | 10/1999 | Kreitzer et al. |
| 5,973,727 A | 10/1999 | McGrew et al. |
| 5,974,162 A | 10/1999 | Metz et al. |
| 5,985,422 A | 11/1999 | Krauter |
| 5,986,746 A | 11/1999 | Metz et al. |
| 5,991,087 A | 11/1999 | Rallison |
| 5,999,089 A | 12/1999 | Carlson et al. |
| 5,999,282 A | 12/1999 | Suzuki et al. |
| 5,999,314 A | 12/1999 | Asakura et al. |
| 6,014,187 A | 1/2000 | Taketomi et al. |
| 6,023,375 A | 2/2000 | Kreitzer |
| 6,042,947 A | 3/2000 | Asakura et al. |
| 6,043,585 A | 3/2000 | Plessky et al. |
| 6,046,585 A | 4/2000 | Simmonds |
| 6,052,540 A | 4/2000 | Koyama |
| 6,061,107 A | 5/2000 | Yang |
| 6,061,463 A | 5/2000 | Metz et al. |
| 6,069,728 A | 5/2000 | Huignard et al. |
| 6,075,626 A | 6/2000 | Mizutani et al. |
| 6,078,427 A | 6/2000 | Fontaine et al. |
| 6,094,311 A | 7/2000 | Moskovich |
| 6,097,551 A | 8/2000 | Kreitzer |
| 6,104,448 A | 8/2000 | Doane et al. |
| 6,107,943 A | 8/2000 | Schroeder |
| 6,115,152 A | 9/2000 | Popovich et al. |

(56) References Cited

U.S. PATENT DOCUMENTS

| | | |
|---|---|---|
| 6,118,908 A | 9/2000 | Bischel et al. |
| 6,121,899 A | 9/2000 | Theriault |
| 6,127,066 A | 10/2000 | Ueda et al. |
| 6,128,058 A | 10/2000 | Walton et al. |
| 6,133,971 A | 10/2000 | Silverstein et al. |
| 6,133,975 A | 10/2000 | Li et al. |
| 6,137,630 A | 10/2000 | Tsou et al. |
| 6,141,074 A | 10/2000 | Bos et al. |
| 6,141,154 A | 10/2000 | Kreitzer et al. |
| 6,151,142 A | 11/2000 | Phillips et al. |
| 6,154,190 A | 11/2000 | Yang et al. |
| 6,167,169 A | 12/2000 | Brinkman et al. |
| 6,169,594 B1 | 1/2001 | Aye et al. |
| 6,169,613 B1 | 1/2001 | Amitai et al. |
| 6,169,636 B1 | 1/2001 | Kreitzer et al. |
| 6,176,837 B1 | 1/2001 | Foxlin |
| 6,185,016 B1 | 2/2001 | Popovich |
| 6,188,462 B1 | 2/2001 | Lavrentovich et al. |
| 6,191,887 B1 | 2/2001 | Michaloski et al. |
| 6,195,206 B1 | 2/2001 | Yona et al. |
| 6,195,209 B1 | 2/2001 | Kreitzer et al. |
| 6,204,835 B1 | 3/2001 | Yang et al. |
| 6,211,976 B1 | 4/2001 | Popovich et al. |
| 6,222,297 B1 | 4/2001 | Perdue |
| 6,222,675 B1 | 4/2001 | Mall et al. |
| 6,222,971 B1 | 4/2001 | Veligdan et al. |
| 6,249,386 B1 | 6/2001 | Yona et al. |
| 6,259,423 B1 | 7/2001 | Tokito et al. |
| 6,259,559 B1 | 7/2001 | Kobayashi et al. |
| 6,266,166 B1 | 7/2001 | Katsumata et al. |
| 6,268,839 B1 | 7/2001 | Yang et al. |
| 6,269,203 B1 | 7/2001 | Davies et al. |
| 6,275,031 B1 | 8/2001 | Simmonds et al. |
| 6,278,429 B1 | 8/2001 | Ruth et al. |
| 6,285,813 B1 | 9/2001 | Schultz et al. |
| 6,297,860 B1 | 10/2001 | Moskovich et al. |
| 6,301,056 B1 | 10/2001 | Kreitzer et al. |
| 6,301,057 B1 | 10/2001 | Kreitzer et al. |
| 6,317,083 B1 | 11/2001 | Johnson et al. |
| 6,317,227 B1 | 11/2001 | Mizutani et al. |
| 6,317,228 B2 | 11/2001 | Popovich et al. |
| 6,320,563 B1 | 11/2001 | Yang et al. |
| 6,321,069 B1 | 11/2001 | Piirainen |
| 6,323,970 B1 | 11/2001 | Popovich |
| 6,323,989 B1 | 11/2001 | Jacobson et al. |
| 6,324,014 B1 | 11/2001 | Moskovich et al. |
| 6,327,089 B1 | 12/2001 | Hosaki et al. |
| 6,330,109 B1 | 12/2001 | Ishii et al. |
| 6,333,819 B1 | 12/2001 | Svedenkrans |
| 6,340,540 B1 | 1/2002 | Ueda et al. |
| 6,351,333 B2 | 2/2002 | Araki et al. |
| 6,356,172 B1 | 3/2002 | Koivisto et al. |
| 6,356,674 B1 | 3/2002 | Davis et al. |
| 6,359,730 B2 | 3/2002 | Tervonen |
| 6,359,737 B1 | 3/2002 | Stringfellow |
| 6,366,281 B1 | 4/2002 | Lipton et al. |
| 6,366,369 B2 | 4/2002 | Ichikawa et al. |
| 6,366,378 B1 | 4/2002 | Tervonen et al. |
| 6,377,238 B1 | 4/2002 | McPheters |
| 6,377,321 B1 | 4/2002 | Khan et al. |
| 6,388,797 B1 | 5/2002 | Lipton et al. |
| 6,392,812 B1 | 5/2002 | Howard |
| 6,409,687 B1 | 6/2002 | Foxlin |
| 6,411,444 B1 | 6/2002 | Moskovich et al. |
| 6,414,760 B1 | 7/2002 | Lopez et al. |
| 6,417,971 B1 | 7/2002 | Moskovich et al. |
| 6,437,563 B1 | 8/2002 | Simmonds et al. |
| 6,445,512 B1 | 9/2002 | Moskovich et al. |
| 6,456,584 B1 | 9/2002 | Nagata et al. |
| 6,470,132 B1 | 10/2002 | Nousiainen et al. |
| 6,473,209 B1 | 10/2002 | Popovich |
| 6,476,974 B1 | 11/2002 | Kreitzer et al. |
| 6,483,303 B2 | 11/2002 | Simmonds et al. |
| 6,486,997 B1 | 11/2002 | Bruzzone et al. |
| 6,504,518 B1 | 1/2003 | Kuwayama et al. |
| 6,504,629 B1 | 1/2003 | Popovich et al. |
| 6,509,937 B1 | 1/2003 | Moskovich et al. |
| 6,518,747 B2 | 2/2003 | Sager et al. |
| 6,519,088 B1 | 2/2003 | Lipton |
| 6,522,794 B1 | 2/2003 | Bischel et al. |
| 6,524,771 B2 | 2/2003 | Maeda et al. |
| 6,529,336 B1 | 3/2003 | Kreitzer et al. |
| 6,534,977 B1 | 3/2003 | Duncan et al. |
| 6,545,778 B2 | 4/2003 | Ono et al. |
| 6,550,949 B1 | 4/2003 | Bauer et al. |
| 6,552,789 B1 | 4/2003 | Modro |
| 6,557,413 B2 | 5/2003 | Nieminen et al. |
| 6,559,813 B1 | 5/2003 | DeLuca et al. |
| 6,563,648 B2 | 5/2003 | Gleckman et al. |
| 6,563,650 B2 | 5/2003 | Moskovich et al. |
| 6,567,014 B1 | 5/2003 | Hansen et al. |
| 6,567,573 B1 | 5/2003 | Domash et al. |
| 6,577,411 B1 | 6/2003 | David et al. |
| 6,577,429 B1 | 6/2003 | Kurtz et al. |
| 6,580,529 B1 | 6/2003 | Amitai et al. |
| 6,583,838 B1 | 6/2003 | Hoke et al. |
| 6,583,873 B1 | 6/2003 | Goncharov et al. |
| 6,587,619 B1 | 7/2003 | Kinoshita |
| 6,594,090 B2 | 7/2003 | Kruschwitz et al. |
| 6,596,193 B2 | 7/2003 | Coates et al. |
| 6,597,176 B2 | 7/2003 | Simmonds et al. |
| 6,597,475 B1 | 7/2003 | Shirakura et al. |
| 6,598,987 B1 | 7/2003 | Parikka |
| 6,600,590 B2 | 7/2003 | Roddy et al. |
| 6,608,720 B1 | 8/2003 | Freeman |
| 6,611,253 B1 | 8/2003 | Cohen |
| 6,618,104 B1 | 9/2003 | Date et al. |
| 6,625,381 B2 | 9/2003 | Roddy et al. |
| 6,646,772 B1 | 11/2003 | Popovich et al. |
| 6,646,810 B2 | 11/2003 | Harter et al. |
| 6,661,578 B2 | 12/2003 | Hedrick |
| 6,667,134 B1 | 12/2003 | Sutherland et al. |
| 6,674,578 B2 | 1/2004 | Sugiyama et al. |
| 6,677,086 B1 | 1/2004 | Sutehrland et al. |
| 6,686,815 B1 | 2/2004 | Mirshekarl-Syahkal et al. |
| 6,690,516 B2 | 2/2004 | Aritake et al. |
| 6,692,666 B2 | 2/2004 | Sutherland et al. |
| 6,699,407 B1 | 3/2004 | Sutehrland et al. |
| 6,706,086 B2 | 3/2004 | Emig et al. |
| 6,706,451 B1 | 3/2004 | Sutherland et al. |
| 6,721,096 B2 | 4/2004 | Bruzzone et al. |
| 6,730,442 B1 | 5/2004 | Sutherland et al. |
| 6,731,434 B1 | 5/2004 | Hua et al. |
| 6,738,105 B1 | 5/2004 | Hannah et al. |
| 6,741,189 B1 | 5/2004 | Gibbons, II et al. |
| 6,744,478 B1 | 6/2004 | Asakura et al. |
| 6,747,781 B2 | 6/2004 | Trisnadi et al. |
| 6,748,342 B1 | 6/2004 | Dickhaus |
| 6,750,941 B2 | 6/2004 | Satoh et al. |
| 6,750,995 B2 | 6/2004 | Dickson |
| 6,757,105 B2 | 6/2004 | Niv et al. |
| 6,771,403 B1 | 8/2004 | Endo et al. |
| 6,776,339 B2 | 8/2004 | Piikivi |
| 6,781,701 B1 | 8/2004 | Sweetser et al. |
| 6,791,629 B2 | 9/2004 | Moskovich et al. |
| 6,791,739 B2 | 9/2004 | Ramanujan et al. |
| 6,804,066 B1 | 10/2004 | Ha et al. |
| 6,805,490 B2 | 10/2004 | Levola |
| 6,821,457 B1 | 11/2004 | Natarajan et al. |
| 6,822,713 B1 | 11/2004 | Yaroshchuk et al. |
| 6,825,987 B2 | 11/2004 | Repetto et al. |
| 6,829,095 B2 | 12/2004 | Amitai |
| 6,830,789 B2 | 12/2004 | Doane et al. |
| 6,833,955 B2 | 12/2004 | Niv |
| 6,836,369 B2 | 12/2004 | Fujikawa et al. |
| 6,844,212 B2 | 1/2005 | Bond et al. |
| 6,844,980 B2 | 1/2005 | He et al. |
| 6,847,274 B2 | 1/2005 | Salmela et al. |
| 6,847,488 B2 | 1/2005 | Travis |
| 6,850,210 B1 | 2/2005 | Lipton et al. |
| 6,853,491 B1 | 2/2005 | Ruhle et al. |
| 6,853,493 B2 | 2/2005 | Kreitzer et al. |
| 6,861,107 B2 | 3/2005 | Klasen-memmer et al. |
| 6,864,861 B2 | 3/2005 | Schehrer et al. |

(56) References Cited

U.S. PATENT DOCUMENTS

| | | |
|---|---|---|
| 6,864,927 B1 | 3/2005 | Cathey |
| 6,867,888 B2 | 3/2005 | Sutherland et al. |
| 6,873,443 B1 | 3/2005 | Joubert et al. |
| 6,878,494 B2 | 4/2005 | Sutehrland et al. |
| 6,885,483 B2 | 4/2005 | Takada |
| 6,903,872 B2 | 6/2005 | Schrader |
| 6,909,345 B1 | 6/2005 | Salmela et al. |
| 6,917,375 B2 | 7/2005 | Akada et al. |
| 6,922,267 B2 | 7/2005 | Endo et al. |
| 6,926,429 B2 | 8/2005 | Barlow et al. |
| 6,927,570 B2 | 8/2005 | Simmonds et al. |
| 6,927,694 B1 | 8/2005 | Smith et al. |
| 6,940,361 B1 | 9/2005 | Jokio et al. |
| 6,950,173 B1 | 9/2005 | Sutherland et al. |
| 6,950,227 B2 | 9/2005 | Schrader |
| 6,951,393 B2 | 10/2005 | Koide |
| 6,952,312 B2 | 10/2005 | Weber et al. |
| 6,952,435 B2 | 10/2005 | Lai et al. |
| 6,958,662 B1 | 10/2005 | Salmela et al. |
| 6,958,868 B1 | 10/2005 | Pender |
| 6,963,454 B1 | 11/2005 | Martins et al. |
| 6,972,788 B1 | 12/2005 | Robertson et al. |
| 6,975,345 B1 | 12/2005 | Lipton et al. |
| 6,980,365 B2 | 12/2005 | Moskovich |
| 6,985,296 B2 | 1/2006 | Lipton et al. |
| 6,987,908 B2 | 1/2006 | Bond et al. |
| 6,999,239 B1 | 2/2006 | Martins et al. |
| 7,002,618 B2 | 2/2006 | Lipton et al. |
| 7,002,753 B2 | 2/2006 | Moskovich et al. |
| 7,003,187 B2 | 2/2006 | Frick et al. |
| 7,006,732 B2 | 2/2006 | Gunn, III et al. |
| 7,009,773 B2 | 3/2006 | Chaoulov et al. |
| 7,018,563 B1 | 3/2006 | Sutherland et al. |
| 7,018,686 B2 | 3/2006 | Sutehrland et al. |
| 7,018,744 B2 | 3/2006 | Otaki et al. |
| 7,019,793 B2 | 3/2006 | Moskovich et al. |
| 7,021,777 B2 | 4/2006 | Amitai |
| 7,026,892 B2 | 4/2006 | Kajiya |
| 7,027,671 B2 | 4/2006 | Huck et al. |
| 7,034,748 B2 | 4/2006 | Kajiya |
| 7,046,439 B2 | 5/2006 | Kaminsky et al. |
| 7,053,735 B2 | 5/2006 | Salmela et al. |
| 7,053,991 B2 | 5/2006 | Sandusky |
| 7,054,045 B2 | 5/2006 | McPheters et al. |
| 7,058,434 B2 | 6/2006 | Wang et al. |
| 7,068,405 B2 | 6/2006 | Sutherland et al. |
| 7,068,898 B2 | 6/2006 | Buretea et al. |
| 7,072,020 B1 | 7/2006 | Sutherland et al. |
| 7,075,273 B2 | 7/2006 | O'Gorman et al. |
| 7,077,984 B1 | 7/2006 | Natarajan et al. |
| 7,081,215 B2 | 7/2006 | Natarajan et al. |
| 7,088,457 B1 | 8/2006 | Zou et al. |
| 7,088,515 B2 | 8/2006 | Lipton |
| 7,095,562 B1 | 8/2006 | Peng et al. |
| 7,099,080 B2 | 8/2006 | Lipton et al. |
| 7,101,048 B2 | 9/2006 | Travis |
| 7,108,383 B1 | 9/2006 | Mitchell et al. |
| 7,110,184 B1 | 9/2006 | Yona et al. |
| 7,119,965 B1 | 10/2006 | Rolland et al. |
| 7,123,418 B2 | 10/2006 | Weber et al. |
| 7,123,421 B1 | 10/2006 | Moskovich et al. |
| 7,126,418 B2 | 10/2006 | Hunton et al. |
| 7,126,583 B1 | 10/2006 | Breed |
| 7,132,200 B1 | 11/2006 | Ueda et al. |
| 7,133,084 B2 | 11/2006 | Moskovich et al. |
| 7,139,109 B2 | 11/2006 | Mukawa |
| RE39,424 E | 12/2006 | Moskovich |
| 7,145,729 B2 | 12/2006 | Kreitzer et al. |
| 7,149,385 B2 | 12/2006 | Parikka et al. |
| 7,151,246 B2 | 12/2006 | Fein et al. |
| 7,158,095 B2 | 1/2007 | Jenson et al. |
| 7,167,286 B2 | 1/2007 | Anderson et al. |
| 7,175,780 B1 | 2/2007 | Sutherland et al. |
| 7,181,105 B2 | 2/2007 | Teramura et al. |
| 7,181,108 B2 | 2/2007 | Levola |
| 7,184,002 B2 | 2/2007 | Lipton et al. |
| 7,184,615 B2 | 2/2007 | Levola |
| 7,186,567 B1 | 3/2007 | Sutherland et al. |
| 7,190,849 B2 | 3/2007 | Katase |
| 7,198,737 B2 | 4/2007 | Natarajan et al. |
| 7,199,934 B2 | 4/2007 | Yamasaki |
| 7,205,960 B2 | 4/2007 | David |
| 7,205,964 B1 | 4/2007 | Yokoyama et al. |
| 7,206,107 B2 | 4/2007 | Levola |
| 7,212,175 B1 | 5/2007 | Magee et al. |
| 7,230,767 B2 | 6/2007 | Walck et al. |
| 7,230,770 B2 | 6/2007 | Kreitzer et al. |
| 7,242,527 B2 | 7/2007 | Spitzer et al. |
| 7,248,128 B2 | 7/2007 | Mattila et al. |
| 7,256,915 B2 | 8/2007 | Sutherland et al. |
| 7,259,906 B1 | 8/2007 | Islam |
| 7,265,882 B2 | 9/2007 | Sutherland et al. |
| 7,265,903 B2 | 9/2007 | Sutherland et al. |
| 7,268,946 B2 | 9/2007 | Wang |
| 7,285,903 B2 | 10/2007 | Cull et al. |
| 7,286,272 B2 | 10/2007 | Mukawa |
| 7,289,069 B2 | 10/2007 | Ranta |
| RE39,911 E | 11/2007 | Moskovich |
| 7,299,983 B2 | 11/2007 | Piikivi |
| 7,301,601 B2 | 11/2007 | Lin et al. |
| 7,312,906 B2 | 12/2007 | Sutherland et al. |
| 7,313,291 B2 | 12/2007 | Okhotnikov et al. |
| 7,319,573 B2 | 1/2008 | Nishiyama |
| 7,320,534 B2 | 1/2008 | Sugikawa et al. |
| 7,323,275 B2 | 1/2008 | Otaki et al. |
| 7,333,685 B2 | 2/2008 | Stone et al. |
| 7,336,271 B2 | 2/2008 | Ozeki et al. |
| 7,339,737 B2 | 3/2008 | Urey et al. |
| 7,339,742 B2 | 3/2008 | Amitai et al. |
| 7,369,911 B1 | 5/2008 | Volant et al. |
| 7,375,870 B2 | 5/2008 | Schorpp |
| 7,375,886 B2 | 5/2008 | Lipton et al. |
| 7,376,068 B1 | 5/2008 | Khoury |
| 7,391,573 B2 | 6/2008 | Amitai |
| 7,394,865 B2 | 7/2008 | Borran et al. |
| 7,395,181 B2 | 7/2008 | Foxlin |
| 7,397,606 B1 | 7/2008 | Peng et al. |
| 7,401,920 B1 | 7/2008 | Kranz et al. |
| 7,404,644 B2 | 7/2008 | Evans et al. |
| 7,410,286 B2 | 8/2008 | Travis |
| 7,411,637 B2 | 8/2008 | Weiss |
| 7,413,678 B1 | 8/2008 | Natarajan et al. |
| 7,413,679 B1 | 8/2008 | Sutherland et al. |
| 7,415,173 B2 | 8/2008 | Kassamakov et al. |
| 7,416,818 B2 | 8/2008 | Sutherland et al. |
| 7,418,170 B2 | 8/2008 | Mukawa et al. |
| 7,420,733 B1 | 9/2008 | Natarajan et al. |
| 7,433,116 B1 | 10/2008 | Islam |
| 7,436,568 B1 | 10/2008 | Kuykendall |
| 7,447,967 B2 | 11/2008 | Onggosanusi et al. |
| 7,453,612 B2 | 11/2008 | Mukawa |
| 7,454,103 B2 | 11/2008 | Parriaux |
| 7,457,040 B2 | 11/2008 | Amitai |
| 7,466,994 B2 | 12/2008 | Pihlaja et al. |
| 7,477,206 B2 | 1/2009 | Cowan et al. |
| 7,479,354 B2 | 1/2009 | Ueda et al. |
| 7,480,215 B2 | 1/2009 | Makela et al. |
| 7,482,996 B2 | 1/2009 | Larson et al. |
| 7,483,604 B2 | 1/2009 | Levola |
| 7,492,512 B2 | 2/2009 | Niv et al. |
| 7,496,293 B2 | 2/2009 | Shamir et al. |
| 7,499,217 B2 | 3/2009 | Cakmakci et al. |
| 7,500,104 B2 | 3/2009 | Goland |
| 7,511,891 B2 | 3/2009 | Messerschmidt |
| 7,513,668 B1 | 4/2009 | Peng et al. |
| 7,522,344 B1 | 4/2009 | Curatu et al. |
| 7,525,448 B1 | 4/2009 | Wilson et al. |
| 7,528,385 B2 | 5/2009 | Volodin et al. |
| 7,545,429 B2 | 6/2009 | Travis |
| 7,550,234 B2 | 6/2009 | Otaki et al. |
| 7,567,372 B2 | 7/2009 | Schorpp |
| 7,570,322 B1 | 8/2009 | Sutherland et al. |
| 7,570,405 B1 | 8/2009 | Sutherland et al. |
| 7,570,429 B2 | 8/2009 | Maliah et al. |

(56) References Cited

U.S. PATENT DOCUMENTS

| | | |
|---|---|---|
| 7,572,555 B2 | 8/2009 | Takizawa et al. |
| 7,573,640 B2 | 8/2009 | Nivon et al. |
| 7,576,916 B2 | 8/2009 | Amitai |
| 7,577,326 B2 | 8/2009 | Amitai |
| 7,579,119 B2 | 8/2009 | Ueda et al. |
| 7,583,423 B2 | 9/2009 | Sutherland et al. |
| 7,588,863 B2 | 9/2009 | Takizawa et al. |
| 7,589,900 B1 | 9/2009 | Powell |
| 7,589,901 B2 | 9/2009 | DeJong et al. |
| 7,592,988 B2 | 9/2009 | Katase |
| 7,593,575 B2 | 9/2009 | Houle et al. |
| 7,597,447 B2 | 10/2009 | Larson et al. |
| 7,599,012 B2 | 10/2009 | Nakamura et al. |
| 7,600,893 B2 | 10/2009 | Laino et al. |
| 7,602,552 B1 | 10/2009 | Blumenfeld |
| 7,605,719 B1 | 10/2009 | Wenger et al. |
| 7,605,774 B1 | 10/2009 | Brandt et al. |
| 7,605,882 B1 | 10/2009 | Sutherland et al. |
| 7,616,270 B2 | 11/2009 | Hirabayashi et al. |
| 7,617,022 B1 | 11/2009 | Wood et al. |
| 7,618,750 B2 | 11/2009 | Ueda et al. |
| 7,619,739 B1 | 11/2009 | Sutherland et al. |
| 7,619,825 B1 | 11/2009 | Peng et al. |
| 7,629,086 B2 | 12/2009 | Otaki et al. |
| 7,639,208 B1 | 12/2009 | Ha et al. |
| 7,639,911 B2 | 12/2009 | Lee et al. |
| 7,643,214 B2 | 1/2010 | Amitai |
| 7,656,585 B1 | 2/2010 | Powell et al. |
| 7,660,047 B1 | 2/2010 | Travis et al. |
| 7,672,055 B2 | 3/2010 | Amitai |
| 7,672,549 B2 | 3/2010 | Ghosh et al. |
| 7,710,622 B2 | 5/2010 | Takabayashi et al. |
| 7,710,654 B2 | 5/2010 | Ashkenazi et al. |
| 7,724,441 B2 | 5/2010 | Amitai |
| 7,724,442 B2 | 5/2010 | Amitai |
| 7,724,443 B2 | 5/2010 | Amitai |
| 7,733,571 B1 | 6/2010 | Li |
| 7,733,572 B1 | 6/2010 | Brown et al. |
| 7,740,387 B2 | 6/2010 | Schultz et al. |
| 7,747,113 B2 | 6/2010 | Mukawa et al. |
| 7,751,122 B2 | 7/2010 | Amitai |
| 7,751,662 B2 | 7/2010 | Kleemann et al. |
| 7,764,413 B2 | 7/2010 | Levola |
| 7,777,819 B2 | 8/2010 | Simmonds |
| 7,778,305 B2 | 8/2010 | Parriaux et al. |
| 7,778,508 B2 | 8/2010 | Hirayama |
| 7,843,642 B2 | 11/2010 | Shaoulov et al. |
| 7,847,235 B2 | 12/2010 | Krupkin et al. |
| 7,864,427 B2 | 1/2011 | Korenaga et al. |
| 7,865,080 B2 | 1/2011 | Hecker et al. |
| 7,866,869 B2 | 1/2011 | Karakawa |
| 7,872,707 B1 | 1/2011 | Sutherland et al. |
| 7,872,804 B2 | 1/2011 | Moon et al. |
| 7,884,593 B2 | 2/2011 | Simmonds et al. |
| 7,884,985 B2 | 2/2011 | Amitai et al. |
| 7,887,186 B2 | 2/2011 | Watanabe |
| 7,903,921 B2 | 3/2011 | Ostergard |
| 7,907,342 B2 | 3/2011 | Simmonds et al. |
| 7,920,787 B2 | 4/2011 | Gentner et al. |
| 7,928,862 B1 | 4/2011 | Matthews |
| 7,936,519 B2 | 5/2011 | Mukawa et al. |
| 7,944,428 B2 | 5/2011 | Travis |
| 7,944,616 B2 | 5/2011 | Mukawa |
| 7,949,214 B2 | 5/2011 | DeJong et al. |
| 7,961,117 B1 | 6/2011 | Zimmerman et al. |
| 7,969,644 B2 | 6/2011 | Tilleman et al. |
| 7,969,657 B2 | 6/2011 | Cakmakci et al. |
| 7,970,246 B2 | 6/2011 | Travis et al. |
| 7,976,208 B2 | 7/2011 | Travis |
| 7,984,884 B1 | 7/2011 | Iliev et al. |
| 7,999,982 B2 | 8/2011 | Endo et al. |
| 8,000,020 B2 | 8/2011 | Amitai et al. |
| 8,000,491 B2 | 8/2011 | Brodkin et al. |
| 8,004,765 B2 | 8/2011 | Amitai |
| 8,014,050 B2 | 9/2011 | McGrew |
| 8,016,475 B2 | 9/2011 | Travis |
| 8,018,579 B1 | 9/2011 | Krah |
| 8,022,942 B2 | 9/2011 | Bathiche et al. |
| 8,023,783 B2 | 9/2011 | Mukawa et al. |
| RE42,992 E | 12/2011 | David |
| 8,073,296 B2 | 12/2011 | Mukawa et al. |
| 8,077,274 B2 | 12/2011 | Sutherland et al. |
| 8,079,713 B2 | 12/2011 | Ashkenazi |
| 8,082,222 B2 | 12/2011 | Rangarajan et al. |
| 8,086,030 B2 | 12/2011 | Gordon et al. |
| 8,089,568 B1 | 1/2012 | Brown et al. |
| 8,093,451 B2 | 1/2012 | Spangenberg et al. |
| 8,098,439 B2 | 1/2012 | Amitai et al. |
| 8,107,023 B2 | 1/2012 | Simmonds et al. |
| 8,107,780 B2 | 1/2012 | Simmonds |
| 8,120,548 B1 | 2/2012 | Barber |
| 8,132,948 B2 | 3/2012 | Owen et al. |
| 8,132,976 B2 | 3/2012 | Odell et al. |
| 8,134,434 B2 | 3/2012 | Diederichs et al. |
| 8,136,690 B2 | 3/2012 | Fang et al. |
| 8,137,981 B2 | 3/2012 | Andrew et al. |
| 8,142,016 B2 | 3/2012 | Legerton et al. |
| 8,149,086 B2 | 4/2012 | Klein et al. |
| 8,152,315 B2 | 4/2012 | Travis et al. |
| 8,155,489 B2 | 4/2012 | Saarikko et al. |
| 8,159,752 B2 | 4/2012 | Wertheim et al. |
| 8,160,409 B2 | 4/2012 | Large |
| 8,160,411 B2 | 4/2012 | Levola et al. |
| 8,167,173 B1 | 5/2012 | Simmonds et al. |
| 8,186,874 B2 | 5/2012 | Sinbar et al. |
| 8,188,925 B2 | 5/2012 | DeJean |
| 8,189,263 B1 | 5/2012 | Wang et al. |
| 8,189,973 B2 | 5/2012 | Travis et al. |
| 8,194,325 B2 | 6/2012 | Levola et al. |
| 8,199,803 B2 | 6/2012 | Hauske et al. |
| 8,213,065 B2 | 7/2012 | Mukawa |
| 8,213,755 B2 | 7/2012 | Mukawa et al. |
| 8,220,966 B2 | 7/2012 | Mukawa |
| 8,224,133 B2 | 7/2012 | Popovich et al. |
| 8,233,204 B1 | 7/2012 | Robbins et al. |
| 8,253,914 B2 | 8/2012 | Kajiya et al. |
| 8,254,031 B2 | 8/2012 | Levola |
| 8,264,498 B1 | 9/2012 | Vanderkamp et al. |
| 8,294,749 B2 | 10/2012 | Cable |
| 8,295,710 B2 | 10/2012 | Marcus |
| 8,301,031 B2 | 10/2012 | Gentner et al. |
| 8,305,577 B2 | 11/2012 | Kivioja et al. |
| 8,306,423 B2 | 11/2012 | Gottwald et al. |
| 8,310,327 B2 | 11/2012 | Willers et al. |
| 8,314,819 B2 | 11/2012 | Kimmel et al. |
| 8,314,993 B2 | 11/2012 | Levola et al. |
| 8,320,032 B2 | 11/2012 | Levola |
| 8,321,810 B2 | 11/2012 | Heintze |
| 8,325,166 B2 | 12/2012 | Akutsu et al. |
| 8,329,773 B2 | 12/2012 | Fäcke et al. |
| 8,335,040 B2 | 12/2012 | Mukawa et al. |
| 8,351,744 B2 | 1/2013 | Travis et al. |
| 8,354,640 B2 | 1/2013 | Hamre et al. |
| 8,354,806 B2 | 1/2013 | Travis et al. |
| 8,355,610 B2 | 1/2013 | Simmonds |
| 8,369,019 B2 | 2/2013 | Baker et al. |
| 8,376,548 B2 | 2/2013 | Schultz |
| 8,382,293 B2 | 2/2013 | Phillips, III et al. |
| 8,384,504 B2 | 2/2013 | Diederichs et al. |
| 8,384,694 B2 | 2/2013 | Powell et al. |
| 8,384,730 B1 | 2/2013 | Vanderkamp et al. |
| 8,396,339 B2 | 3/2013 | Mukawa et al. |
| 8,398,242 B2 | 3/2013 | Yamamoto et al. |
| 8,403,490 B2 | 3/2013 | Sugiyama et al. |
| 8,422,840 B2 | 4/2013 | Large |
| 8,427,439 B2 | 4/2013 | Larsen et al. |
| 8,432,363 B2 | 4/2013 | Saarikko et al. |
| 8,432,372 B2 | 4/2013 | Butler et al. |
| 8,432,614 B2 | 4/2013 | Amitai |
| 8,441,731 B2 | 5/2013 | Sprague |
| 8,447,365 B1 | 5/2013 | Imanuel |
| 8,466,953 B2 | 6/2013 | Levola |
| 8,472,119 B1 | 6/2013 | Kelly |
| 8,472,120 B2 | 6/2013 | Border et al. |

(56) References Cited

U.S. PATENT DOCUMENTS

| | | |
|---|---|---|
| 8,477,261 B2 | 7/2013 | Travis et al. |
| 8,481,130 B2 | 7/2013 | Harding et al. |
| 8,482,858 B2 | 7/2013 | Sprague |
| 8,488,246 B2 | 7/2013 | Border et al. |
| 8,491,121 B2 | 7/2013 | Tilleman et al. |
| 8,491,136 B2 | 7/2013 | Travis et al. |
| 8,493,366 B2 | 7/2013 | Bathiche et al. |
| 8,493,662 B2 | 7/2013 | Noui |
| 8,494,229 B2 | 7/2013 | Jarvenpaa et al. |
| 8,508,848 B2 | 8/2013 | Saarikko |
| 8,520,309 B2 | 8/2013 | Sprague |
| 8,547,638 B2 | 10/2013 | Levola |
| 8,548,290 B2 | 10/2013 | Travers et al. |
| 8,565,560 B2 | 10/2013 | Popovich et al. |
| 8,578,038 B2 | 11/2013 | Kaikuranta et al. |
| 8,581,831 B2 | 11/2013 | Travis |
| 8,582,206 B2 | 11/2013 | Travis |
| 8,593,734 B2 | 11/2013 | Laakkonen |
| 8,611,014 B2 | 12/2013 | Valera et al. |
| 8,619,062 B2 | 12/2013 | Powell et al. |
| 8,633,786 B2 | 1/2014 | Ermolov et al. |
| 8,634,120 B2 | 1/2014 | Popovich et al. |
| 8,634,139 B1 | 1/2014 | Brown et al. |
| 8,639,072 B2 | 1/2014 | Popovich et al. |
| 8,643,691 B2 | 2/2014 | Rosenfeld et al. |
| 8,643,948 B2 | 2/2014 | Amitai et al. |
| 8,649,099 B2 | 2/2014 | Schultz et al. |
| 8,654,420 B2 | 2/2014 | Simmonds |
| 8,659,826 B1 | 2/2014 | Brown et al. |
| D701,206 S | 3/2014 | Luckey et al. |
| 8,670,029 B2 | 3/2014 | McEldowney |
| 8,693,087 B2 | 4/2014 | Nowatzyk et al. |
| 8,698,705 B2 | 4/2014 | Burke |
| 8,731,350 B1 | 5/2014 | Lin et al. |
| 8,736,802 B2 | 5/2014 | Kajiya et al. |
| 8,736,963 B2 | 5/2014 | Robbins et al. |
| 8,742,952 B1 | 6/2014 | Bold |
| 8,746,008 B1 | 6/2014 | Mauritsen et al. |
| 8,749,886 B2 | 6/2014 | Gupta |
| 8,749,890 B1 | 6/2014 | Wood et al. |
| 8,767,294 B2 | 7/2014 | Chen et al. |
| 8,786,923 B2 | 7/2014 | Chuang et al. |
| 8,810,600 B2 | 8/2014 | Bohn et al. |
| 8,810,913 B2 | 8/2014 | Simmonds et al. |
| 8,810,914 B2 | 8/2014 | Amitai |
| 8,814,691 B2 | 8/2014 | Haddick et al. |
| 8,816,578 B1 | 8/2014 | Peng et al. |
| 8,817,350 B1 | 8/2014 | Robbins et al. |
| 8,824,836 B2 | 9/2014 | Sugiyama |
| 8,830,143 B1 | 9/2014 | Pitchford et al. |
| 8,830,584 B2 | 9/2014 | Saarikko et al. |
| 8,830,588 B1 | 9/2014 | Brown et al. |
| 8,842,368 B2 | 9/2014 | Simmonds et al. |
| 8,859,412 B2 | 10/2014 | Jain |
| 8,872,435 B2 | 10/2014 | Kreitzer et al. |
| 8,873,149 B2 | 10/2014 | Bohn et al. |
| 8,873,150 B2 | 10/2014 | Amitai |
| 8,885,112 B2 | 11/2014 | Popovich et al. |
| 8,885,997 B2 | 11/2014 | Nguyen et al. |
| 8,903,207 B1 | 12/2014 | Brown et al. |
| 8,906,088 B2 | 12/2014 | Pugh et al. |
| 8,913,324 B2 | 12/2014 | Schrader |
| 8,913,865 B1 | 12/2014 | Bennett |
| 8,917,453 B2 | 12/2014 | Bohn |
| 8,937,771 B2 | 1/2015 | Robbins et al. |
| 8,937,772 B1 | 1/2015 | Burns et al. |
| 8,938,141 B2 | 1/2015 | Magnusson |
| 8,950,867 B2 | 2/2015 | Macnamara |
| 8,964,298 B2 | 2/2015 | Haddick et al. |
| 8,965,152 B2 | 2/2015 | Simmonds |
| 8,985,803 B2 | 3/2015 | Bohn |
| 8,989,535 B2 | 3/2015 | Robbins |
| 9,019,595 B2 | 4/2015 | Jain |
| 9,025,253 B2 | 5/2015 | Hadad et al. |
| 9,035,344 B2 | 5/2015 | Jain |
| 9,075,184 B2 | 7/2015 | Popovich et al. |
| 9,081,178 B2 | 7/2015 | Simmonds et al. |
| 9,097,890 B2 | 8/2015 | Miller et al. |
| 9,128,226 B2 | 9/2015 | Fattal et al. |
| 9,129,295 B2 | 9/2015 | Border et al. |
| 9,164,290 B2 | 10/2015 | Robbins et al. |
| 9,176,324 B1 | 11/2015 | Scherer et al. |
| 9,201,270 B2 | 12/2015 | Fattal et al. |
| 9,215,293 B2 | 12/2015 | Miller |
| 9,244,275 B1 | 1/2016 | Li |
| 9,244,280 B1 | 1/2016 | Tiana et al. |
| 9,244,281 B1 | 1/2016 | Zimmerman et al. |
| 9,269,854 B2 | 2/2016 | Jain |
| 9,274,338 B2 | 3/2016 | Robbins et al. |
| 9,274,339 B1 | 3/2016 | Brown et al. |
| 9,310,566 B2 | 4/2016 | Valera et al. |
| 9,329,325 B2 | 5/2016 | Simmonds et al. |
| 9,335,604 B2 | 5/2016 | Popovich et al. |
| 9,341,846 B2 | 5/2016 | Popovich et al. |
| 9,354,366 B2 | 5/2016 | Jain |
| 9,366,862 B2 | 6/2016 | Haddick et al. |
| 9,366,864 B1 | 6/2016 | Brown et al. |
| 9,372,347 B1 | 6/2016 | Levola et al. |
| 9,377,623 B2 | 6/2016 | Robbins et al. |
| 9,377,852 B1 | 6/2016 | Shapiro et al. |
| 9,389,415 B2 | 7/2016 | Fattal et al. |
| 9,400,395 B2 | 7/2016 | Travers et al. |
| 9,423,360 B1 | 8/2016 | Kostamo et al. |
| 9,429,692 B1 | 8/2016 | Saarikko et al. |
| 9,431,794 B2 | 8/2016 | Jain |
| 9,456,744 B2 | 10/2016 | Popovich et al. |
| 9,459,451 B2 | 10/2016 | Saarikko et al. |
| 9,464,779 B2 | 10/2016 | Popovich et al. |
| 9,465,213 B2 | 10/2016 | Simmonds |
| 9,465,227 B2 | 10/2016 | Popovich et al. |
| 9,494,799 B2 | 11/2016 | Robbins et al. |
| 9,507,150 B1 | 11/2016 | Stratton et al. |
| 9,513,480 B2 | 12/2016 | Saarikko et al. |
| 9,519,089 B1 | 12/2016 | Brown et al. |
| 9,523,852 B1 | 12/2016 | Brown et al. |
| 9,535,253 B2 | 1/2017 | Levola et al. |
| 9,541,383 B2 | 1/2017 | Abovitz et al. |
| 9,541,763 B1 | 1/2017 | Heberlein et al. |
| 9,547,174 B2 | 1/2017 | Gao et al. |
| 9,551,874 B2 | 1/2017 | Amitai |
| 9,551,880 B2 | 1/2017 | Amitai |
| 9,599,813 B1 | 3/2017 | Stratton et al. |
| 9,612,403 B2 | 4/2017 | Abovitz et al. |
| 9,632,226 B2 | 4/2017 | Waldern et al. |
| 9,635,352 B1 | 4/2017 | Henry et al. |
| 9,648,313 B1 | 5/2017 | Henry et al. |
| 9,651,368 B2 | 5/2017 | Abovitz et al. |
| 9,664,824 B2 | 5/2017 | Simmonds et al. |
| 9,664,910 B2 | 5/2017 | Mansharof et al. |
| 9,674,413 B1 | 6/2017 | Tiana et al. |
| 9,678,345 B1 | 6/2017 | Melzer et al. |
| 9,679,367 B1 | 6/2017 | Wald |
| 9,715,067 B1 | 7/2017 | Brown et al. |
| 9,715,110 B1 | 7/2017 | Brown et al. |
| 9,726,540 B2 | 8/2017 | Popovich et al. |
| 9,727,772 B2 | 8/2017 | Popovich et al. |
| 9,733,475 B1 | 8/2017 | Brown et al. |
| 9,746,688 B2 | 8/2017 | Popovich et al. |
| 9,754,507 B1 | 9/2017 | Wenger et al. |
| 9,762,895 B1 | 9/2017 | Henry et al. |
| 9,766,465 B1 | 9/2017 | Tiana et al. |
| 9,785,231 B1 | 10/2017 | Zimmerman |
| 9,791,694 B1 | 10/2017 | Haverkamp et al. |
| 9,804,389 B2 | 10/2017 | Popovich et al. |
| 9,823,423 B2 | 11/2017 | Waldern et al. |
| 9,874,931 B1 | 1/2018 | Koenck et al. |
| 9,933,684 B2 | 4/2018 | Brown et al. |
| 9,977,247 B1 | 5/2018 | Brown et al. |
| 10,089,516 B2 | 10/2018 | Popovich et al. |
| 10,156,681 B2 | 12/2018 | Waldern et al. |
| 10,185,154 B2 | 1/2019 | Popovich et al. |
| 10,209,517 B2 | 2/2019 | Popovich et al. |
| 10,216,061 B2 | 2/2019 | Popovich et al. |
| 10,241,330 B2 | 3/2019 | Popovich et al. |

(56) References Cited

U.S. PATENT DOCUMENTS

| | | |
|---|---|---|
| 10,330,777 B2 | 6/2019 | Popovich et al. |
| 10,359,736 B2 | 7/2019 | Popovich et al. |
| 10,732,569 B2 | 8/2020 | Waldern et al. |
| 2001/0024177 A1 | 9/2001 | Popovich |
| 2001/0033400 A1 | 10/2001 | Sutherland et al. |
| 2001/0043163 A1 | 11/2001 | Waldern et al. |
| 2001/0050756 A1 | 12/2001 | Lipton et al. |
| 2002/0003509 A1 | 1/2002 | Lipton et al. |
| 2002/0009299 A1 | 1/2002 | Lipton |
| 2002/0011969 A1 | 1/2002 | Lipton et al. |
| 2002/0012064 A1 | 1/2002 | Yamaguchi |
| 2002/0018040 A1 | 2/2002 | Aye et al. |
| 2002/0021461 A1 | 2/2002 | Ono et al. |
| 2002/0036825 A1 | 3/2002 | Lipton et al. |
| 2002/0047837 A1 | 4/2002 | Suyama et al. |
| 2002/0075240 A1 | 6/2002 | Lieberman et al. |
| 2002/0093701 A1 | 7/2002 | Zhang et al. |
| 2002/0110077 A1 | 8/2002 | Drobot et al. |
| 2002/0126332 A1 | 9/2002 | Popovich |
| 2002/0127497 A1 | 9/2002 | Brown et al. |
| 2002/0131175 A1 | 9/2002 | Yagi et al. |
| 2002/0150032 A1 | 10/2002 | Nishiuchi et al. |
| 2002/0196332 A1 | 12/2002 | Lipton et al. |
| 2003/0007070 A1 | 1/2003 | Lipton et al. |
| 2003/0030912 A1 | 2/2003 | Gleckman et al. |
| 2003/0038912 A1 | 2/2003 | Broer et al. |
| 2003/0039442 A1 | 2/2003 | Bond et al. |
| 2003/0063042 A1 | 4/2003 | Friesem et al. |
| 2003/0063884 A1 | 4/2003 | Smith et al. |
| 2003/0067685 A1 | 4/2003 | Niv |
| 2003/0086670 A1 | 5/2003 | Moridaira et al. |
| 2003/0107809 A1 | 6/2003 | Chen et al. |
| 2003/0149346 A1 | 8/2003 | Arnone et al. |
| 2003/0175004 A1 | 9/2003 | Garito et al. |
| 2003/0193709 A1 | 10/2003 | Mallya et al. |
| 2003/0197154 A1 | 10/2003 | Manabe et al. |
| 2003/0197157 A1 | 10/2003 | Sutherland et al. |
| 2003/0202247 A1 | 10/2003 | Niv et al. |
| 2003/0206329 A1 | 11/2003 | Ikeda et al. |
| 2003/0228019 A1 | 12/2003 | Eichler et al. |
| 2004/0004767 A1 | 1/2004 | Song |
| 2004/0012833 A1 | 1/2004 | Newswanger et al. |
| 2004/0089842 A1 | 5/2004 | Sutehrland et al. |
| 2004/0109234 A1 | 6/2004 | Levola |
| 2004/0112862 A1 | 6/2004 | Willson et al. |
| 2004/0130797 A1 | 7/2004 | Leigh |
| 2004/0141217 A1 | 7/2004 | Endo et al. |
| 2004/0156008 A1 | 8/2004 | Reznikov et al. |
| 2004/0174348 A1 | 9/2004 | David |
| 2004/0175627 A1 | 9/2004 | Sutherland et al. |
| 2004/0179764 A1 | 9/2004 | Melikechi et al. |
| 2004/0188617 A1 | 9/2004 | Devitt et al. |
| 2004/0208446 A1 | 10/2004 | Bond et al. |
| 2004/0208466 A1 | 10/2004 | Mossberg et al. |
| 2004/0225025 A1 | 11/2004 | Sullivan et al. |
| 2004/0263969 A1 | 12/2004 | Lipton et al. |
| 2004/0263971 A1 | 12/2004 | Lipton et al. |
| 2005/0018304 A1 | 1/2005 | Lipton et al. |
| 2005/0079663 A1 | 4/2005 | Masutani et al. |
| 2005/0083564 A1 | 4/2005 | Mallya et al. |
| 2005/0105909 A1 | 5/2005 | Stone |
| 2005/0122395 A1 | 6/2005 | Lipton et al. |
| 2005/0134404 A1 | 6/2005 | Kajiya et al. |
| 2005/0135747 A1 | 6/2005 | Greiner et al. |
| 2005/0136260 A1 | 6/2005 | Garcia |
| 2005/0141066 A1 | 6/2005 | Ouchi |
| 2005/0180687 A1 | 8/2005 | Amitai |
| 2005/0195276 A1 | 9/2005 | Lipton et al. |
| 2005/0218377 A1 | 10/2005 | Lawandy |
| 2005/0231774 A1 | 10/2005 | Hayashi et al. |
| 2005/0232530 A1 | 10/2005 | Kekas |
| 2005/0259217 A1 | 11/2005 | Lin et al. |
| 2005/0259302 A9 | 11/2005 | Metz et al. |
| 2005/0259944 A1 | 11/2005 | Anderson et al. |
| 2005/0265585 A1 | 12/2005 | Rowe |
| 2005/0269481 A1 | 12/2005 | David et al. |
| 2005/0271258 A1 | 12/2005 | Rowe |
| 2005/0286133 A1 | 12/2005 | Lipton |
| 2006/0002274 A1 | 1/2006 | Kihara et al. |
| 2006/0012878 A1 | 1/2006 | Lipton et al. |
| 2006/0013977 A1 | 1/2006 | Duke et al. |
| 2006/0043938 A1 | 3/2006 | O'Gorman et al. |
| 2006/0055993 A1 | 3/2006 | Kobayashi et al. |
| 2006/0093793 A1 | 5/2006 | Miyakawa et al. |
| 2006/0114564 A1 | 6/2006 | Sutherland et al. |
| 2006/0119837 A1 | 6/2006 | Raguin et al. |
| 2006/0119916 A1 | 6/2006 | Sutherland et al. |
| 2006/0126179 A1 | 6/2006 | Levola |
| 2006/0132914 A1 | 6/2006 | Weiss et al. |
| 2006/0142455 A1 | 6/2006 | Agarwal et al. |
| 2006/0146422 A1 | 7/2006 | Koike |
| 2006/0159864 A1 | 7/2006 | Natarajan et al. |
| 2006/0164593 A1 | 7/2006 | Peyghambarian et al. |
| 2006/0171647 A1 | 8/2006 | Ye et al. |
| 2006/0177180 A1 | 8/2006 | Tazawa et al. |
| 2006/0181683 A1 | 8/2006 | Bhowmik et al. |
| 2006/0191293 A1 | 8/2006 | Kuczma |
| 2006/0215244 A1 | 9/2006 | Yosha et al. |
| 2006/0221063 A1 | 10/2006 | Ishihara |
| 2006/0221448 A1 | 10/2006 | Nivon et al. |
| 2006/0228073 A1 | 10/2006 | Mukawa et al. |
| 2006/0268104 A1 | 11/2006 | Cowan et al. |
| 2006/0268412 A1 | 11/2006 | Downing et al. |
| 2006/0279662 A1 | 12/2006 | Kapellner et al. |
| 2006/0284974 A1 | 12/2006 | Lipton et al. |
| 2006/0285205 A1 | 12/2006 | Lipton et al. |
| 2006/0291021 A1 | 12/2006 | Mukawa |
| 2006/0291052 A1 | 12/2006 | Lipton et al. |
| 2006/0292493 A1 | 12/2006 | Shinotsuka et al. |
| 2007/0012777 A1 | 1/2007 | Tsikos et al. |
| 2007/0019152 A1 | 1/2007 | Caputo et al. |
| 2007/0019297 A1 | 1/2007 | Stewart et al. |
| 2007/0041684 A1 | 2/2007 | Popovich et al. |
| 2007/0045596 A1 | 3/2007 | King et al. |
| 2007/0052929 A1 | 3/2007 | Allman et al. |
| 2007/0070476 A1 | 3/2007 | Yamada et al. |
| 2007/0070504 A1 | 3/2007 | Akutsu et al. |
| 2007/0089625 A1 | 4/2007 | Grinberg et al. |
| 2007/0097502 A1 | 5/2007 | Lipton et al. |
| 2007/0109401 A1 | 5/2007 | Lipton et al. |
| 2007/0116409 A1 | 5/2007 | Bryan et al. |
| 2007/0133089 A1 | 6/2007 | Lipton et al. |
| 2007/0133920 A1 | 6/2007 | Lee et al. |
| 2007/0133983 A1 | 6/2007 | Traff |
| 2007/0154153 A1 | 7/2007 | Fomitchov et al. |
| 2007/0160325 A1 | 7/2007 | Son et al. |
| 2007/0177007 A1 | 8/2007 | Lipton et al. |
| 2007/0182915 A1 | 8/2007 | Osawa et al. |
| 2007/0183650 A1 | 8/2007 | Lipton et al. |
| 2007/0188602 A1 | 8/2007 | Cowan et al. |
| 2007/0188837 A1 | 8/2007 | Shimizu et al. |
| 2007/0206155 A1 | 9/2007 | Lipton |
| 2007/0211164 A1 | 9/2007 | Olsen et al. |
| 2007/0236560 A1 | 10/2007 | Lipton et al. |
| 2007/0237456 A1 | 10/2007 | Blauvelt et al. |
| 2007/0247687 A1 | 10/2007 | Handschy et al. |
| 2007/0258138 A1 | 11/2007 | Cowan et al. |
| 2007/0263169 A1 | 11/2007 | Lipton |
| 2008/0001909 A1 | 1/2008 | Lim |
| 2008/0018851 A1 | 1/2008 | Lipton et al. |
| 2008/0024598 A1 | 1/2008 | Perlin et al. |
| 2008/0043334 A1 | 2/2008 | Itzkovitch et al. |
| 2008/0049100 A1 | 2/2008 | Lipton et al. |
| 2008/0062259 A1 | 3/2008 | Lipton et al. |
| 2008/0089073 A1 | 4/2008 | Hikmet |
| 2008/0106775 A1 | 5/2008 | Amitai et al. |
| 2008/0106779 A1 | 5/2008 | Peterson et al. |
| 2008/0117289 A1 | 5/2008 | Schowengerdt et al. |
| 2008/0136916 A1 | 6/2008 | Wolff |
| 2008/0136923 A1 | 6/2008 | Inbar et al. |
| 2008/0138013 A1 | 6/2008 | Parriaux |
| 2008/0143964 A1 | 6/2008 | Cowan et al. |
| 2008/0143965 A1 | 6/2008 | Cowan et al. |
| 2008/0149517 A1 | 6/2008 | Lipton et al. |

(56) References Cited

U.S. PATENT DOCUMENTS

| | | |
|---|---|---|
| 2008/0151370 A1 | 6/2008 | Cook et al. |
| 2008/0151379 A1 | 6/2008 | Amitai |
| 2008/0186573 A1 | 8/2008 | Lipton |
| 2008/0186574 A1 | 8/2008 | Robinson et al. |
| 2008/0186604 A1 | 8/2008 | Amitai |
| 2008/0198471 A1 | 8/2008 | Amitai |
| 2008/0226281 A1 | 9/2008 | Lipton |
| 2008/0239067 A1 | 10/2008 | Lipton |
| 2008/0239068 A1 | 10/2008 | Lipton |
| 2008/0273081 A1 | 11/2008 | Lipton |
| 2008/0278812 A1 | 11/2008 | Amitai |
| 2008/0285137 A1 | 11/2008 | Simmonds et al. |
| 2008/0285140 A1 | 11/2008 | Amitai |
| 2008/0297731 A1 | 12/2008 | Powell et al. |
| 2008/0297807 A1 | 12/2008 | Feldman et al. |
| 2008/0298649 A1 | 12/2008 | Ennis et al. |
| 2008/0303895 A1 | 12/2008 | Akka et al. |
| 2008/0303896 A1 | 12/2008 | Lipton et al. |
| 2008/0304111 A1 | 12/2008 | Queenan et al. |
| 2008/0309586 A1 | 12/2008 | Vitale |
| 2008/0316303 A1 | 12/2008 | Chiu et al. |
| 2008/0316375 A1 | 12/2008 | Lipton et al. |
| 2009/0017424 A1 | 1/2009 | Yoeli et al. |
| 2009/0019222 A1 | 1/2009 | Verma et al. |
| 2009/0052017 A1 | 2/2009 | Sasaki |
| 2009/0052046 A1 | 2/2009 | Amitai |
| 2009/0052047 A1 | 2/2009 | Amitai |
| 2009/0067774 A1 | 3/2009 | Magnusson |
| 2009/0074356 A1 | 3/2009 | Sanchez et al. |
| 2009/0097122 A1 | 4/2009 | Niv |
| 2009/0097127 A1 | 4/2009 | Amitai |
| 2009/0121301 A1 | 5/2009 | Chang |
| 2009/0122413 A1 | 5/2009 | Hoffman et al. |
| 2009/0122414 A1 | 5/2009 | Amitai |
| 2009/0128495 A1 | 5/2009 | Kong et al. |
| 2009/0128902 A1 | 5/2009 | Niv et al. |
| 2009/0128911 A1 | 5/2009 | Itzkovitch et al. |
| 2009/0136246 A1 | 5/2009 | Murakami |
| 2009/0141324 A1 | 6/2009 | Mukawa |
| 2009/0153437 A1 | 6/2009 | Aharoni |
| 2009/0169152 A1 | 7/2009 | Oestergard |
| 2009/0190222 A1 | 7/2009 | Simmonds et al. |
| 2009/0213208 A1 | 8/2009 | Glatt |
| 2009/0237804 A1 | 9/2009 | Amitai et al. |
| 2009/0242021 A1 | 10/2009 | Petkie et al. |
| 2009/0296218 A1 | 12/2009 | Ryytty |
| 2009/0303599 A1 | 12/2009 | Levola |
| 2009/0316246 A1 | 12/2009 | Asai et al. |
| 2010/0014312 A1 | 1/2010 | Travis et al. |
| 2010/0039796 A1 | 2/2010 | Mukawa |
| 2010/0053565 A1 | 3/2010 | Mizushima et al. |
| 2010/0060551 A1 | 3/2010 | Sugiyama et al. |
| 2010/0060990 A1 | 3/2010 | Wertheim et al. |
| 2010/0065726 A1 | 3/2010 | Zhong et al. |
| 2010/0079865 A1 | 4/2010 | Saarikko et al. |
| 2010/0086256 A1 | 4/2010 | Ben Bakir et al. |
| 2010/0092124 A1 | 4/2010 | Magnusson et al. |
| 2010/0096562 A1 | 4/2010 | Klunder et al. |
| 2010/0097674 A1 | 4/2010 | Kasazumi et al. |
| 2010/0097820 A1 | 4/2010 | Owen et al. |
| 2010/0103078 A1 | 4/2010 | Mukawa et al. |
| 2010/0134534 A1 | 6/2010 | Seesselberg et al. |
| 2010/0135615 A1 | 6/2010 | Ho et al. |
| 2010/0136319 A1 | 6/2010 | Imai et al. |
| 2010/0141555 A1 | 6/2010 | Rorberg et al. |
| 2010/0149073 A1 | 6/2010 | Chaum et al. |
| 2010/0165465 A1 | 7/2010 | Levola |
| 2010/0165660 A1 | 7/2010 | Weber et al. |
| 2010/0171680 A1 | 7/2010 | Lapidot et al. |
| 2010/0177388 A1 | 7/2010 | Cohen et al. |
| 2010/0202725 A1 | 8/2010 | Popovich et al. |
| 2010/0214659 A1 | 8/2010 | Levola |
| 2010/0220293 A1 | 9/2010 | Mizushima et al. |
| 2010/0231532 A1 | 9/2010 | Nho et al. |
| 2010/0231693 A1 | 9/2010 | Levola |
| 2010/0231705 A1 | 9/2010 | Yahav et al. |
| 2010/0232003 A1 | 9/2010 | Baldy et al. |
| 2010/0246003 A1 | 9/2010 | Simmonds et al. |
| 2010/0246004 A1 | 9/2010 | Simmonds |
| 2010/0246993 A1 | 9/2010 | Rieger et al. |
| 2010/0253987 A1 | 10/2010 | Leopold et al. |
| 2010/0265117 A1 | 10/2010 | Weiss |
| 2010/0277803 A1 | 11/2010 | Pockett et al. |
| 2010/0284085 A1 | 11/2010 | Laakkonen |
| 2010/0284090 A1 | 11/2010 | Simmonds |
| 2010/0284180 A1 | 11/2010 | Popovich et al. |
| 2010/0296163 A1 | 11/2010 | Kko |
| 2010/0299814 A1 | 12/2010 | Celona et al. |
| 2010/0315719 A1 | 12/2010 | Saarikko et al. |
| 2010/0321781 A1 | 12/2010 | Levola et al. |
| 2010/0322555 A1 | 12/2010 | Vermeulen et al. |
| 2011/0001895 A1 | 1/2011 | Dahl |
| 2011/0002143 A1 | 1/2011 | Saarikko et al. |
| 2011/0013423 A1 | 1/2011 | Selbrede et al. |
| 2011/0019250 A1 | 1/2011 | Aiki et al. |
| 2011/0019874 A1 | 1/2011 | Jarvenpaa et al. |
| 2011/0026128 A1 | 2/2011 | Baker et al. |
| 2011/0026774 A1 | 2/2011 | Flohr et al. |
| 2011/0032602 A1 | 2/2011 | Rothenberg et al. |
| 2011/0032618 A1 | 2/2011 | Handerek et al. |
| 2011/0032706 A1 | 2/2011 | Mukawa |
| 2011/0038024 A1 | 2/2011 | Wang et al. |
| 2011/0050548 A1 | 3/2011 | Blumenfeld et al. |
| 2011/0063604 A1 | 3/2011 | Hamre et al. |
| 2011/0096401 A1 | 4/2011 | Levola |
| 2011/0102711 A1 | 5/2011 | Sutherland et al. |
| 2011/0109880 A1 | 5/2011 | Nummela |
| 2011/0157707 A1 | 6/2011 | Tilleman et al. |
| 2011/0164221 A1 | 7/2011 | Tilleman et al. |
| 2011/0187293 A1 | 8/2011 | Travis et al. |
| 2011/0211239 A1 | 9/2011 | Mukawa et al. |
| 2011/0235179 A1 | 9/2011 | Simmonds |
| 2011/0235365 A1 | 9/2011 | McCollum et al. |
| 2011/0236803 A1 | 9/2011 | Weiser et al. |
| 2011/0238399 A1 | 9/2011 | Ophir et al. |
| 2011/0242349 A1 | 10/2011 | Izuha et al. |
| 2011/0242661 A1 | 10/2011 | Simmonds |
| 2011/0242670 A1 | 10/2011 | Simmonds |
| 2011/0249309 A1 | 10/2011 | McPheters et al. |
| 2011/0274435 A1 | 11/2011 | Fini et al. |
| 2011/0299075 A1 | 12/2011 | Meade et al. |
| 2011/0310356 A1 | 12/2011 | Vallius |
| 2012/0007979 A1 | 1/2012 | Schneider et al. |
| 2012/0027347 A1 | 2/2012 | Mathal et al. |
| 2012/0033306 A1 | 2/2012 | Valera et al. |
| 2012/0044572 A1 | 2/2012 | Simmonds et al. |
| 2012/0044573 A1 | 2/2012 | Simmonds et al. |
| 2012/0062850 A1 | 3/2012 | Travis |
| 2012/0062998 A1 | 3/2012 | Schultz et al. |
| 2012/0075168 A1 | 3/2012 | Osterhout et al. |
| 2012/0081789 A1 | 4/2012 | Mukawa et al. |
| 2012/0092632 A1 | 4/2012 | McLeod et al. |
| 2012/0099203 A1 | 4/2012 | Boubis et al. |
| 2012/0105634 A1 | 5/2012 | Meidan et al. |
| 2012/0120493 A1 | 5/2012 | Simmonds et al. |
| 2012/0127577 A1 | 5/2012 | Desserouer |
| 2012/0162549 A1 | 6/2012 | Gao et al. |
| 2012/0162764 A1 | 6/2012 | Shimizu |
| 2012/0176665 A1 | 7/2012 | Song et al. |
| 2012/0183888 A1 | 7/2012 | Oliveira et al. |
| 2012/0194420 A1 | 8/2012 | Osterhout et al. |
| 2012/0200532 A1 | 8/2012 | Powell et al. |
| 2012/0206811 A1 | 8/2012 | Mukawa et al. |
| 2012/0206937 A1 | 8/2012 | Travis et al. |
| 2012/0207432 A1 | 8/2012 | Travis et al. |
| 2012/0207434 A1 | 8/2012 | Large |
| 2012/0214089 A1 | 8/2012 | Hdnel et al. |
| 2012/0214090 A1 | 8/2012 | Weiser et al. |
| 2012/0218481 A1 | 8/2012 | Popovich et al. |
| 2012/0224062 A1 | 9/2012 | Lacoste et al. |
| 2012/0235884 A1 | 9/2012 | Miller et al. |
| 2012/0235886 A1 | 9/2012 | Border et al. |
| 2012/0235900 A1 | 9/2012 | Border et al. |
| 2012/0242661 A1 | 9/2012 | Takagi et al. |

(56) References Cited

U.S. PATENT DOCUMENTS

| | | |
|---|---|---|
| 2012/0280956 A1 | 11/2012 | Yamamoto et al. |
| 2012/0281943 A1 | 11/2012 | Popovich et al. |
| 2012/0290973 A1 | 11/2012 | Robertson et al. |
| 2012/0294037 A1 | 11/2012 | Holman et al. |
| 2012/0300311 A1 | 11/2012 | Simmonds et al. |
| 2012/0320460 A1 | 12/2012 | Levola |
| 2013/0016324 A1 | 1/2013 | Travis |
| 2013/0016362 A1 | 1/2013 | Gong et al. |
| 2013/0021392 A1 | 1/2013 | Travis |
| 2013/0021586 A1 | 1/2013 | Lippey |
| 2013/0033485 A1 | 2/2013 | Kollin et al. |
| 2013/0039619 A1 | 2/2013 | Laughlin |
| 2013/0044376 A1 | 2/2013 | Valera et al. |
| 2013/0059233 A1 | 3/2013 | Askham |
| 2013/0069850 A1 | 3/2013 | Mukawa et al. |
| 2013/0077049 A1 | 3/2013 | Bohn |
| 2013/0093893 A1 | 4/2013 | Schofield et al. |
| 2013/0101253 A1 | 4/2013 | Popovich et al. |
| 2013/0117377 A1 | 5/2013 | Miller |
| 2013/0125027 A1 | 5/2013 | Abovitz et al. |
| 2013/0128230 A1 | 5/2013 | Macnamara |
| 2013/0138275 A1 | 5/2013 | Nauman et al. |
| 2013/0141937 A1 | 6/2013 | Katsuta et al. |
| 2013/0143336 A1 | 6/2013 | Jain |
| 2013/0163089 A1 | 6/2013 | Bohn |
| 2013/0170031 A1 | 7/2013 | Bohn et al. |
| 2013/0176704 A1 | 7/2013 | Lanman et al. |
| 2013/0184904 A1 | 7/2013 | Gadzinski |
| 2013/0200710 A1 | 8/2013 | Robbins |
| 2013/0207887 A1 | 8/2013 | Raffle et al. |
| 2013/0224634 A1 | 8/2013 | Berneth et al. |
| 2013/0229717 A1 | 9/2013 | Amitai |
| 2013/0249895 A1 | 9/2013 | Westerinen et al. |
| 2013/0250207 A1 | 9/2013 | Bohn |
| 2013/0250430 A1 | 9/2013 | Robbins et al. |
| 2013/0250431 A1 | 9/2013 | Robbins et al. |
| 2013/0257848 A1 | 10/2013 | Westerinen et al. |
| 2013/0258701 A1 | 10/2013 | Westerinen et al. |
| 2013/0267309 A1 | 10/2013 | Robbins et al. |
| 2013/0271731 A1 | 10/2013 | Popovich et al. |
| 2013/0277890 A1 | 10/2013 | Bowman et al. |
| 2013/0305437 A1 | 11/2013 | Weller et al. |
| 2013/0308185 A1 | 11/2013 | Robinson et al. |
| 2013/0312811 A1 | 11/2013 | Aspnes et al. |
| 2013/0314789 A1 | 11/2013 | Saarikko et al. |
| 2013/0314793 A1 | 11/2013 | Robbins et al. |
| 2013/0322810 A1 | 12/2013 | Robbins |
| 2013/0328948 A1 | 12/2013 | Kunkel et al. |
| 2013/0342525 A1 | 12/2013 | Benko et al. |
| 2014/0003762 A1 | 1/2014 | Macnamara |
| 2014/0009809 A1 | 1/2014 | Pyun et al. |
| 2014/0024159 A1 | 1/2014 | Jain |
| 2014/0027006 A1 | 1/2014 | Foley et al. |
| 2014/0037242 A1 | 2/2014 | Popovich et al. |
| 2014/0043689 A1 | 2/2014 | Mason |
| 2014/0055845 A1 | 2/2014 | Jain |
| 2014/0063055 A1 | 3/2014 | Osterhout et al. |
| 2014/0064655 A1 | 3/2014 | Nguyen et al. |
| 2014/0071538 A1 | 3/2014 | Muller |
| 2014/0098010 A1 | 4/2014 | Travis |
| 2014/0104665 A1 | 4/2014 | Popovich et al. |
| 2014/0104685 A1 | 4/2014 | Bohn et al. |
| 2014/0118647 A1 | 5/2014 | Momonoi et al. |
| 2014/0126029 A1 | 5/2014 | Fuetterer |
| 2014/0130132 A1 | 5/2014 | Cahill et al. |
| 2014/0138581 A1 | 5/2014 | Archetti et al. |
| 2014/0140653 A1 | 5/2014 | Brown et al. |
| 2014/0140654 A1 | 5/2014 | Brown et al. |
| 2014/0146394 A1 | 5/2014 | Tout et al. |
| 2014/0152778 A1 | 6/2014 | Ihlenburg et al. |
| 2014/0154614 A1 | 6/2014 | Xie et al. |
| 2014/0160576 A1 | 6/2014 | Robbins et al. |
| 2014/0168055 A1 | 6/2014 | Smith |
| 2014/0168260 A1 | 6/2014 | O'Brien et al. |
| 2014/0168735 A1 | 6/2014 | Yuan et al. |
| 2014/0168783 A1 | 6/2014 | Luebke et al. |
| 2014/0172296 A1 | 6/2014 | Shtukater |
| 2014/0176528 A1 | 6/2014 | Robbins |
| 2014/0177023 A1 | 6/2014 | Gao et al. |
| 2014/0185286 A1 | 7/2014 | Popovich et al. |
| 2014/0198128 A1 | 7/2014 | Hong et al. |
| 2014/0204455 A1 | 7/2014 | Popovich et al. |
| 2014/0211322 A1 | 7/2014 | Bohn et al. |
| 2014/0218468 A1 | 8/2014 | Gao et al. |
| 2014/0218801 A1 | 8/2014 | Simmonds et al. |
| 2014/0232759 A1 | 8/2014 | Simmonds et al. |
| 2014/0240834 A1 | 8/2014 | Mason |
| 2014/0240842 A1 | 8/2014 | Nguyen et al. |
| 2014/0255662 A1 | 9/2014 | Enomoto et al. |
| 2014/0267420 A1 | 9/2014 | Schowengerdt et al. |
| 2014/0268353 A1 | 9/2014 | Fujimura et al. |
| 2014/0300947 A1 | 10/2014 | Fattal et al. |
| 2014/0300960 A1 | 10/2014 | Santori et al. |
| 2014/0300966 A1 | 10/2014 | Travers et al. |
| 2014/0327970 A1 | 11/2014 | Bohn et al. |
| 2014/0330159 A1 | 11/2014 | Costa et al. |
| 2014/0367719 A1 | 12/2014 | Jain |
| 2014/0375542 A1 | 12/2014 | Robbins et al. |
| 2014/0375789 A1 | 12/2014 | Lou et al. |
| 2014/0375790 A1 | 12/2014 | Robbins et al. |
| 2015/0001677 A1 | 1/2015 | Palumbo et al. |
| 2015/0003796 A1 | 1/2015 | Bennett |
| 2015/0010265 A1 | 1/2015 | Popovich et al. |
| 2015/0015946 A1 | 1/2015 | Muller |
| 2015/0016777 A1 | 1/2015 | Abovitz et al. |
| 2015/0035744 A1 | 2/2015 | Robbins et al. |
| 2015/0036068 A1 | 2/2015 | Fattal et al. |
| 2015/0058791 A1 | 2/2015 | Robertson et al. |
| 2015/0062675 A1 | 3/2015 | Ayres et al. |
| 2015/0062707 A1 | 3/2015 | Simmonds et al. |
| 2015/0086163 A1 | 3/2015 | Valera et al. |
| 2015/0086907 A1 | 3/2015 | Mizuta et al. |
| 2015/0107671 A1 | 4/2015 | Bodan et al. |
| 2015/0109763 A1 | 4/2015 | Shinkai et al. |
| 2015/0125109 A1 | 5/2015 | Robbins et al. |
| 2015/0148728 A1 | 5/2015 | Sallum et al. |
| 2015/0160529 A1 | 6/2015 | Popovich et al. |
| 2015/0167868 A1 | 6/2015 | Boncha |
| 2015/0177686 A1 | 6/2015 | Lee et al. |
| 2015/0177688 A1 | 6/2015 | Popovich et al. |
| 2015/0185475 A1 | 7/2015 | Saarikko et al. |
| 2015/0219834 A1 | 8/2015 | Nichol et al. |
| 2015/0235447 A1 | 8/2015 | Abovitz et al. |
| 2015/0235448 A1 | 8/2015 | Schowengerdt et al. |
| 2015/0243068 A1 | 8/2015 | Solomon |
| 2015/0247975 A1 | 9/2015 | Abovitz et al. |
| 2015/0260994 A1 | 9/2015 | Akutsu et al. |
| 2015/0268415 A1 | 9/2015 | Schowengerdt et al. |
| 2015/0277375 A1 | 10/2015 | Large et al. |
| 2015/0285682 A1 | 10/2015 | Popovich et al. |
| 2015/0288129 A1 | 10/2015 | Jain |
| 2015/0289762 A1 | 10/2015 | Popovich et al. |
| 2015/0309264 A1 | 10/2015 | Abovitz et al. |
| 2015/0316768 A1 | 11/2015 | Simmonds |
| 2015/0338689 A1 | 11/2015 | Min et al. |
| 2015/0346490 A1 | 12/2015 | Tekolste et al. |
| 2015/0346495 A1 | 12/2015 | Welch et al. |
| 2015/0355394 A1 | 12/2015 | Leighton et al. |
| 2016/0003847 A1 | 1/2016 | Ryan et al. |
| 2016/0004090 A1 | 1/2016 | Popovich et al. |
| 2016/0026253 A1 | 1/2016 | Bradski et al. |
| 2016/0033705 A1 | 2/2016 | Fattal |
| 2016/0033706 A1 | 2/2016 | Fattal et al. |
| 2016/0038992 A1 | 2/2016 | Arthur et al. |
| 2016/0041387 A1 | 2/2016 | Valera et al. |
| 2016/0060529 A1 | 3/2016 | Hegmann et al. |
| 2016/0077338 A1 | 3/2016 | Robbins et al. |
| 2016/0085300 A1 | 3/2016 | Robbins et al. |
| 2016/0116739 A1 | 4/2016 | Tekolste et al. |
| 2016/0124223 A1 | 5/2016 | Shinbo et al. |
| 2016/0132025 A1 | 5/2016 | Taff et al. |
| 2016/0195664 A1 | 7/2016 | Fattal et al. |
| 2016/0209648 A1 | 7/2016 | Haddick et al. |
| 2016/0209657 A1 | 7/2016 | Popovich et al. |

(56) References Cited

U.S. PATENT DOCUMENTS

| | | |
|---|---|---|
| 2016/0231568 A1 | 8/2016 | Saarikko et al. |
| 2016/0231570 A1 | 8/2016 | Levola et al. |
| 2016/0238772 A1 | 8/2016 | Waldern et al. |
| 2016/0266398 A1 | 9/2016 | Poon et al. |
| 2016/0274362 A1 | 9/2016 | Tinch et al. |
| 2016/0283773 A1 | 9/2016 | Popovich et al. |
| 2016/0291328 A1 | 10/2016 | Popovich et al. |
| 2016/0299344 A1 | 10/2016 | Dobschal et al. |
| 2016/0320536 A1 | 11/2016 | Simmonds et al. |
| 2016/0327705 A1 | 11/2016 | Simmonds et al. |
| 2016/0336033 A1 | 11/2016 | Tanaka |
| 2016/0341964 A1 | 11/2016 | Amitai |
| 2017/0003505 A1 | 1/2017 | Vallius et al. |
| 2017/0010466 A1 | 1/2017 | Klug et al. |
| 2017/0010488 A1 | 1/2017 | Klug et al. |
| 2017/0030550 A1 | 2/2017 | Popovich et al. |
| 2017/0031160 A1 | 2/2017 | Popovich et al. |
| 2017/0031171 A1 | 2/2017 | Vallius et al. |
| 2017/0034435 A1 | 2/2017 | Vallius |
| 2017/0038579 A1 | 2/2017 | Yeoh et al. |
| 2017/0052374 A1 | 2/2017 | Waldern et al. |
| 2017/0052376 A1 | 2/2017 | Amitai et al. |
| 2017/0059759 A1 | 3/2017 | Ayres et al. |
| 2017/0059775 A1 | 3/2017 | Coles et al. |
| 2017/0102543 A1 | 4/2017 | Vallius |
| 2017/0115487 A1 | 4/2017 | Travis et al. |
| 2017/0123208 A1 | 5/2017 | Vallius |
| 2017/0131460 A1 | 5/2017 | Lin et al. |
| 2017/0131546 A1 | 5/2017 | Woltman et al. |
| 2017/0131551 A1 | 5/2017 | Robbins et al. |
| 2017/0160546 A1 | 6/2017 | Bull et al. |
| 2017/0180404 A1 | 6/2017 | Bersch et al. |
| 2017/0180408 A1 | 6/2017 | Yu et al. |
| 2017/0199333 A1 | 7/2017 | Waldern et al. |
| 2017/0212295 A1 | 7/2017 | Vasylyev |
| 2017/0219841 A1 | 8/2017 | Popovich et al. |
| 2017/0255257 A1 | 9/2017 | Tiana et al. |
| 2017/0276940 A1 | 9/2017 | Popovich et al. |
| 2017/0299860 A1 | 10/2017 | Wall et al. |
| 2017/0356801 A1 | 12/2017 | Popovich et al. |
| 2017/0357841 A1 | 12/2017 | Popovich et al. |
| 2018/0011324 A1 | 1/2018 | Popovich et al. |
| 2018/0059305 A1 | 3/2018 | Popovich et al. |
| 2018/0074265 A1 | 3/2018 | Waldern et al. |
| 2018/0074352 A1 | 3/2018 | Popovich et al. |
| 2018/0113303 A1 | 4/2018 | Popovich et al. |
| 2018/0120669 A1 | 5/2018 | Popovich et al. |
| 2018/0143449 A1 | 5/2018 | Popovich et al. |
| 2018/0188542 A1 | 7/2018 | Waldern et al. |
| 2018/0210198 A1 | 7/2018 | Brown et al. |
| 2018/0210396 A1 | 7/2018 | Popovich et al. |
| 2018/0232048 A1 | 8/2018 | Popovich et al. |
| 2018/0246354 A1 | 8/2018 | Popovich et al. |
| 2018/0275402 A1 | 9/2018 | Popovich et al. |
| 2018/0284440 A1 | 10/2018 | Popovich et al. |
| 2018/0373115 A1 | 12/2018 | Brown et al. |
| 2019/0064735 A1 | 2/2019 | Waldern et al. |
| 2019/0072723 A1 | 3/2019 | Waldern et al. |
| 2019/0113751 A9 | 4/2019 | Waldern et al. |
| 2019/0113829 A1 | 4/2019 | Waldern et al. |
| 2019/0121027 A1 | 4/2019 | Popovich et al. |
| 2019/0129085 A1 | 5/2019 | Waldern et al. |
| 2019/0212588 A1 | 7/2019 | Waldern et al. |
| 2019/0212589 A1 | 7/2019 | Waldern et al. |
| 2019/0212596 A1 | 7/2019 | Waldern et al. |
| 2019/0212597 A1 | 7/2019 | Waldern et al. |
| 2019/0212698 A1 | 7/2019 | Waldern et al. |
| 2019/0212699 A1 | 7/2019 | Waldern et al. |
| 2019/0278224 A1 | 9/2019 | Schlottau et al. |
| 2019/0339558 A1 | 11/2019 | Waldern et al. |
| 2020/0033802 A1 | 1/2020 | Popovich et al. |
| 2020/0271973 A1 | 8/2020 | Waldern et al. |
| 2020/0363771 A1 | 11/2020 | Waldern et al. |
| 2021/0026297 A1 | 1/2021 | Waldern et al. |
| 2021/0216040 A1 | 7/2021 | Waldern et al. |
| 2021/0223585 A1 | 7/2021 | Waldern et al. |

FOREIGN PATENT DOCUMENTS

| | | |
|---|---|---|
| CN | 1357010 A | 7/2002 |
| CN | 200944140 Y | 9/2007 |
| CN | 101103297 A | 1/2008 |
| CN | 101151562 A | 3/2008 |
| CN | 101263412 A | 9/2008 |
| CN | 100492099 C | 5/2009 |
| CN | 101589326 A | 11/2009 |
| CN | 101688977 A | 3/2010 |
| CN | 101881936 A | 11/2010 |
| CN | 102314092 A | 1/2012 |
| CN | 102393548 A | 3/2012 |
| CN | 103777282 A | 5/2014 |
| CN | 103823267 A | 5/2014 |
| CN | 104204901 A | 12/2014 |
| CN | 104246626 A | 12/2014 |
| CN | 104956252 A | 9/2015 |
| CN | 105074537 A | 11/2015 |
| CN | 105074539 A | 11/2015 |
| CN | 105190407 A | 12/2015 |
| CN | 105229514 A | 1/2016 |
| CN | 105393159 A | 3/2016 |
| CN | 105408801 A | 3/2016 |
| CN | 105408802 A | 3/2016 |
| CN | 105408803 A | 3/2016 |
| CN | 105531716 A | 4/2016 |
| CN | 105705981 A | 6/2016 |
| CN | 105940451 A | 9/2016 |
| CN | 106950744 A | 7/2017 |
| CN | 107466372 A | 12/2017 |
| CN | 108474945 A | 8/2018 |
| CN | 108780224 A | 11/2018 |
| CN | 109154717 A | 1/2019 |
| CN | 103823267 B | 5/2019 |
| CN | 111566571 A | 8/2020 |
| CN | 111615655 A | 9/2020 |
| CN | 111684362 A | 9/2020 |
| CN | 111902768 A | 11/2020 |
| DE | 19751190 A1 | 5/1999 |
| DE | 102006003785 A1 | 7/2007 |
| DE | 102012108424 A1 | 3/2014 |
| DE | 102013209436 A1 | 11/2014 |
| EP | 0795775 A2 | 9/1997 |
| EP | 0822441 A2 | 2/1998 |
| EP | 1347641 A1 | 9/2003 |
| EP | 1413972 A1 | 4/2004 |
| EP | 1526709 A2 | 4/2005 |
| EP | 1748305 A1 | 1/2007 |
| EP | 1938152 A1 | 7/2008 |
| EP | 1413972 B1 | 10/2008 |
| EP | 2110701 A1 | 10/2009 |
| EP | 2225592 A1 | 9/2010 |
| EP | 2244114 A1 | 10/2010 |
| EP | 2326983 A1 | 6/2011 |
| EP | 2381290 A1 | 10/2011 |
| EP | 1828832 B1 | 5/2013 |
| EP | 2733517 A1 | 5/2014 |
| EP | 1573369 B1 | 7/2014 |
| EP | 2748670 A1 | 7/2014 |
| EP | 2929378 A1 | 10/2015 |
| EP | 2748670 B1 | 11/2015 |
| EP | 2995986 A1 | 3/2016 |
| EP | 1402298 B1 | 9/2016 |
| EP | 2995986 B1 | 4/2017 |
| EP | 3256888 A1 | 12/2017 |
| EP | 3359999 A1 | 8/2018 |
| EP | 2494388 B1 | 11/2018 |
| EP | 3433658 A1 | 1/2019 |
| EP | 3433659 A1 | 1/2019 |
| EP | 3710876 A1 | 9/2020 |
| EP | 3710887 A1 | 9/2020 |
| EP | 3710893 A1 | 9/2020 |
| EP | 3710894 A1 | 9/2020 |
| FR | 2677463 A1 | 12/1992 |

(56) References Cited

FOREIGN PATENT DOCUMENTS

| | | | |
|---|---|---|---|
| GB | 2115178 A | 9/1983 |
| GB | 2140935 A | 12/1984 |
| GB | 2508661 A | 6/2014 |
| GB | 2509536 A | 7/2014 |
| GB | 2512077 A | 9/2014 |
| GB | 2514658 A | 12/2014 |
| HK | 1204684 A1 | 11/2015 |
| HK | 1205563 A1 | 12/2015 |
| HK | 1205793 A1 | 12/2015 |
| HK | 1206101 A1 | 12/2015 |
| JP | 57089722 A | 6/1982 |
| JP | 02186319 A | 7/1990 |
| JP | 03239384 A | 10/1991 |
| JP | 06294952 A | 10/1994 |
| JP | 07098439 A | 4/1995 |
| JP | 0990312 A | 4/1997 |
| JP | 10096903 A | 4/1998 |
| JP | 11109320 A | 4/1999 |
| JP | 11142806 A | 5/1999 |
| JP | 2953444 B2 | 9/1999 |
| JP | 2000056259 A | 2/2000 |
| JP | 2000511306 A | 8/2000 |
| JP | 2000261706 A | 9/2000 |
| JP | 2000267042 A | 9/2000 |
| JP | 2001027739 A | 1/2001 |
| JP | 2001296503 A | 10/2001 |
| JP | 2002090858 A | 3/2002 |
| JP | 2002122906 A | 4/2002 |
| JP | 2002162598 A | 6/2002 |
| JP | 2002523802 A | 7/2002 |
| JP | 2002529790 A | 9/2002 |
| JP | 2003066428 A | 3/2003 |
| JP | 2003270419 A | 9/2003 |
| JP | 2004157245 A | 6/2004 |
| JP | 2006350129 A | 12/2006 |
| JP | 2007011057 A | 1/2007 |
| JP | 2007219106 A | 8/2007 |
| JP | 2008112187 A | 5/2008 |
| JP | 2009036955 A | 2/2009 |
| JP | 2009133999 A | 6/2009 |
| JP | 2009211091 A | 9/2009 |
| JP | 4367775 B2 | 11/2009 |
| JP | 2012137616 A | 7/2012 |
| JP | 5303928 B2 | 10/2013 |
| JP | 2013235256 A | 11/2013 |
| JP | 2014132328 A | 7/2014 |
| JP | 2015053163 A | 3/2015 |
| JP | 2015523586 A | 8/2015 |
| JP | 2015172713 A | 10/2015 |
| JP | 2018508037 A | 3/2018 |
| JP | 2018533069 A | 11/2018 |
| JP | 2019512745 A | 5/2019 |
| JP | 2019520595 A | 7/2019 |
| JP | 2021509488 A | 3/2021 |
| JP | 2021509736 A | 4/2021 |
| JP | 2021509737 A | 4/2021 |
| JP | 2021509739 A | 4/2021 |
| KR | 20060132474 A | 12/2006 |
| KR | 20100092059 A | 8/2010 |
| KR | 20140140063 A | 12/2014 |
| KR | 20140142337 A | 12/2014 |
| KR | 20200104402 A | 9/2020 |
| KR | 20200106170 A | 9/2020 |
| KR | 20200106932 A | 9/2020 |
| KR | 20200108030 A | 9/2020 |
| TW | 200535633 A | 11/2005 |
| TW | 200801583 A | 1/2008 |
| TW | 201314263 A | 4/2013 |
| TW | 201600943 A | 1/2016 |
| TW | 201604601 A | 2/2016 |
| WO | 1997001133 A1 | 1/1997 |
| WO | 1997027519 A1 | 7/1997 |
| WO | 1998004650 A1 | 2/1998 |
| WO | 1999009440 A1 | 2/1999 |
| WO | 1999052002 A1 | 10/1999 |
| WO | 2000016136 A1 | 3/2000 |
| WO | 2000023830 | 4/2000 |
| WO | 2000023832 A1 | 4/2000 |
| WO | 2000023847 | 4/2000 |
| WO | 2000028369 A2 | 5/2000 |
| WO | 2000028369 A3 | 10/2000 |
| WO | 2001050200 A2 | 7/2001 |
| WO | 2001090822 A1 | 11/2001 |
| WO | 2002082168 A1 | 10/2002 |
| WO | 2003081320 A1 | 10/2003 |
| WO | 2004102226 A2 | 11/2004 |
| WO | 2005001753 A1 | 1/2005 |
| WO | 2005006065 A8 | 1/2005 |
| WO | 2005006065 A3 | 2/2005 |
| WO | 2005073798 A1 | 8/2005 |
| WO | 2006002870 A1 | 1/2006 |
| WO | 2006064301 A1 | 6/2006 |
| WO | 2006064325 A1 | 6/2006 |
| WO | 2006064334 A1 | 6/2006 |
| WO | 2006102073 A2 | 9/2006 |
| WO | 2006132614 A1 | 12/2006 |
| WO | 2006102073 A3 | 1/2007 |
| WO | 2007015141 A2 | 2/2007 |
| WO | 2007029032 A1 | 3/2007 |
| WO | 2007085682 A1 | 8/2007 |
| WO | 2007130130 A2 | 11/2007 |
| WO | 2007141587 A1 | 12/2007 |
| WO | 2007141589 A1 | 12/2007 |
| WO | 2008011066 A2 | 1/2008 |
| WO | 2008011066 A9 | 5/2008 |
| WO | 2008081070 A1 | 7/2008 |
| WO | 2008100545 A2 | 8/2008 |
| WO | 2008011066 A3 | 12/2008 |
| WO | 2009013597 A2 | 1/2009 |
| WO | 2009013597 A3 | 1/2009 |
| WO | 2009077802 A1 | 6/2009 |
| WO | 2009077803 A1 | 6/2009 |
| WO | 2009101238 A1 | 8/2009 |
| WO | 2007130130 A3 | 9/2009 |
| WO | 2009155437 A1 | 12/2009 |
| WO | 2009155437 A8 | 3/2010 |
| WO | 2010023444 A1 | 3/2010 |
| WO | 2010057219 A1 | 5/2010 |
| WO | 2010067114 A1 | 6/2010 |
| WO | 2010067117 A1 | 6/2010 |
| WO | 2010078856 A1 | 7/2010 |
| WO | 2010104692 A2 | 9/2010 |
| WO | 2010122330 A1 | 10/2010 |
| WO | 2010125337 A2 | 11/2010 |
| WO | 2010125337 A3 | 11/2010 |
| WO | 2011012825 A1 | 2/2011 |
| WO | 2011032005 A2 | 3/2011 |
| WO | 2011042711 A2 | 4/2011 |
| WO | 2011042711 A3 | 4/2011 |
| WO | 2011051660 A1 | 5/2011 |
| WO | 2011055109 A2 | 5/2011 |
| WO | 2011073673 A1 | 6/2011 |
| WO | 2011107831 A1 | 9/2011 |
| WO | 2011110821 A1 | 9/2011 |
| WO | 2011131978 A1 | 10/2011 |
| WO | 2012052352 A1 | 4/2012 |
| WO | 2012062658 A1 | 5/2012 |
| WO | 2012158950 A1 | 11/2012 |
| WO | 2012172295 A1 | 12/2012 |
| WO | 2013027004 A1 | 2/2013 |
| WO | 2013027006 A1 | 2/2013 |
| WO | 2013033274 A1 | 3/2013 |
| WO | 2013034879 A1 | 3/2013 |
| WO | 2013049012 A1 | 4/2013 |
| WO | 2013102759 A2 | 7/2013 |
| WO | 2013163347 A1 | 10/2013 |
| WO | 2013167864 A1 | 11/2013 |
| WO | 2013190257 A1 | 12/2013 |
| WO | 2014064427 A1 | 5/2014 |
| WO | 2014080155 A1 | 5/2014 |
| WO | 2014085734 A1 | 6/2014 |
| WO | 2014090379 A1 | 6/2014 |
| WO | 2014091200 A1 | 6/2014 |
| WO | 2014093601 A1 | 6/2014 |

(56) References Cited

FOREIGN PATENT DOCUMENTS

| | | |
|---|---|---|
| WO | 2014100182 A1 | 6/2014 |
| WO | 2014113506 A1 | 7/2014 |
| WO | 2014116615 A1 | 7/2014 |
| WO | 2014130383 A1 | 8/2014 |
| WO | 2014144526 A2 | 9/2014 |
| WO | 2014159621 A1 | 10/2014 |
| WO | 2014164901 A1 | 10/2014 |
| WO | 2014176695 A1 | 11/2014 |
| WO | 2014179632 A1 | 11/2014 |
| WO | 2014188149 A1 | 11/2014 |
| WO | 2014209733 A1 | 12/2014 |
| WO | 2014209819 A1 | 12/2014 |
| WO | 2014209820 A1 | 12/2014 |
| WO | 2014209821 A1 | 12/2014 |
| WO | 2014210349 A1 | 12/2014 |
| WO | 2015006784 A2 | 1/2015 |
| WO | 2015015138 A1 | 2/2015 |
| WO | 2015017291 A1 | 2/2015 |
| WO | 2015069553 A1 | 5/2015 |
| WO | 2015081313 A2 | 6/2015 |
| WO | 2015117039 A1 | 8/2015 |
| WO | 2015145119 A1 | 10/2015 |
| WO | 2016010289 A1 | 1/2016 |
| WO | 2016020643 A1 | 2/2016 |
| WO | 2016025350 A1 | 2/2016 |
| WO | 2016042283 A1 | 3/2016 |
| WO | 2016046514 A1 | 3/2016 |
| WO | 2016103263 A1 | 6/2016 |
| WO | 2016111706 A1 | 7/2016 |
| WO | 2016111707 A1 | 7/2016 |
| WO | 2016111708 A1 | 7/2016 |
| WO | 2016111709 A1 | 7/2016 |
| WO | 2016113534 A1 | 7/2016 |
| WO | 2016116733 A1 | 7/2016 |
| WO | 2016118107 A1 | 7/2016 |
| WO | 2016122679 A1 | 8/2016 |
| WO | 2016130509 A1 | 8/2016 |
| WO | 2016135434 A1 | 9/2016 |
| WO | 2016156776 A1 | 10/2016 |
| WO | 2016181108 A1 | 11/2016 |
| WO | 2017060665 A1 | 4/2017 |
| WO | 2017094129 A1 | 6/2017 |
| WO | 2017162999 A1 | 9/2017 |
| WO | 2017162999 A8 | 9/2017 |
| WO | 2017178781 A1 | 10/2017 |
| WO | 2017180403 A1 | 10/2017 |
| WO | 2017182771 A1 | 10/2017 |
| WO | 2017203200 A1 | 11/2017 |
| WO | 2017203201 A1 | 11/2017 |
| WO | 2017207987 A1 | 12/2017 |
| WO | 2018102834 A2 | 6/2018 |
| WO | 2018102834 A3 | 6/2018 |
| WO | 2018096359 A3 | 7/2018 |
| WO | 2018129398 A1 | 7/2018 |
| WO | 2018150163 A1 | 8/2018 |
| WO | 2019046649 A1 | 3/2019 |
| WO | 2019077307 A1 | 4/2019 |
| WO | 2019079350 A2 | 4/2019 |
| WO | 2019046649 A8 | 5/2019 |
| WO | 2019122806 A1 | 6/2019 |
| WO | 2019135784 A1 | 7/2019 |
| WO | 2019135796 A1 | 7/2019 |
| WO | 2019135837 A1 | 7/2019 |
| WO | 2019136470 A1 | 7/2019 |
| WO | 2019136471 A1 | 7/2019 |
| WO | 2019136473 A1 | 7/2019 |
| WO | 2019171038 A1 | 9/2019 |
| WO | 2019217453 A1 | 11/2019 |
| WO | 2020023779 A1 | 1/2020 |
| WO | 2020172681 A1 | 8/2020 |
| WO | 2020212682 A1 | 10/2020 |
| WO | 2021016371 A1 | 1/2021 |
| WO | 2021032982 A1 | 2/2021 |
| WO | 2021032983 A1 | 2/2021 |
| WO | 2021044121 A1 | 3/2021 |

OTHER PUBLICATIONS

Extended European Search Report for European Application No. 19736108.2, Search completed Sep. 15, 2021, dated Sep. 27, 2021, 8 Pgs.
Extended Search Report for European Application No. 18898841.4, Search completed Mar. 18, 2021, dated Mar. 26, 2021, 10 Pgs.
International Preliminary Report on Patentability for International Application PCT/US2019/043496 Report dated Jan. 26, 2021, dated Feb. 4, 2021, 5 Pgs.
International Preliminary Report on Patentability for International Application PCT/US2020/019549, Report dated Aug. 10, 2021, dated Sep. 2, 2021, 7 Pgs.
International Preliminary Report on Patentability for International Application No. PCT/US2018/037410, Report dated Jul. 14, 2020, dated Jul. 23, 2020, 7 Pgs.
International Preliminary Report on Patentability for International Application No. PCT/US2018/048636, Report dated Jul. 14, 2020, dated Jul. 23, 2020, 9 Pgs.
International Preliminary Report on Patentability for International Application No. PCT/US2018/062835, Report dated Jul. 14, 2020, dated Jul. 23, 2020, 7 Pgs.
International Preliminary Report on Patentability for International Application No. PCT/US2019/012758, Report dated Jul. 14, 2020, dated Jul. 23, 2020, 4 Pgs.
International Preliminary Report on Patentability for International Application No. PCT/US2019/012759, Report dated Jul. 14, 2020, dated Jul. 23, 2020, 6 Pgs.
International Preliminary Report on Patentability for International Application PCT/US2019/012764, Report dated Jul. 14, 2020, dated Jul. 23, 2020, 5 Pgs.
International Preliminary Report on Patentability for International Application PCT/US2019/031163, Report dated Nov. 10, 2020, dated Nov. 19, 2020, 6 Pgs.
International Search Report and Written Opinion for International Application No. PCT/US2019/043496, Search completed Sep. 28, 2019, dated Nov. 14, 2019, 12 Pgs.
International Search Report and Written Opinion for International Application No. PCT/US2020/019549, Search completed Apr. 14, 2020, dated May 22, 2020, 12 Pgs.
International Search Report and Written Opinion for International Application No. PCT/US2020/043107, Search completed Sep. 28, 2020, dated Oct. 15, 2020, 12 Pgs.
De Sarkar et al., "Effect of Monomer Functionality on the Morphology and Performance of Holographic Transmission Gratings Recorded on Polymer Dispersed Liquid Crystals", Macromolecules, 2003, vol. 36, No. 3, pp. 630-638.
Fuh et al., "Thermally and Electrically Switchable Gratings Based Upon the Polymer-Balls Type Polymer-Dispersed Liquid Crystal Films", Appl. Phys. vol. 41, No. 22, Aug. 1, 2002, pp. 4585-4589.
He et al., "Transmission Holographic Gratings Using Siloxane Containing Liquid Crystalline Compounds, Importance of Chemical Structure of Polymer Matrix Components", Polymer Journal, Jun. 9, 2006, vol. 38, No. 7, pp. 678-685.
Jang et al., "Low Driving Voltage Holographic Polymer Dispersed Liquid Crystals with Chemically Incorporated Graphene Oxide", Journal of Materials Chemistry, 2011, vol. 21, p. 19226-19232, doi.10.1039/1jm13827h.
Jeong et al., "Memory Effect of Polymer Dispersed Liquid Crystal by Hybridization with Nanoclay", express Polymer Letters, vol. 4, No. 1, 2010, pp. 39-46.
Kakiuchida et al., "Multiple Bragg Diffractions with Different Wavelengths and Polarizations Composed of Liquid Crystal/Polymer Periodic Phases", ACS Omega, Sep. 22, 2017, pp. 6081-6090, doi: 10.1021/acsomega.7b01149.
Liu et al., "Effect of Surfactant on the Electro-Optical Properties of Holographic Polymer Dispersed Liquid Crystal Bragg Gratings", Optical Materials, 2005, vol. 27, pp. 1451-1455, available online Dec. 25, 2004, doi: 10.1016/j.optmat.2004.10.010.
Liu et al., "Realization and Optimization of Holographic Waveguide Display System", Acta Optica Sinica, vol. 37, Issue 5, Issuing date—May 10, 2017, pp. 310-317.

(56) References Cited

OTHER PUBLICATIONS

Ogiwara et al., "Temperature Dependence of Anisotropic Diffraction in Holographic Polymer-Dispersed Liquid Crystal Memory", Applied Optics, Sep. 10, 2013, vol. 52, No. 26, pp. 6529-6536.
Ogiwara et al., "Thermo-Driven Light Controller by Using Thermal Modulation of Diffraction Wavelength in Holographic Polymer Dispersed Liquid Crystal Grating", Proc SPIE, Feb. 19, 2014, 9004, Article 90040Q, 8 pgs., doi: 10.1117/12.2039104.
Peng et al., "Low Voltage Driven and Highly Diffractive Holographic Polymer Dispersed Liquid Crystals with Spherical Morphology", RSC Advances, 2017, vol. 7, pp. 51847-51857, doi: 10.1039/c7ra08949.
Roussel et al., "Photopolymerization Kinetics and Phase Behavior of Acrylate Based Polymers Dispersed Liquid Crystals", Liquid Crystals, 1998, vol. 24, Issue 4, pp. 555-561.
Tahata et al., "Effects of Polymer Matrix on Electro-Optic Properties of Liquid Crystal Mixed With Polymer", Proc SPIE, Mar. 11, 1996, vol. 2651, pp. 101-106, doi: 10.1117/12.235342.
Youcef et al., "Phase Behavior of Poly(N-Butyl Acrylate) and Poly(2-Ethylhexyl Acrylate) in Nematic Liquid Crystal E7", Macromol. Symp. 2011, vol. 303, pp. 10-16, doi: 10.1002/masy.201150502.
Zheng et al., "Holographic Polymer-Dispersed Liquid Crystal Grating with Low Scattering Losses", Liquid Crystals, Mar. 2012, vol. 39, Issue 3, pp. 387-391.
"Cree XLamp XP-E LEDs", Cree, Inc., Retrieved from www.cree.com/Xlamp, CLD-DS18 Rev 17, 2013, 17 pgs.
"Desmodur N 3900", Bayer Materialscience AG, Mar. 18, 2013, www.bayercoatings.com, 4 pgs.
"Digilens—Innovative Augmented Reality Display and Sensor Solutions for OEMs", Jun. 6, 2017, 31 pgs.
"Exotic Optical Components", Building Electro-Optical Systems, Making It All Work, Chapter 7, John Wiley & Sons, Inc., pp. 233-261.
"FHS Lenses Series", Fraen Corporation, www.fraen.com, Jun. 16, 2003, 10 pgs.
"FLP Lens Series for LUXEONTM Rebel and Rebel ES LEDs", Fraen Corporation, www.fraensrl.com, Aug. 7, 2015, 8 pgs.
"Head-up Displays, See-through display for military aviation", BAE Systems, 2016, 3 pgs.
"Holder for LUXEON Rebel—Part No. 180", Polymer Optics Ltd., 2008, 12 pgs.
"LED 7-Segment Displays", Lumex, uk.digikey.com, 2003, UK031, 36 pgs.
"LED325W UVTOP UV LED with Window", Thorlabs, Specifications and Documentation, 21978-S01 Rev. A, Apr. 8, 2011, 5 pgs.
"Liquid Crystal Phases", Phases of Liquid Crystals, http://plc.cwru.edu/tutorial/enhanced/files/lc/phase, Retrieved on Sep. 21, 2004, 6 pgs.
"LiteHUD Head-up display", BAE Systems, 2016, 2 pgs.
"LiteHUD Head-up display infographic", BAE Systems, 2017, 2 pgs.
"Luxeon C: Power Light Source", Philips Lumileds, www.philipslumileds.com, 2012, 18 pgs.
"Luxeon Rebel ES: Leading efficacy and light output, maximum design flexibility", LUXEON Rebel ES Datasheet DS61 20130221, www.philipslumileds.com, 2013, 33 pgs.
"Mobile Display Report", Insight Media, LLC, Apr. 2012, vol. 7, No. 4, 72 pgs.
"Molecular Imprints Imprio 55", Engineering at Illinois, Micro + Nanotechnology Lab, Retrieved from https://mntl.illinois.edu/facilities/cleanrooms/equipment/Nano-Imprint.asp, Dec. 28, 2015, 2 pgs.
"Navy awards SGB Labs a contract for HMDs for simulation and training", Press releases, DigiLens, Oct. 2012, pp. 1-2.
"Optical measurements of retinal flow", Industrial Research Limited, Feb. 2012, 18 pgs.
"Osterhout Design Group Develops Next-Generation, Fully-integrated Smart Glasses Using Qualcomm Technologies", ODG, www.osterhoutgroup.com, Sep. 18, 2014, 2 pgs.
"Plastic has replaced glass in photochromic lens", 2003, 1 page.
"Range Finding Using Pulse Lasers", OSRAM, Opto Semiconductors, Sep. 10, 2004, 7 pgs.
"Response time in Liquid-Crystal Variable Retarders", Meadowlark Optics, Inc., 2005, 4 pgs.
"Secondary Optics Design Considerations for SuperFlux LEDs", Lumileds, application brief AB20-5, Sep. 2002, 23 pgs.
"Solid-State Optical Mouse Sensor with Quadrature Outputs", IC Datasheet, UniquelCs, Jul. 15, 2004, 11 pgs.
"SVGA TransparentVLSITM Microdisplay Evaluation Kit", Radiant Images, Inc., Product Data Sheet, 2003, 3 pgs.
"Technical Data Sheet LPR1", Luminus Devices, Inc., Luminus Projection Chipset, Release 1, Preliminary, Revision B, Sep. 21, 2004, 9 pgs.
"The Next Generation of TV", SID Information Display, Nov./Dec. 2014, vol. 30, No. 6, 56 pgs.
"Thermal Management Considerations for SuperFlux LEDs", Lumileds, application brief AB20-4, Sep. 2002, 14 pgs.
"USAF Awards SBG Labs an SBIR Contract for Wide Field of View HUD", Press Release ,SBG Labs DigiLens, Apr. 2014, 2 pgs.
"UVTOP240", Roithner LaserTechnik GmbH, v 2.0, Jun. 24, 2013, 6 pgs.
"UVTOP310", Roithner LaserTechnik GmbH, v 2.0, Jun. 24, 2013, 6 pgs.
"Velodyne's HDL-64E: A High Definition Lidar Sensor for 3-D Applications", High Definition Lidar, white paper, Oct. 2007, 7 pgs.
"VerLASE Gets Patent for Breakthrough Color Conversion Technology That Enables Full Color MicroLED Arrays for Near Eye Displays", Cision PRweb, Apr. 28, 2015, Retrieved from the Internet http://www.prweb.com/releases/2015/04/prweb12681038.htm, 3 pgs.
"Webster's Third New International Dictionary 433", (1986), 3 pages.
"X-Cubes—Revisited for LCOS", BASID, RAF Electronics Corp. Rawson Optics, Inc., Oct. 24, 2002, 16 pgs.
Aachen, "Design of plastic optics for LED applications", Optics Colloquium 2009, Mar. 19, 2009, 30 pgs.
Abbate et al., "Characterization of LC-polymer composites for opto-electronic application", Proceedings of OPTOEL'03, Leganes-Madrid, Spain, Jul. 14-16, 2003, 4 pgs.
Al-Kalbani et al., "Ocular Microtremor laser speckle metrology", Proc. of SPIE, 2009, vol. 7176 717606-1, 12 pgs.
Almanza-Workman et al., "Planarization coating for polyimide substrates used in roll-to-roll fabrication of active matrix backplanes for flexible displays", HP Laboratories, HPL-2012-23, Feb. 6, 2012, 12 pgs.
Amitai et al., "Visor-display design based on planar holographic optics", Applied Optics, vol. 34, No. 8, Mar. 10, 1995, pp. 1352-1356.
Amundson et al., "Morphology and electro-optic properties of polymer-dispersed liquid-crystal films", Physical Review E, Feb. 1997, vol. 55. No. 2, pp. 1646-1654.
An et al., "Speckle suppression in laser display using several partially coherent beams", Optics Express, Jan. 5, 2009, vol. 17, No. 1, pp. 92-103.
Apter et al., "Electrooptical Wide-Angle Beam Deflector Based on Fringing-Field-Induced Refractive Inhomogeneity in a Liquid Crystal Layer", 23rd IEEE Convention of Electrical and Electronics Engineers in Israel, Sep. 6-7, 2004, pp. 240-243.
Arnold et al., "52.3: An Improved Polarizing Beamsplitter LCOS Projection Display Based on Wire-Grid Polarizers", Society for Information Display, Jun. 2001, pp. 1282-1285.
Ayras et al., "Exit pupil expander with a large field of view based on diffractive optics", Journal of the SID, May 18, 2009, 17/8, pp. 659-664.
Baets et al., "Resonant-Cavity Light-Emitting Diodes: a review", Proceedings of SPIE, 2003, vol. 4996, pp. 74-86.
Bayer et al., "Introduction to Helmet-Mounted Displays", 2016, pp. 47-108.
Beckel et al., "Electro-optic properties of thiol-ene polymer stabilized ferroelectric liquid crystals", Liquid Crystals, vol. 30, No. 11, Nov. 2003, pp. 1343-1350.

(56) References Cited

OTHER PUBLICATIONS

Bergkvist, "Biospeckle-based Study of the Line Profile of Light Scattered in Strawberries", Master Thesis, Lund Reports on Atomic Physics, LRAP-220, Lund 1997, pp. 1-62.
Bernards et al., "Nanoscale porosity in polymer films: fabrication and therapeutic applications", Soft Matter, Jan. 1, 2010, vol. 6, No. 8, pp. 1621-1631.
Bleha et al., "Binocular Holographic Waveguide Visor Display", SID Symposium Digest of Technical Papers, Holoeye Systems Inc., Jun. 2014, San Diego, CA, 4 pgs.
Bleha et al., "D-ILA Technology For High Resolution Projection Displays", Sep. 10, 2003, Proceedings, vol. 5080, doi: 10.1117/12.497532, 11 pgs.
Bone, "Design Obstacles for LCOS Displays in Projection Applications "Optics architectures for LCOS are still evolving"", Aurora Systems Inc., Bay Area SID Seminar, Mar. 27, 2001, 22 pgs.
Born et al., "Optics of Crystals", Principles of Optics 5th Edition 1975, pp. 705-707.
Bourzac, "Magic Leap Needs to Engineer a Miracle", Intelligent Machines, Jun. 11, 2015, 7 pgs.
Bowen et al., "Optimisation of interdigitated electrodes for piezoelectric actuators and active fibre composites", J Electroceram, Jul. 2006, vol. 16, pp. 263-269, DOI 10.1007/s10832-006-9862-8.
Bowley et al., "Variable-wavelength switchable Bragg gratings formed in polymer-dispersed liquid crystals", Applied Physics Letters, Jul. 2, 2001, vol. 79, No. 1, pp. 9-11.
Liu et al., "Holographic Polymer-Dispersed Liquid Crystals: Materials, Formation, and Applications", Advances in OptoElectronics, Nov. 30, 2008, vol. 2008, Article ID 684349, 52 pgs.
Lorek, "Experts Say Mass Adoption of augmented and Virtual Reality is Many Years Away", Siliconhills, Sep. 9, 2017, 4 pgs.
Lowenthal et al., "Speckle Removal by a Slowly Moving Diffuser Associated with a Motionless Diffuser", Journal of the Optical Society of America, Jul. 1971, vol. 61, No. 7, pp. 847-851.
Lu et al., "Polarization switch using thick holographic polymer-dispersed liquid crystal grating", Journal of Applied Physics, Feb. 1, 2004, vol. 95, No. 3, pp. 810-815.
Lu et al., "The Mechanism of electric-field-induced segregation of additives in a Tiquid-crystal host", Phys Rev E Stat Nonlin Soft Matter Phys., Nov. 27, 2012, 14 pgs.
Ma et al., "Holographic Reversed-Mode Polymer-Stabilized Liquid Crystal Grating", Chinese Phys. Lett., 2005, vol. 22, No. 1, pp. 103-106.
Mach et al., "Switchable Bragg diffraction from liquid crystal in colloid-templated structures", Europhysics Letters, Jun. 1, 2002, vol. 58, No. 5, pp. 679-685.
Magarinos et al., "Wide Angle Color Holographic infinity optics display", Air Force Systems Command, Brooks Air Force Base, Texas, AFHRL-TR-80-53, Mar. 1981, 100 pgs.
Marino et al., "Dynamical Behaviour of Policryps Gratings", Electronic-Liquid Crystal Communications, Feb. 5, 2004, 10 pgs.
Massenot et al., "Multiplexed holographic transmission gratings recorded in holographic polymer-dispersed liquid crystals: static and dynamic studies", Applied Optics, 2005, vol. 44, Issue 25, pp. 5273-5280.
Matay et al., "Planarization of Microelectronic Structures by Using Polyimides", Journal of Electrical Engineering, 2002, vol. 53, No. 3-4, pp. 86-90.
Mathews, "The LED FAQ Pages", Jan. 31, 2002, 23 pgs.
Matic, "Blazed phase liquid crystal beam steering", Proc. of the SPIE, 1994, vol. 2120, pp. 194-205.
McLeod, "Axicons and Their Uses", Journal of the Optical Society of America, Feb. 1960, vol. 50, No. 2, pp. 166-169.
McManamon et al., "A Review of Phased Array Steering for Narrow-Band Electrooptical Systems", Proceedings of the IEEE, Jun. 2009, vol. 97, No. 6, pp. 1078-1096.
McManamon et al., "Optical Phased Array Technology", Proceedings of the IEEE, Feb. 1996, vol. 84, Issue 2, pp. 268-298.

Miller, "Coupled Wave Theory and Waveguide Applications", The Bell System Technical Journal, Short Hills, NJ, Feb. 2, 1954, 166 pgs.
Moffitt, "Head-Mounted Display Image Configurations", retrieved from the internet on Dec. 19, 2014, dated May 2008, 25 pgs.
Nair et al., "Enhanced Two-Stage Reactive Polymer Network Forming Systems", Polymer (Guildf). May 25, 2012, vol. 53, No. 12, pp. 2429-2434, doi:10.1016/j.polymer.2012.04.007.
Nair et al., "Two-Stage Reactive Polymer Network Forming Systems", Advanced Functional Materials, 2012, pp. 1-9, DOI: 10.1002/adfm.201102742.
Naqvi et al., "Concentration-dependent toxicity of iron oxide nanoparticles mediated by increased oxidative stress", International Journal of Nanomedicine, Dovepress, Nov. 13, 2010, vol. 5, pp. 983-989.
Natarajan et al., "Electro Optical Switching Characteristics of Volume Holograms in Polymer Dispersed Liquid Crystals", Journal of Nonlinear Optical Physics and Materials, 1997, vol. 5, No. 1, pp. 666-668.
Natarajan et al., "Electro-Optical Switching Characteristics of Volume Holograms in Polymer Dispersed Liquid Crystals", J. of Nonlinear Optical Physics Materials, Jan. 1996, vol. 5, No. 1, pp. 89-98.
Natarajan et al., "Holographic polymer dispersed liquid crystal reflection gratings formed by visible light initiated thiol-ene photopolymerization", Polymer, vol. 47, May 8, 2006, pp. 4411-4420.
Naydenova et al., "Low-scattering Volume Holographic Material", DIT PhD Project, http://www.dit.ie/ieo/, Oct. 2017, 2 pgs.
Neipp et al., "Non-local polymerization driven diffusion based model: general dependence of the polymerization rate to the exposure intensity", Optics Express, Aug. 11, 2003, vol. 11, No. 16, pp. 1876-1886.
Nishikawa et al., "Mechanically and Light Induced Anchoring of Liquid Crystal on Polyimide Film", Mol. Cryst. Liq. Cryst., Aug. 1999, vol. 329, 8 pgs.
Nishikawa et al., "Mechanism of Unidirectional Liquid-Crystal Alignment on Polyimides with Linearly Polarized Ultraviolet Light Exposure", Applied Physics Letters, May 11, 1998, vol. 72, No. 19, 4 pgs.
Nordin G et al., "Diffraction Properties of Stratified Volume Holographic Optical Elements", Journal of the Optical Society of America A., vol. 9, No. 12, Dec. 1992, pp. 2206-2217.
Oh et al., "Achromatic diffraction from polarization gratings with high efficiency", Optic Letters, Oct. 15, 2008, vol. 33, No. 20, pp. 2287-2289.
Olson et al., "Templating Nanoporous Polymers with Ordered Block Copolymers", Chemistry of Materials, Web publication Nov. 27, 2007, vol. 20, pp. 869-890.
Ondax, Inc., "Volume Holographic Gratings (VHG)", 2005, 7 pgs.
Orcutt, "Coming Soon: Smart Glasses That Look Like Regular Spectacles", Intelligent Machines, Jan. 9, 2014, 4 pgs.
Osredkar, "A study of the limits of spin-on-glass planarization process", Informacije MIDEM, 2001, vol. 31, 2, ISSN0352-9045, pp. 102-105.
Osredkar et al., "Planarization methods in IC fabrication technologies", Informacije MIDEM, 2002, vol. 32, 3, ISSN0352-9045, 5 pgs.
Ou et al., "A Simple LCOS Optical System (Late News)", Industrial Technology Research Institute/OES Lab. Q100/Q200, SID 2002, Boston, USA, 2 pgs.
Paolini et al., "High-Power LED Illuminators in Projection Displays", Lumileds, Aug. 7, 2001, 19 pgs.
Park et al., "Aligned Single-Wall Carbon Nanotube Polymer Composites Using an Electric Field", Journal of Polymer Science: Part B: Polymer Physics, Mar. 24, 2006, DOI 10.1002/polb.20823, pp. 1751-1762.
Park et al., "Fabrication of Reflective Holographic Gratings with Polyurethane Acrylates (PUA)", Current Applied Physics, Jun. 2002, vol. 2, pp. 249-252.
Plawsky et al., "Engineered nanoporous and nanostructured films", MaterialsToday, Jun. 2009, vol. 12, No. 6, pp. 36-45.

(56) References Cited

OTHER PUBLICATIONS

Potenza, "These smart glasses automatically focus on what you're looking at", The Verge, Voc Media, Inc., Jan. 29, 2017, https://www.theverge.com/2017/1/29/14403924/smart-glasses-automatic-focus-presbyopia-ces-2017, 6 pgs.
Presnyakov et al., "Electrically tunable polymer stabilized liquid-crystal Tens", Journal of Applied Physics, Apr. 29, 2005, vol. 97, p. 103101-1-103101-6.
Qi et al., "P-111: Reflective Display Based on Total Internal Reflection and Grating-Grating Coupling", Society for Information Display Digest, May 2003, pp. 648-651, DOI: 10.1889/1.1832359.
Ramón, "Formation of 3D micro- and nanostructures using liquid crystals as a template", Technische Universiteit Eindhoven, Apr. 17, 2008, Thesis, DOI:http://dx.doi.org/10.6100/IR634422, 117 pgs.
Ramsey, "Holographic Patterning of Polymer Dispersed Liquid Crystal Materials for Diffractive Optical Elements", Thesis, The University of Texas at Arlington, Dec. 2006, 166 pgs.
Ramsey et al., "Holographically recorded reverse-mode transmission gratings in polymer-dispersed liquid crystal cells", Applied Physics B: Laser and Optics, Sep. 10, 2008, vol. 93, Nos. 2-3, pp. 481-489.
Reid, "Thin film silica nanocomposites for anti-reflection coatings", Oxford Advance Surfaces, www.oxfordsurfaces.com, Oct. 18, 2012, 23 pgs.
Riechert, "Speckle Reduction in Projection Systems", Dissertation, University Karlsruhe, 2009, 178 pgs.
Rossi et al., "Diffractive Optical Elements for Passive Infrared Detectors", Submitted to OSA Topical Meeting "Diffractive Optics and Micro-Optics", Quebec, Jun. 18-22, 2000, 3 pgs.
Sagan et al., "Electrically Switchable Bragg Grating Technology for Projection Displays", Proc. SPIE. vol 4294, Jan. 24, 2001, pp. 75-83.
Saleh et al., "Fourier Optics : 4.1 Propagation of light in free space, 4.2 Optical Fourier Transform, 4.3 Diffraction of Light, 4.4 Image Formation, 4.5 Holography", Fundamentals of Photonics 1991, Chapter 4, pp. 108-143.
Saraswat, "Deposition & Planarization", EE 311 Notes, Aug. 29, 2017, 28 pgs.
Schechter et al., "Compact beam expander with lineargratings", Applied Optics, vol. 41, No. 7, Mar. 1, 2002, pp. 1236-1240.
Schreiber et al., "Laser display with single-mirror MEMS scanner", Journal of the SID 17/7, 2009, pp. 591-595.
Seiberle et al., "Photo-aligned anisotropic optical thin films", Journal of the SID 12/1, 2004, 6 pgs.
Serebriakov et al., "Correction of the phase retardation caused by intrinsic birefringence in deep UV lithography", Proc. of SPIE, May 21, 2010, vol. 5754, pp. 1780-1791.
Shi et al., "Design considerations for high efficiency liquid crystal decentered microlens arrays for steering light", Applied Optics, vol. 49, No. 3, Jan. 20, 2010, pp. 409-421.
Shriyan et al., "Analysis of effects of oxidized multiwalled carbon nanotubes on electro-optic polymer/liquid crystal thin film gratings", Optics Express, Nov. 12, 2010, vol. 18, No. 24, p. 24842-24852.
Extended European Search Report for EP Application No. 13192383, dated Apr. 2, 2014, 7 pgs.
Extended European Search Report for European Application No. 13765610.4 dated Feb. 16, 2016, 6 pgs.
Extended European Search Report for European Application No. 15187491.4, search completed Jan. 15, 2016, dated Jan. 28, 2016, 5 pgs.
International Preliminary Report on Patentability for International Application No. PCT/GB2010/000835, dated Nov. 1, 2011, dated Nov. 10, 2011, 9 pgs.
International Preliminary Report on Patentability for International Application No. PCT/GB2010/001920, dated Apr. 11, 2012, dated Apr. 19, 2012, 10 pgs.
International Preliminary Report on Patentability for International Application No. PCT/GB2010/001982, report dated May 1, 2012, dated May 10, 2012, 7 pgs.
International Preliminary Report on Patentability for International Application No. PCT/GB2013/000273, dated Dec. 23, 2014, dated Dec. 31, 2014, 8 pgs.
International Preliminary Report on Patentability for International Application No. PCT/GB2015/000203, dated Mar. 21, 2017, dated Mar. 30, 2017, 8 pgs.
International Preliminary Report on Patentability for International Application No. PCT/GB2016/000036, dated Aug. 29, 2017, dated Sep. 8, 2017, 8 pgs.
International Preliminary Report on Patentability for International Application No. PCT/GB2016/000065, dated Oct. 3, 2017, dated Oct. 12, 2017, 8 pgs.
International Preliminary Report on Patentability for International Application PCT/US2018/015553, Report dated Jun. 4, 2019, dated Jun. 13, 2019, 6 pgs.
International Preliminary Report on Patentability for International Application PCT/GB2009/051676, dated Jun. 14, 2011, dated Jun. 23, 2011, 6 pgs.
International Preliminary Report on Patentability for International Application PCT/GB2011/000349, dated Sep. 18, 2012, dated Sep. 27, 2012, 10 pgs.
International Preliminary Report on Patentability for International Application PCT/GB2012/000331, dated Oct. 8, 2013, dated Oct. 17, 2013, 8 pgs.
International Preliminary Report on Patentability for International Application PCT/GB2012/000677, dated Feb. 25, 2014, dated Mar. 6, 2014, 5 pgs.
International Preliminary Report on Patentability for International Application PCT/GB2013/000005, dated Jul. 8, 2014, dated Jul. 17, 2014, 12 pgs.
International Preliminary Report on Patentability for International Application PCT/GB2014/000295, dated Feb. 2, 2016, dated Feb. 11, 2016, 4 pgs.
International Preliminary Report on Patentability for International Application PCT/GB2015/000225, dated Feb. 14, 2017, dated Feb. 23, 2017, 8 pgs.
International Preliminary Report on Patentability for International Application PCT/GB2015/000228, dated Feb. 14, 2017, dated Feb. 23, 2017, 11 pgs.
International Preliminary Report on Patentability for International application PCT/GB2015/000274, dated Mar. 28, 2017, dated Apr. 6, 2017, 8 pgs.
International Preliminary Report on Patentability for International Application PCT/GB2016/000014, dated Jul. 25, 2017, dated Aug. 3, 2017, 7 pgs.
International Preliminary Report on Patentability for International Application PCT/GB2017/000055, dated Oct. 16, 2018, dated Oct. 25, 2018, 9 pgs.
International Preliminary Report on Patentability for International Application PCT/US2014/011736, dated Jul. 21, 2015, dated Jul. 30, 2015, 9 pgs.
International Preliminary Report on Patentability for International Application PCT/US2016/017091, dated Aug. 15, 2017, dated Aug. 24, 2017, 5 pgs.
Bronnikov et al., "Polymer-Dispersed Liquid Crystals: Progress in Preparation, Investigation and Application", Journal of Macromolecular Science Part B, published online Sep. 30, 2013, vol. 52, pp. 1718-1738.
Brown, "Waveguide Displays", Rockwell Collins, 2015, 11 pgs.
Bruzzone et al., "Compact, high-brightness LED illumination for projection systems", Journal of the SID 17/12, Dec. 2009, pp. 1043-1049.
Buckley, "Colour holographic laser projection technology for heads-up and instrument cluster displays", Conference: Proc. SID Conference 14th Annual Symposium on Vehicle Displays, Jan. 2007, 5 pgs.
Buckley, "Pixtronix DMS technology for head-up displays", Pixtronix, Inc., Jan. 2011, 4 pgs.
Buckley et al., "Full colour holographic laser projector HUD", Light Blue Optics Ltd., Aug. 10, 2015, 5 pgs.
Buckley et al., "Rear-view virtual image displays", in Proc. SID Conference 16th Annual Symposium on Vehicle Displays, Jan. 2009, 5 pgs.

(56) References Cited

OTHER PUBLICATIONS

Bunning et al., "Effect of gel-point versus conversion on the real-time dynamics of holographic polymer-dispersed liquid crystal (HPDLC) formation", Proceedings of SPIE—vol. 5213, Liquid Crystals VII, Iam-Choon Khoo, Editor, Dec. 2003, pp. 123-129.
Bunning et al., "Electro-optical photonic crystals formed in H-PDLCs by thiol-ene photopolymerization", American Physical Society, Annual APS, Mar. 3-7, 2003, abstract #R1.135.
Bunning et al., "Holographic Polymer-Dispersed Liquid Crystals (H-PDLCs)1", Annu. Rev. Mater. Sci., 2000, vol. 30, pp. 83-115.
Bunning et al., "Morphology of Anisotropic Polymer Dispersed Liquid Crystals and the Effect of Monomer Functionality", Polymer Science: Part B: Polymer Physics, Jul. 30, 1997, vol. 35, pp. 2825-2833.
Busbee et al., "$SiO_2$ Nanoparticle Sequestration via Reactive Functionalization in Holographic Polymer-Dispersed Liquid Crystals", Advanced Materials, Sep. 2009, vol. 21, pp. 3659-3662.
Butler et al., "Diffractive Properties of Highly Birefringent vol. Gratings Investigation", Journal of Optical Society of America, Feb. 2002, vol. 19, No. 2, pp. 183-189.
Cai et al., "Recent advances in antireflective surfaces based on nanostructure arrays", Mater. Horiz., 2015, vol. 2, pp. 37-53.
Cameron, "Optical Waveguide Technology & Its Application in Head Mounted Displays", Proc. of SPIE, May 22, 2012, vol. 8383, p. 83830E-1-83830E-11.
Cameron, "The Application of Holographic Optical Waveguide Technology to Q-Sight™ Family of Helmet Mounted Displays", Proc. of SPIE, 2009, 11 pages, vol. 7326.
Caputo et al., "POLICRYPS Composite Materials: Features and Applications", Advances in Composite Materials—Analysis of Natural and Man-Made Materials, www.intechopen.com, Sep. 2011, pp. 93-118.
Caputo et al., "POLICRYPS Switchable Holographic Grating: A Promising Grating Electro-Optical Pixel for High Resolution Display Application", Journal of Display Technology, Mar. 2006, vol. 2, No. 1, pp. 38-51.
Carclo Optics, "Guide to choosing secondary optics", Carclo Optics, Dec. 15, 2014, www.carclo-optics.com, 48 pgs.
Chen et al., "Polarization rotators fabricated by thermally-switched liquid crystal alignments based on rubbed poly(N-vinyl carbazole) films", Optics Express, Apr. 11, 2011, vol. 19, No. 8, pp. 7553-7558.
Cheng et al., "Design of an ultra-thin near-eye display with geometrical waveguide and freeform optics", Optics Express, Aug. 2014, 16 pgs.
Chi et al., "Ultralow-refractive-index optical thin films through nanoscale etching of ordered mesoporous silica films", Optic Letters, May 1, 2012, vol. 37, No. 9, pp. 1406-1408.
Chigrinov et al., "Photo-aligning by azo-dyes: Physics and applications", Liquid Crystals Today, Sep. 6, 2006, http://www.tandfonline.com/action/journalInformation?journalCode=tlcy20, 15 pgs.
Cho et al., "Electro-optic Properties of $CO_2$ Fixed Polymer/Nematic LC Composite Films", Journal of Applied Polymer Science, Novembers, 2000, vol. 81, Issue 11, pp. 2744-2753.
Cho et al., "Optimization of Holographic Polymer Dispersed Liquid Crystals for Ternary Monomers", Polymer International, Nov. 1999, vol. 4 8, pp. 1085-1090.
Colegrove et al., "P-59: Technology of Stacking HPDLC for Higher Reflectance", SID 00 DIGEST, May 2000, pp. 770-773.
Crawford, "Electrically Switchable Bragg Gratings", Optics & Photonics News, pp. 54-59, Apr. 2003.
Cruz-Arreola et al., "Diffraction of beams by infinite or finite amplitudephase gratings", Investigacio' N Revista Mexicana De Fi'Sica, Feb. 2011, vol. 57, No. 1, pp. 6-16.
Dabrowski, "High Birefringence Liquid Crystals", Crystals, Sep. 3, 2013, vol. 3, No. 3, pp. 443-482.
Dainty, "Some statistical properties of random speckle patterns in coherent and partially coherent illumination", Optica Acta, Mar. 12, 1970, vol. 17, No. 10, pp. 761-772.

Date, "Alignment Control in Holographic Polymer Dispersed Liquid Crystal", Journal of Photopolymer Science and Technology, Nov. 2, 2000, vol. 13, pp. 289-284.
Date et al., "52.3: Direct-viewing Display Using Alignment-controlled PDLC and Holographic PDLC", Society for Information Display Digest, May 2000, pp. 1184-1187, DOI: 10.1889/1.1832877.
Date et al., "Full-color reflective display device using holographically fabricated polymer-dispersed liquid crystal (HPDLC)", Journal of the SID, 1999, vol. 7, No. 1, pp. 17-22.
De Bitetto, "White light viewing of surface holograms by simple dispersion compensation", Applied Physics Letters, Dec. 15, 1966, vol. 9, No. 12, pp. 417-418.
Developer World, "Create customized augmented reality solutions", printed Oct. 19, 2017, LMX-001 holographic waveguide display, Sony Developer World, 3 pgs.
Dhar et al., "Recording media that exhibit high dynamic range for digital holographic data storage", Optics Letters, Apr. 1, 1999, vol. 24, No. 7, pp. 487-489.
Domash et al., "Applications of switchable Polaroid holograms", SPIE Proceedings, vol. 2152, Diffractive and Holographic Optics Technology, Jan. 23-29, 1994, Los Angeles, CA, pp. 127-138, ISBN: 0-8194-1447-6.
Drake et al., "Waveguide Hologram Fingerprint Entry Device", Optical Engineering, Sep. 1996, vol. 35, No. 9, pp. 2499-2505.
Drevensek-Olenik et al., "In-Plane Switching of Holographic Polymer-Dispersed Liquid Crystal Transmission Gratings", Mol. Cryst. Liq. Cryst., 2008, vol. 495, p. 177/[529]-185/[537].
Drevensek-Olenik et al., "Optical diffraction gratings from polymer-dispersed liquid crystals switched by interdigitated electrodes", Journal of Applied Physics, Dec. 1, 2004, vol. 96, No. 11, pp. 6207-6212.
Ducharme, "Microlens diffusers for efficient laser speckle generation", Optics Express, Oct. 29, 2007, vol. 15, No. 22, p. 14573-14579.
Duong et al., "Centrifugal Deposition of Iron Oxide Magnetic Nanorods for Hyperthermia Application", Journal of Thermal Engineering, Yildiz Technical University Press, Istanbul, Turkey, Apr. 2015, vol. 1, No. 2, pp. 99-103.
Fattal et al., "A multi directional backlight for a wide-angle glasses-free three-dimensional display", Nature, Mar. 21, 2012, vol. 495, pp. 348-351.
Fontecchio et al., "Spatially Pixelated Reflective Arrays from Holographic Polymer Dispersed Liquid Crystals", SID 00 Digest, May 2000, pp. 774-776.
Forman et al., "Materials development for PhotoINhibited Super-Resolution (PINSR) lithography", Proc. of SPIE, 2012, vol. 8249, 824904, doi: 10.1117/12.908512, p. 824904-1-824904-9.
Forman et al., "Radical diffusion limits to photoinhibited super-resolution lithography", Phys.Chem. Chem. Phys., May 31, 2013, vol. 15, pp. 14862-14867.
Friedrich-Schiller, "Spatial Noise and Speckle", Version 1.12.2011, Dec. 2011, Abbe School of Photonics, Jena, Germany, 27 pgs.
Fujii et al., "Nanoparticle-polymer-composite vol. gratings incorporating chain-transfer agents for holography and slow-neutron optics", Optics Letters, Apr. 25, 2014, vol. 39, Issue 12, 5 pgs.
Funayama et al., "Proposal of a new type thin film light-waveguide display device using", The International Conference on Electrical Engineering, 2008, No. P-044, 5 pgs.
Gabor, "Laser Speckle and its Elimination", BM Research and Development, Eliminating Speckle Noise, Sep. 1970, vol. 14, No. 5, pp. 509-514.
Gardiner et al., "Bistable liquid-crystals reduce power consumption for high-efficiency smart glazing", SPIE, 2009, 10.1117/2.1200904.1596, 2 pgs.
Giancola, "Holographic Diffuser, Makes Light Work of Screen Tests", Photonics Spectra, 1996, vol. 30, No. 8, pp. 121-122.
Goodman, "Some fundamental properties of speckle", J. Opt. Soc. Am., Nov. 1976, vol. 66, No. 11, pp. 1145-1150.
Goodman, "Statistical Properties of Laser Speckle Patterns", Applied Physics, 1975, vol. 9, Chapter 2, Laser Speckle and Related Phenomena, pp. 9-75.

(56) References Cited

OTHER PUBLICATIONS

Goodman et al., "Speckle Reduction by a Moving Diffuser in Laser Projection Displays", The Optical Society of America, 2000, 15 pgs.
Guldin et al., "Self-Cleaning Antireflective Optical Coatings", Nano Letters, Oct. 14, 2013, vol. 13, pp. 5329-5335.
Guo et al., "Review Article: A Review of the Optimisation of Photopolymer Materials for Holographic Data Storage", Physics Research International, vol. 2012, Article ID 803439, Academic Editor: Sergi Gallego, 16 pages, http://dx.doi.org/10.1155/2012/803439, May 4, 2012.
Han et al., "Study of Holographic Waveguide Display System", Advanced Photonics for Communications, 2014, 4 pgs.
International Preliminary Report on Patentability for International Application PCT/US2018/012691, Report dated Jul. 9, 2019, dated Jul. 18, 2019, 10 pgs.
International Preliminary Report on Patentability for International Application PCT/GB2017/000040, Report dated Sep. 25, 2018, dated Oct. 4, 2018, 7 pgs.
International Preliminary Report on Patentability for PCT Application No. PCT/US2013/038070, dated Oct. 28, 2014, 6 pgs.
International Search Report and Written Opinion for International Application No. PCT/US2019/031163, completed Jul. 9, 2019, dated Jul. 29, 2019, 11 pgs.
International Search Report and Written Opinion for International Application No. PCT/GB2010/000835, completed Oct. 26, 2010, dated Nov. 8, 2010, 12 pgs.
International Search Report and Written Opinion for International Application No. PCT/GB2010/001920, completed Mar. 29, 2011, dated Apr. 6, 2011, 15 pgs.
International Search Report and Written Opinion for International Application No. PCT/GB2015/000228, completed May 4, 2011, dated Jul. 15, 2011, 15 pgs.
International Search Report and Written Opinion for International Application No. PCT/GB2016/000036, completed Jul. 4, 2016, dated Jul. 13, 2016, 10 pgs.
International Search Report and Written Opinion for International Application No. PCT/GB2016/000065, completed Jul. 14, 2016, dated Jul. 27, 2016, 10 pgs.
International Search Report and Written Opinion for International Application No. PCT/GB2017/000055, Search completed Jul. 19, 2017, dated Jul. 26, 2017, 12 pgs.
International Search Report and Written Opinion for International Application No. PCT/US2013/038070, completed Aug. 12, 2013, dated Aug. 14, 2013, 12 pgs.
International Search Report and Written Opinion for International Application No. PCT/US2014/011736, completed Apr. 18, 2014, dated May 8, 2014, 10 pgs.
International Search Report and Written Opinion for International Application No. PCT/US2018/012691, completed Mar. 10, 2018, dated Mar. 28, 2018, 16 pgs.
International Search Report and Written Opinion for International Application No. PCT/US2018/015553, completed Aug. 6, 2018, dated Sep. 19, 2018, 12 pgs.
International Search Report and Written Opinion for International Application No. PCT/US2018/037410, Search completed Aug. 16, 2018, dated Aug. 30, 2018, 11 pgs.
International Search Report and Written Opinion for International Application No. PCT/US2018/048636, Search completed Nov. 1, 2018, dated Nov. 15, 2018, 16 pgs.
International Search Report and Written Opinion for International Application No. PCT/US2018/056150, Search completed Dec. 4, 2018, dated Dec. 26, 2018, 10 pgs.
International Search Report and Written Opinion for International Application No. PCT/US2018/062835, Search completed Jan. 14, 2019, dated Jan. 31, 2019, 14 pgs.
International Search Report and Written Opinion for International Application No. PCT/US2019/012758, completed Mar. 12, 2019, dated Mar. 27, 2019, 9 pgs.
International Search Report and Written Opinion for International Application No. PCT/US2019/012764, completed Mar. 1, 2019, dated Mar. 18, 2019, 9 pgs.
International Search Report and Written Opinion for International Application No. PCT/US2018/048960, Search completed Dec. 14, 2018, dated Jan. 8, 2019, 14 pgs.
International Search Report and Written Opinion for International Application PCT/GB2009/051676, completed May 10, 2010, Dated May 18, 2010, 7 pgs.
International Search Report and Written Opinion for International Application PCT/GB2016/000181, completed Dec. 21, 2016, dated Feb. 27, 2017, 21 pgs.
International Search Report and Written Opinion for International Application PCT/US2016/017091, completed by the European Patent Office on Apr. 20, 2016, 7 pgs.
International Search Report and Written Opinion for International Application PCT/US2019/012759, completed Mar. 14, 2019, dated Apr. 15, 2019, 12 pgs.
International Search Report for International Application No. PCT/GB2014/000295, completed Nov. 18, 2014, dated Jan. 5, 2015, 4 pgs.
International Search Report for International Application PCT/GB2017/000040, dated Jul. 18, 2017, completed Jul. 10, 2017, 3 pgs.
International Search Report for PCT/GB2010/001982, completed by the European Patent Office on Feb. 24, 2011, 4 pgs.
International Search Report for PCT/GB2011/000349, completed by the European Patent Office on Aug. 17, 2011, 4 pgs.
International Search Report for PCT/GB2012/000331, completed by the European Patent Office on Aug. 29, 2012, 4 pgs.
International Search Report for PCT/GB2012/000677, completed by the European Patent Office on Dec. 10, 2012, 4 pgs.
International Search Report for PCT/GB2013/000005, completed by the European Patent Office on Jul. 16, 2013, 3 pgs.
International Search Report for PCT/GB2013/000273, completed by the European Patent Office on Aug. 30, 2013, 4 pgs.
International Search Report for PCT/GB2015/000203, completed by the European Patent Office on Oct. 9, 2015, 4 pgs.
International Search Report for PCT/GB2015/000225, completed by the European Patent Office on Nov. 10, 2015, dated Dec. 2, 2016, 5 pgs.
International Search Report for PCT/GB2015/000274, completed by the European Patent Office on Jan. 7, 2016, 4 pgs.
International Search Report for PCT/GB2016/000014, completed by the European Patent Office on Jun. 27, 2016, 4 pgs.
Written Opinion for International Application No. PCT/GB2010/001982, search completed Feb. 24, 2011, dated Mar. 8, 2011, 6 pgs.
Written Opinion for International Application No. PCT/GB2011/000349, completed Aug. 17, 2011, dated Aug. 25, 2011, 9 pgs.
Written Opinion for International Application No. PCT/GB2012/000331, completed Aug. 29, 2012, dated Sep. 6, 2012, 7 pgs.
Written Opinion for International Application No. PCT/GB2012/000677, completed Dec. 10, 2012, dated Dec. 17, 2012, 4 pgs.
Written Opinion for International Application No. PCT/GB2013/000005, search completed Jul. 16, 2013, dated Jul. 24, 2013, 11 pgs.
Written Opinion for International Application No. PCT/GB2013/000273, completed Aug. 30, 2013, dated Sep. 9, 2013, 7 pgs.
Written Opinion for International Application No. PCT/GB2014/000295, search completed Nov. 18, 2014, dated Jan. 5, 2015, 3 pgs.
Written Opinion for International Application No. PCT/GB2015/000203, completed Oct. 29, 2015, dated Nov. 16, 2015, 7 pgs.
Written Opinion for International Application No. PCT/GB2015/000225, search completed Nov. 10, 2015, dated Feb. 4, 2016, 7 pgs.
Written Opinion for International Application No. PCT/GB2015/000274, search completed Jan. 7, 2016, dated Jan. 19, 2016, 7 pgs.
Written Opinion for International Application No. PCT/GB2016/000014, search completed Jun. 27, 2016, dated Jul. 7, 2016, 6 pgs.
Written Opinion for International Application No. PCT/GB2016/000051, Search completed Aug. 11, 2016, dated Aug. 22, 2016, 6 pgs.
Written Opinion for International Application No. PCT/GB2017/000040, search completed Jul. 10, 2017, dated Jul. 18, 2017, 6 pgs.

(56) References Cited

OTHER PUBLICATIONS

Written Opinion for International Application PCT/GB2016/000003, completed May 31, 2016, dated Aug. 12, 2016, 10 pgs.
"Agilent ADNS-2051 Optical Mouse Sensor: Data Sheet", Agilent Technologies, Jan. 9, 2002, 40 pgs.
"Application Note—MOXTEK ProFlux Polarizer use with LCOS displays", CRL Opto Limited, http://www.crlopto.com, 2003, 6 pgs.
"Application Note AN 16: Optical Considerations for Bridgelux LED Arrays", BridgeLux, Jul. 31, 2010, 23 pgs.
"Application Note: Variable Attenuator for Lasers", Technology and Applications Center, Newport Corporation, www.newport.com, 2006, DS-08067, 6 pgs.
"Bae Systems to Unveil Q-Sight Family of Helmet-Mounted Display at AUSA Symposium", Released on Tuesday, Oct. 9, 2007, 1 pg.
"Beam Steering Using Liquid Crystals", Boulder Nonlinear Systems, Inc., info@bnonlinear.com, May 8, 2001, 4 pgs.
"BragGrate—Deflector: Transmitting Volume Bragg Grating for angular selection and magnification", 2015, www.OptiGrate.com.
Harbers et al., "1-15.3: LED Backlighting for LCD-HDTV", Journal of the Society for Information Display, 2002, vol. 10, No. 4, pp. 347-350.
Harbers et al., "Performance of High Power LED Illuminators in Color Sequential Projection Displays", Lumileds Lighting, 2007, 4 pgs.
Harbers et al., "Performance of High Power LED Illuminators in Color Sequential Projection Displays", Lumileds, Aug. 7, 2001, 11 pgs.
Harbers et al., "Performance of High-Power LED illuminators in Projection Displays", Proc. Int. Disp. Workshops, Japan. vol. 10, pp. 1585-1588, 2003.
Harding et al., "Reactive Liquid Crystal Materials for Optically Anisotropic Patterned Retarders", Merck, licrivue, 2008, ME-GR-RH-08-010, 20 pgs.
Harding et al., "Reactive Liquid Crystal Materials for Optically Anisotropic Patterned Retarders", SPIE Lithography Asia—Taiwan, 2008, Proceedings vol. 7140, Lithography Asia 2008; 71402J, doi: 10.1117/12.805378.
Hariharan, "Optical Holography: Principles, techniques and applications", Cambridge University Press, 1996, pp. 231-233.
Harris, "Photonic Devices", EE 216 Principals and Models of Semiconductor Devices, Autumn 2002, 20 pgs.
Harrold et al., "3D Display Systems Hardware Research at Sharp Laboratories of Europe: an update", Sharp Laboratories of Europe, Ltd., 7 pgs.
Harthong et al., "Speckle phase averaging in high-resolution color holography", J. Opt. Soc. Am. A, Feb. 1997, vol. 14, No. 2, pp. 405-409.
Hasan et al., "Tunable-focus lens for adaptive eyeglasses", Optics Express, Jan. 23, 2017, vol. 25, No. 2, 1221, 13 pgs.
Hasman et al., "Diffractive Optics: Design, Realization, and Applications", Fiber and Integrated Optics, vol. 16, pp. 1-25, 1997.
Hata et al., "Holographic nanoparticle-polymer composites based on stepgrowth thiol-ene photopolymerization", Optical Materials Express, Jun. 1, 2011, vol. 1, No. 2, pp. 207-222.
He et al., "Dynamics of peristrophic multiplexing in holographic polymer-dispersed liquid crystal", Liquid Crystals, Mar. 26, 2014, vol. 41, No. 5, pp. 673-684.
He et al., "Holographic 3D display based on polymer-dispersed liquid-crystal thin films", Proceedings of China Display/Asia Display 2011, pp. 158-160.
He et al., "Properties of Volume Holograms Recording in Photopolymer Films with Various Pulse Exposures Repetition Frequencies", Proceedings of SPIE vol. 5636, Bellingham, WA, 2005, doi: 10.1117/12.580978, pp. 842-848.
Herman et al., "Production and Uses of Diffractionless Beams", J. Opt. Soc. Am. A., Jun. 1991, vol. 8, No. 6, pp. 932-942.
Hisano, "Alignment layer-free molecular ordering induced by masked photopolymerization with nonpolarized light", Appl. Phys. Express 9, Jun. 6, 2016, p. 072601-1-072601-4.
Hoepfner et al., "LED Front Projection Goes Mainstream", Luminus Devices, Inc., Projection Summit, 2008, 18 pgs.
Holmes et al., "Controlling the anisotropy of holographic polymer-dispersed liquid-crystal gratings", Physical Review E, Jun. 11, 2002, vol. 65, 066603-1-066603-4.
Hoyle et al., "Advances in the Polymerization of Thiol-Ene Formulations", Heraeus Noblelight Fusion UV Inc., 2003 Conference, 6 pgs.
Hua, "Sunglass-like displays become a reality with free-form optical technology", Illumination & Displays 3D Visualization and Imaging Systems Laboratory (3DVIS) College of Optical Sciences University of Arizona Tucson, AZ. 2014, 3 pgs.
Huang et al., "Diffraction properties of substrate guided-wave holograms", Optical Engineering, Oct. 1995, vol. 34, No. 10, pp. 2891-2899.
Huang et al., "Theory and characteristics of holographic polymer dispersed Tiquid crystal transmission grating with scaffolding morphology", Applied Optics, Jun. 20, 2012, vol. 51, No. 18, pp. 4013-4020.
Iannacchione et al., "Deuterium NMR and morphology study of copolymer-dispersed liquid-crystal Bragg gratings", Europhysics Letters, 1996, vol. 36, No. 6, pp. 425-430.
Irie, "Photochromic diarylethenes for photonic devices", Pure and Applied Chemistry, 1996, pp. 1367-1371, vol. 68, No. 7, IUPAC.
Jeng et al., "Aligning liquid crystal molecules", SPIE, 2012, 10.1117/2.1201203.004148, 2 pgs.
Jo et al., "Control of Liquid Crystal Pretilt Angle using Polymerization of Reactive Mesogen", IMID 2009 Digest, P1-25, 2009, pp. 604-606.
Juhl, "Interference Lithography for Optical Devices and Coatings", Dissertation, University of Illinois at Urbana-Champaign, 2010.
Juhl et al., "Holographically Directed Assembly of Polymer Nanocomposites", ACS Nano, Oct. 7, 2010, vol. 4, No. 10, pp. 5953-5961.
Jurbergs et al., "New recording materials for the holographic industry", Proc. of SPIE, 2009 vol. 7233, p. 72330K-1-72330L-10, doi: 10.1117/12.809579.
Kahn et al., "Private Line Reporton Large Area Display", Kahn International, Jan. 7, 2003, vol. 8, No. 10, 9 pgs.
Karasawa et al., "Effects of Material Systems on the Polarization Behavior of Holographic Polymer Dispersed Liquid Crystal Gratings", Japanese Journal of Applied Physics, Oct. 1997, vol. 36, No. 10, pp. 6388-6392.
Karp et al., "Planar micro-optic solar concentration using multiple imaging Tenses into a common slab waveguide", Proc, of SPIE vol. 7407, 2009 SPIE, CCC code: 0277-786X/09, doi: 10.1117/12.826531, p. 74070D-1-74070D-11.
Karp et al., "Planar micro-optic solar concentrator", Optics Express, Jan. 18, 2010, vol. 18, No. 2, pp. 1122-1133.
Kato et al., "Alignment-Controlled Holographic Polymer Dispersed Liquid Crystal (HPDLC) for Reflective Display Devices", SPIE, 1998, vol. 3297, pp. 52-57.
Kessler, "Optics of Near to Eye Displays (NEDs)", Oasis 2013, Tel Aviv, Feb. 19, 2013, 37 pgs.
Keuper et al., "26.1: RGB LED Illuminator for Pocket-Sized Projectors", SID 04 DIGEST, 2004, ISSN/0004-0966X/04/3502, pp. 943-945.
Keuper et al., "P-126: Ultra-Compact LED based Image Projector for Portable Applications", SID 03 DIGEST, 2003, ISSN/0003-0966X/03/3401-0713, pp. 713-715.
Kim et al., "Effect of Polymer Structure on the Morphology and Electro optic Properties of UV Curable PNLCs", Polymer, Feb. 2000, vol. 41, pp. 1325-1335.
Kim et al., "Enhancement of electro-optical properties in holographic polymer-dispersed liquid crystal films by incorporation of multiwalled carbon nanotubes into a polyurethane acrylate matrix", Polym. Int., Jun. 16, 2010, vol. 59, pp. 1289-1295.
Kim et al., "Fabrication of Reflective Holographic PDLC for Blue", Molecular Crystals and Liquid Crystals Science, 2001, vol. 368, pp. 3845-3853.
Kim et al., "Optimization of Holographic PDLC for Green", Mol. Cryst. Liq. Cryst, vol. 368, pp. 3855-3864, 2001.

(56) References Cited

OTHER PUBLICATIONS

Klein, "Optical Efficiency for Different Liquid Crystal Colour Displays", Digital Media Department, HPL-2000-83, Jun. 29, 2000, 18 pgs.
Kogelnik, "Coupled Wave Theory for Thick Hologram Gratings", The Bell System Technical Journal, vol. 48, No. 9, pp. 2909-2945, Nov. 1969.
Kotakonda et al., "Electro-optical Switching of the Holographic Polymer-dispersed Liquid Crystal Diffraction Gratings", Journal of Optics A: Pure and Applied Optics, Jan. 1, 2009, vol. 11, No. 2, 11 pgs.
Kress et al., "Diffractive and Holographic Optics as Optical Combiners in Head Mounted Displays", UbiComp '13, Sep. 9-12, 2013, Session Wearable Systems for Industrial Augmented Reality Applications, pp. 1479-1482.
Lauret et al., "Solving the Optics Equation for Effective LED Applications", Gaggione North America, LLFY System Design Workshop 2010, Oct. 28, 2010, 26 pgs.
Lee, "Patents Shows Widespread Augmented Reality Innovation", PatentVue, May 26, 2015, 5 pgs.
Levola, "Diffractive optics for virtual reality displays", Journal of the SID, 2006, 14/5, pp. 467-475.
Levola et al., "Near-to-eye display with diffractive exit pupil expander having chevron design", Journal of the SID, 2008, 16/8, pp. 857-862.
Levola et al., "Replicated slanted gratings with a high refractive index material for in and outcoupling of light", Optics Express, vol. 15, Issue 5, pp. 2067-2074 (2007).
Li et al., "Design and Optimization of Tapered Light Pipes", Proceedings vol. 5529, Nonimaging Optics and Efficient Illumination Systems, Sep. 29, 2004, doi: 10.1117/12.559844, 10 pgs.
Li et al., "Dual Paraboloid Reflector and Polarization Recycling Systems for Projection Display", Proceedings vol. 5002, Projection Displays IX, Mar. 28, 2003, doi: 10.1117/12.479585, 12 pgs.
Li et al., "Light Pipe Based Optical Train and its Applications", Proceedings vol. 5524, Novel Optical Systems Design and Optimization VII, Oct. 24, 2004, doi: 10.1117/12.559833, 10 pgs.
Li et al., "Novel Projection Engine with Dual Paraboloid Reflector and Polarization Recovery Systems", Wavien Inc., SPIE EI 5289-38, Jan. 21, 2004, 49 pgs.
Li et al., "Polymer crystallization/melting induced thermal switching in a series of holographically patterned Bragg reflectors", Soft Matter, Jul. 11, 2005, vol. 1, pp. 238-242.
Lin et al., "Ionic Liquids in Photopolymerizable Holographic Materials", in book Holograms—Recording Materials and Applications, Nov. 9, 2011, 21 pgs.
Simonite, "How Magic Leap's Augmented Reality Works", Intelligent Machines, Oct. 23, 2014, 7 pgs.
Smith et al., "RM-PLUS—Overview", Licrivue, Nov. 5, 2013, 16 pgs.
Sony Global, "Sony Releases the Transparent Lens Eyewear 'SmartEyeglass Developer Edition'", printed Oct. 19, 2017, Sony Global—News Releases, 5 pgs.
Steranka et al., "High-Power LEDs—Technology Status and Market Applications", Lumileds, Jul. 2002, 23 pgs.
Stumpe et al., "Active and Passive LC Based Polarization Elements", Mol. Cryst. Liq. Cryst., 2014, vol. 594: pp. 140-149.
Stumpe et al., "New type of polymer-LC electrically switchable diffractive devices—POLIPHEM", May 19, 2015, p. 97.
Subbarayappa et al., "Bistable Nematic Liquid Crystal Device", Jul. 30, 2009, 14 pgs.
Sun et al., "Effects of multiwalled carbon nanotube on holographic polymer dispersed liquid crystal", Polymers Advanced Technologies, Feb. 19, 2010, DOI: 10.1002/pat.1708, 8 pgs.
Sun et al., "Low-birefringence lens design for polarization sensitive optical systems", Proceedings of SPIE, 2006, vol. 6289, doi: 10.1117/12.679416, pp. 6289DH-1-6289DH-10.
Sun et al., "Transflective multiplexing of holographic polymer dispersed liquid crystal using Si additives", eXPRESS Polymer Letters, 2011, vol. 5, No. 1, pp. 73-81.

Sutherland et al., "Bragg Gratings in an Acrylate Polymer Consisting of Periodic Polymer- Dispersed Liquid-Crystal Planes", Chem. Mater., 1993, vol. 5, pp. 1533-1538.
Sutherland et al., "Electrically switchable vol. gratings in polymer-dispersed liquid crystals", Applied Physics Letters, Feb. 28, 1994, vol. 64, No. 9, pp. 1074-1076.
Sutherland et al., "Enhancing the electro-optical properties of liquid crystal nanodroplets for switchable Bragg gratings", Proc. of SPIE, 2008, vol. 7050, p. 705003-1-705003-9, doi: 10.1117/12.792629.
Sutherland et al., "Liquid crystal bragg gratings: dynamic optical elements for spatial light modulators", Hardened Materials Branch, Hardened Materials Branch, AFRL-ML-WP-TP-2007-514, Jan. 2007, Wright-Patterson Air Force Base, OH, 18 pgs.
Sutherland et al., "The physics of photopolymer liquid crystal composite holographic gratings", presented at SPIE: Diffractive and Holographic Optics Technology San Jose, CA, 1996, SPIE, vol. 2689, pp. 158-169.
Sweatt, "Achromatic triplet using holographic optical elements", Applied Optics, May 1977, vol. 16, No. 5, pp. 1390-1391.
Talukdar, "Technology Forecast: Augmented reality", Changing the economics of Smartglasses, Issue 2, 2016, 5 pgs.
Tao et al., "TiO2 nanocomposites with high refractive index and transparency", J. Mater. Chem., Oct. 4, 2011, vol. 21, p. 18623-18629.
Titus et al., "Efficient, Accurate Liquid Crystal Digital Light Deflector", Proc. SPIE 3633, Diffractive and Holographic Technologies, Systems, and Spatial Light Modulators VI, 1 Jun. 1, 1999, doi: 10.1117/12.349334, 10 pgs.
Tiziani, "Physical Properties of Speckles", Speckle Metrology, Chapter 2, Academic Press, Inc., 1978, pp. 5-9.
Tominaga et al., "Fabrication of holographic polymer dispersed liquid crystals doped with gold nanoparticles", 2010 Japanese Liquid Crystal Society Annual Meeting, 2 pgs.
Tomita, "Holographic assembly of nanoparticles in photopolymers for photonic applications", The International Society for Optical Engineering, SPIE Newsroom, 2006, 10.1117/2.1200612.0475, 3 pgs.
Trisnadi, "Hadamard Speckle Contrast Reduction", Optics Letters, Jan. 1, 2004, vol. 29, No. 1, pp. 11-13.
Trisnadi, "Speckle contrast reduction in laser projection displays", Proc. SPIE 4657, 2002, 7 pgs.
Tzeng et al., "Axially symmetric polarization converters based on photoaligned liquid crystal films", Optics Express, Mar. 17, 2008, vol. 16, No. 6, pp. 3768-3775.
Upatnieks et al., "Color Holograms for white light reconstruction", Applied Physics Letters, Jun. 1, 1996, vol. 8, No. 11, pp. 286-287.
Urey, "Diffractive exit pupil expander for display applications", Applied Optics, vol. 40, Issue 32, pp. 5840-5851 (2001).
Ushenko, "The Vector Structure of Laser Biospeckle Fields and Polarization Diagnostics of Collagen Skin Structures", Laser Physics, 2000, vol. 10, No. 5, pp. 1143-1149.
Valoriani, "Mixed Reality: Dalle demo a un prodotto", Disruptive Technologies Conference, Sep. 23, 2016, 67 pgs.
Van Gerwen et al., "Nanoscaled interdigitated electrode arrays for biochemical sensors", Sensors and Actuators, Mar. 3, 1998, vol. B 49, pp. 73-80.
Vecchi, "Studi Esr Di Sistemi Complessi Basati Su Cristalli Liquidi", Thesis, University of Bologna, Department of Physical and Inorganic Chemistry, 2004-2006, 110 pgs.
Veltri et al., "Model for the photoinduced formation of diffraction gratings in Tiquid-crystalline composite materials", Applied Physics Letters, May 3, 2004, vol. 84, No. 18, pp. 3492-3494.
Vita, "Switchable Bragg Gratings", Thesis, Universita degli Studi di Napoli Federico II, Nov. 2005, 103 pgs.
Vuzix, "M3000 Smart Glasses, Advanced Waveguide Optics", brochure, Jan. 1, 2017, 2 pgs.
Wang et al., "Liquid-crystal blazed-grating beam deflector", Applied Optics, Dec. 10, 2000, vol. 39, No. 35, pp. 6545-6555.
Wang et al., "Optical Design of Waveguide Holographic Binocular Display for Machine Vision", Applied Mechanics and Materials, Sep. 27, 2013, vols. 427-429, pp. 763-769.

(56) References Cited

OTHER PUBLICATIONS

Wang et al., "Speckle reduction in laser projection systems by diffractive optical elements", Applied Optics, Apr. 1, 1998, vol. 37, No. 10, pp. 1770-1775.

Weber et al., "Giant Birefringent Optics in Multilayer Polymer Mirrors", Science, Mar. 31, 2000, vol. 287, pp. 2451-2456.

Wei An, "Industrial Applications of Speckle Techniques", Doctoral Thesis, Royal Institute of Technology, Department of Production Engineering, Chair of Industrial Metrology & Optics, Stockholm, Sweden 2002, 76 pgs.

Welde et al., "Investigation of methods for speckle contrast reduction", Master of Science in Electronics, Jul. 2010, Norwegian University of Science and Technology, Department of Electronics and Telecommunications, 127 pgs.

White, "Influence of thiol-ene polymer evolution on the formation and performance of holographic polymer dispersed liquid crystals", The 232nd ACS National Meeting, San Francisco, CA, Sep. 10-14, 2006, 1 pg.

Wicht et al., "Nanoporous Films with Low Refractive Index for Large-Surface Broad-Band Anti-Reflection Coatings", Macromol. Mater. Eng., 2010, 295, DOI: 10.1002/mame.201000045, 9 pgs.

Wilderbeek et al., "Photoinitiated Bulk Polymerization of Liquid Crystalline Thiolene Monomers", Macromolecules, 2002, vol. 35, pp. 8962-8969.

Wilderbeek et al., "Photo-Initiated Polymerization of Liquid Crystalline Thiol-Ene Monomers in Isotropic and Anisotropic Solvents", J. Phys. Chem. B, 2002, vol. 106, No. 50, p. 12874-12883.

Wisely, "Head up and head mounted display performance improvements through advanced techniques in the manipulation of light", Proc. of SPIE, 2009, 10 pages, vol. 7327.

Wofford et al., "Liquid crystal bragg gratings: dynamic optical elements for spatial light modulators", Hardened Materials Branch, Survivability and Sensor Materials Division, AFRL-ML-WP-TP-2007-551, Air Force Research Laboratory, Jan. 2007, Wright-Patterson Air Force Base, OH, 17 pgs.

Yaqoob et al., "High-speed two-dimensional laser scanner based on Bragg grating stored in photothermorefractive glass", Applied Optics, Sep. 10, 2003, vol. 42, No. 26, pp. 5251-5262.

Yaroshchuk et al., "Stabilization of liquid crystal photoaligning layers by reactive mesogens", Applied Physics Letters, Jul. 14, 2009, vol. 95, p. 021902-1-021902-3.

Ye, "Three-dimensional Gradient Index Optics Fabricated in Diffusive Photopolymers", Thesis, Department of Electrical, Computer and Energy Engineering, University of Colorado, 2012, 224 pgs.

Yemtsova et al., "Determination of liquid crystal orientation in holographic polymer dispersed liquid crystals by linear and non-linear optics", Journal of Applied Physics, Oct. 13, 2008, vol. 104, p. 073115-1-073115-4.

Yeralan et al., "Switchable Bragg grating devices for telecommunications applications", Opt. Eng., Aug. 2012, vol. 41, No. 8, pp. 1774-1779.

Yoshida et al., "Nanoparticle-Dispersed Liquid Crystals Fabricated by Sputter Doping", Adv. Mater., 2010, vol. 22, pp. 622-626.

Zhang et al., "Dynamic Holographic Gratings Recorded by Photopolymerization of Liquid Crystalline Monomers", J. Am. Chem. Soc., 1994, vol. 116, pp. 7055-7063.

Zhang et al., "Switchable Liquid Crystalline Photopolymer Media for Holography", J. Am. Chem. Soc., 1992, vol. 114, pp. 1506-1507.

Zhao et al., "Designing Nanostructures by Glancing Angle Deposition", Proc. of SPIE, Oct. 27, 2003, vol. 5219, pp. 59-73.

Zlębacz, "Dynamics of nano and micro objects in complex liquids", Ph.D. dissertation, Institute of Physical Chemistry of the Polish Academy of Sciences, Warsaw 2011, 133 pgs.

Zou et al., "Functionalized nano interdigitated electrodes arrays on polymer with integrated microfluidics for direct bio-affinity sensing using impedimetric measurement", Sensors and Actuators A, Jan. 16, 2007, vol. 136, pp. 518-526.

Zyga, "Liquid crystals controlled by magnetic fields may lead to new optical applications", Nanotechnology, Nanophysics, Retrieved from http://phys.org/news/2014-07-liquid-crystals-magnetic-fields-optical.html, Jul. 9, 2014, 3 pgs.

SYSTEMS AND METHODS FOR FABRICATING A MULTILAYER OPTICAL STRUCTURE

CROSS-REFERENCE TO RELATED APPLICATIONS

The current application claims the benefit of and priority under 35 U.S.C. § 119(e) to U.S. Provisional Patent Application No. 62/703,329 entitled "Systems and Methods for Fabricating a Multilayer Optical Structure," filed Jul. 25, 2018. The disclosure of U.S. Provisional Patent Application No. 62/703,329 is hereby incorporated by reference in its entirety for all purposes.

FIELD OF THE INVENTION

The present disclosure relates to methods for fabricating multilayer optical devices and, more particularly, to methods for fabricating multilayer holographic waveguide devices using a liquid crystal and polymer material.

BACKGROUND

Waveguides can be referred to as structures with the capability of confining and guiding waves (i.e., restricting the spatial region in which waves can propagate). One subclass includes optical waveguides, which are structures that can guide electromagnetic waves, typically those in the visible spectrum. Waveguide structures can be designed to control the propagation path of waves using a number of different mechanisms. For example, planar waveguides can be designed to utilize diffraction gratings to diffract and couple incident light into the waveguide structure such that the in-coupled light can proceed to travel within the planar structure via total internal reflection ("TIR").

Fabrication of waveguides can include the use of material systems that allow for the recording of holographic optical elements within the waveguides. One class of such material includes polymer dispersed liquid crystal ("PDLC") mixtures, which are mixtures containing photopolymerizable monomers and liquid crystals. A further subclass of such mixtures includes holographic polymer dispersed liquid crystal ("HPDLC") mixtures. Holographic optical elements, such as volume phase gratings, can be recorded in such a liquid mixture by illuminating the material with two mutually coherent laser beams. During the recording process, the monomers polymerize and the mixture undergoes a photo-polymerization-induced phase separation, creating regions densely populated by liquid crystal micro-droplets, interspersed with regions of clear polymer. The alternating liquid crystal-rich and liquid crystal-depleted regions form the fringe planes of the grating.

Waveguide optics, such as those described above, can be considered for a range of display and sensor applications. In many applications, waveguides containing one or more grating layers encoding multiple optical functions can be realized using various waveguide architectures and material systems, enabling new innovations in near-eye displays for augmented reality ("AR") and virtual reality ("VR"), compact heads-up displays ("HUDs") for aviation and road transport, and sensors for biometric and laser radar ("LIDAR") applications.

SUMMARY OF THE INVENTION

Systems and methods for fabricating optical elements in accordance with various embodiments of the invention are illustrated. One embodiment includes a method for fabricating an optical element, the method including providing a first optical substrate, depositing a first layer of a first optical recording material onto the first optical substrate, applying an optical exposure process to the first layer to form a first optical structure, temporarily erasing the first optical structure, depositing a second layer of a second optical recording material, and applying an optical exposure process to the second layer to form a second optical structure, wherein the optical exposure process includes using at least one light beam traversing the first layer.

In another embodiment, the method further includes providing a second optical substrate, wherein the second layer is deposited onto the second optical substrate, and overlapping the second optical substrate with the first optical substrate.

In a further embodiment, the second optical substrate is laterally or rotationally displaced relative to the first optical substrate.

In still another embodiment, the method further includes applying a first cover layer to the first layer and applying a second cover layer to the second layer.

In a still further embodiment, the at least one light beam is provided by an apparatus selected from the group that includes: a crossed-beam holographic recording apparatus; a contact copying apparatus using a master grating or hologram; and an apparatus for traversing light with a predefined beam cross section.

In yet another embodiment, the first optical structure is temporarily erased by applying an external stimulus.

In a yet further embodiment, the external stimulus includes a stimulus selected from the group that includes: an optical stimulus, a thermal stimulus, a chemical stimulus, a mechanical stimulus, an electrical stimulus, and a magnetic stimulus.

In another additional embodiment, the external stimulus is applied at a strength below a predefined threshold to produce optical noise below a predefined level.

In a further additional embodiment, the method further includes temporarily erasing the second optical structure, depositing a third layer of a third optical recording material, applying an optical exposure process to the third layer to form a third optical structure using at least one light beam traversing the first layer and the second layer.

In another embodiment again, at least one of the first and second optical structures modifies at least one of phase, amplitude, and wavefront of incident light.

In a further embodiment again, the first optical recording material and the second optical recording material include different material formulations.

In still yet another embodiment, the first optical recording material includes a mixture of liquid crystal and polymer and the first optical structure includes at least one grating.

In a still yet further embodiment, the first optical recording material further includes at least one of: a LPP, a dye, a photoinitiator, a surfactant, a multi-function monomer, and nanoparticles.

In still another additional embodiment, temporarily erasing the first optical structure includes changing the order parameter of the liquid crystal.

In a still further additional embodiment, the first optical recording material includes a liquid crystal, polymer, and an additive for temporarily erasing the first optical structure.

In still another embodiment again, the first optical recording material is deposited onto the first optical substrate using spin coating or inkjet printing.

In a still further embodiment again, the first optical substrate is curved.

In yet another additional embodiment, the method further includes at least one of the steps of: forming an air gap; applying a layer of low refractive index material; applying a polarization control layer; and applying a liquid crystal alignment layer.

In a yet further additional embodiment, the method forms part of a roll-to-roll fabrication process.

A yet another embodiment again includes a method of fabricating an optical element, the method including providing first and second optical substrates, forming a first cell from the first and second substrates, filling the first cell with a first optical recording material, applying an optical exposure process to the first cell to form a first optical structure, temporarily erasing the first optical structure, providing third and fourth optical substrates, forming a second cell from the third and fourth substrates, filling the second cell with a second optical recording material, overlapping the first and second cells, and applying an optical exposure process to the second layer to form a second optical structure, wherein the optical exposure process includes using at least one light beam traversing the first layer.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention. It will apparent to those skilled in the art that the present invention may be practiced with some or all of the present invention as disclosed in the following description.

DETAILED DESCRIPTION

Figure 1A:
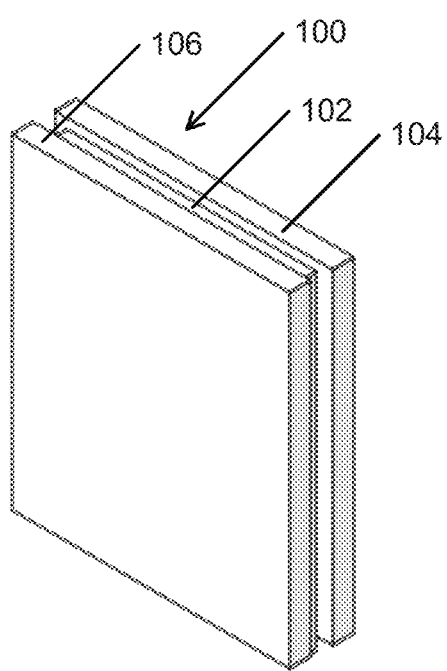
FIGS. 1A and 1B conceptually illustrate different views of a waveguide providing a total internal reflection light guiding structure.

Following below are more detailed descriptions of various concepts related to, and embodiments of, optical displays, methods for fabricating optical displays, and methods for displaying information. It should be appreciated that various concepts introduced and discussed below may be implemented in any of numerous ways, as the disclosed concepts are not limited to any particular manner of implementation. Examples of specific implementations and applications are provided primarily for illustrative purposes. A more complete understanding of the invention can be obtained by considering the following detailed description in conjunction with the accompanying drawings, wherein like index numerals indicate like parts. For the purposes of describing embodiments, some well-known features of optical technology known to those skilled in the art of optical design and visual displays have been omitted or simplified in order to not obscure the basic principles of the invention. Unless otherwise stated, the term "on-axis" in relation to a ray or a beam direction refers to propagation parallel to an axis normal to the surfaces of the optical components described in relation to the invention. In the following description the terms light, ray, beam, and direction may be used interchangeably and in association with each other to indicate the direction of propagation of electromagnetic radiation along rectilinear trajectories. The term light and illumination may be used in relation to the visible and infrared bands of the electromagnetic spectrum. Parts of the following description will be presented using terminology commonly employed by those skilled in the art of optical design. As used herein, the term grating may encompass a grating comprised of a set of gratings in some embodiments. For illustrative purposes, it is to be understood that the drawings are not drawn to scale unless stated otherwise.

Waveguides can be stacked to combine different spectral bandwidths, angular bandwidths, and various other optical functions. However, stacking and aligning waveguides can introduce the risk of planarity and contamination and can increase the overall processing time and costs. One method for fabricating multilayer holographic waveguide devices includes stacking waveguide cells and recording holographic elements on the complete stack. However, in such methods, a recorded grating in one layer can deflect the beams traversing it to corrupt a second grating. Similar problems can arise in other processes for manufacturing devices containing multiple layers supporting optical structures. As such, many systems and methods in accordance with various embodiments of the invention are designed to provide optically efficient, economical solutions for fabricating multilayer optical devices, such as but not limited to holographic waveguide devices.

Solutions for fabricating multilayer optical devices in accordance with various embodiments of the invention can include a variety of different techniques, including but not limited to methods for recording optical structures into layers of optical recording material for waveguide stacks of two or more overlapping layers. In many embodiments, the fabrication process includes fabricating a stack of optical structures in which a first optical recording material layer deposited on a substrate is exposed to form a first optical structure, which can be temporarily erased so that a second optical structure can be recorded into a second material layer deposited onto the first layer using optical recording beams traversing the first layer. Optical structures can include but are not limited to gratings. Temporarily "erased" optical structures or gratings can behave similar to transparent materials, allowing light to pass through without affecting the ray paths. This principle can be applied to fabricate a variety of different waveguide stack configurations. For example, some processes include fabricating a multilayer waveguide stack with two grating layers that are separated by a substrate. In some embodiments, the two grating layers are each covered by a protective cover layer. In several embodiments, the process includes fabricating a multilayer waveguide stack with two grating layers that are each encapsulated in a cell. In a number of embodiments, the process is implemented as part of a roll-to-roll fabrication process. These and other configurations and methods for fabricating such configurations are discussed in the sections below in further detail.

Holographic Waveguide Devices

Figure 1B:
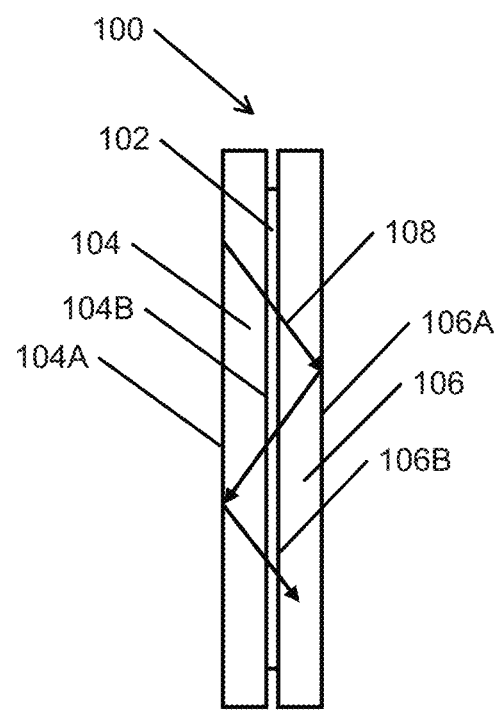

Holographic waveguide devices and related methods of manufacturing in accordance with various embodiments of the invention can be configured in many different ways. In several embodiments, the device includes an optical waveguide that is formed with a grating layer sandwiched between two transparent substrates. In such configurations, the waveguide can provide a total internal reflection ("TIR") light guiding structure using the substrate-air interfaces. Light traveling within the waveguide via TIR can be coupled out of the waveguide when a grating within the grating layer diffracts the light at an angle beyond the TIR condition. An example of a waveguide utilizing TIR to propagate incident light rays is conceptually illustrated in FIGS. 1A and 1B. FIG. 1A conceptually illustrates a perspective view of the waveguide 100 having a grating layer 102 sandwiched by transparent substrates 104, 106. Various types of materials can be used to form the grating layer and substrates. In many embodiments, the substrates are made of glass or plastic polymers while the grating layer is formed from an HPDLC mixture. FIG. 1B shows the waveguide 100 in operation with a ray 108 traveling between the waveguide outer surfaces 104A, 106A via TIR. As shown, the grating layer 102 is in contact with the substrate surfaces 104B, 106B.

In many display applications, a holographic waveguide device can be implemented with an optical structure that includes a layer containing one or more volume holograms or gratings. Optical structures in accordance with various embodiments of the invention can include various configurations of gratings. In many embodiments, the optical structure includes grating configuration for two-dimensional beam expansion. For example, many optical structures include a fold grating for vertical beam expansion and beam steering and an output grating for horizontal beam expansion and extraction of light from the waveguide. Some optical structures include an input coupler for the waveguide, which can take the form of an input grating or prism. In several embodiments, the input coupler is a surface relief grating. In other embodiments, the input coupler is a volume grating.

Optical structures recorded in waveguides can include many different types of optical elements, such as but not limited to diffraction gratings. In many embodiments, the grating implemented is a Bragg grating (also referred to as a volume grating). Bragg gratings can have high efficiency with little light being diffracted into higher orders. The relative amount of light in the diffracted and zero order can be varied by controlling the refractive index modulation of the grating, a property that is can be used to make lossy waveguide gratings for extracting light over a large pupil. One class of gratings used in holographic waveguide devices is the Switchable Bragg Grating ("SBG"). SBGs can be fabricated by first placing a thin film of a mixture of photopolymerizable monomers and liquid crystal material between glass plates or substrates. In many cases, the glass plates are in a parallel configuration. One or both glass plates can support electrodes, typically transparent tin oxide films, for applying an electric field across the film. The grating structure in an SBG can be recorded in the liquid material (often referred to as the syrup) through photopolymerization-induced phase separation using interferential exposure with a spatially periodic intensity modulation. Factors such as but not limited to control of the irradiation intensity, component volume fractions of the materials in the mixture, and exposure temperature can determine the resulting grating morphology and performance. As can readily be appreciated, a wide variety of materials and mixtures can be used depending on the specific requirements of a given application. In many embodiments, HPDLC material is used. During the recording process, the monomers polymerize and the mixture undergoes a phase separation. The LC molecules aggregate to form discrete or coalesced droplets that are periodically distributed in polymer networks on the scale of optical wavelengths. The alternating liquid crystal-rich and liquid crystal-depleted regions form the fringe planes of the grating, which can produce Bragg diffraction with a strong optical polarization resulting from the orientation ordering of the LC molecules in the droplets.

The resulting volume phase grating can exhibit very high diffraction efficiency, which can be controlled by the magnitude of the electric field applied across the film. When an electric field is applied to the grating via transparent electrodes, the natural orientation of the LC droplets can change, causing the refractive index modulation of the fringes to lower and the hologram diffraction efficiency to drop to very low levels. Typically, the electrodes are configured such that the applied electric field will be perpendicular to the substrates. In a number of embodiments, the electrodes are fabricated from indium tin oxide ("ITO"). In the OFF state with no electric field applied, the extraordinary axis of the liquid crystals generally aligns normal to the fringes. The grating thus exhibits high refractive index modulation and high diffraction efficiency for P-polarized light. When an electric field is applied to the HPDLC, the grating switches to the ON state wherein the extraordinary axes of the liquid crystal molecules align parallel to the applied field and hence perpendicular to the substrate. In the ON state, the grating exhibits lower refractive index modulation and lower diffraction efficiency for both S- and P-polarized light. Thus, the grating region no longer diffracts light. Each grating region can be divided into a multiplicity of grating elements such as for example a pixel matrix according to the function of the HPDLC device. Typically, the electrode on one substrate surface is uniform and continuous, while electrodes on the opposing substrate surface are patterned in accordance to the multiplicity of selectively switchable grating elements.

Typically, the SBG elements are switched clear in 30 μs with a longer relaxation time to switch ON. Note that the diffraction efficiency of the device can be adjusted, by means of the applied voltage, over a continuous range. In many cases, the device exhibits near 100% efficiency with no voltage applied and essentially zero efficiency with a sufficiently high voltage applied. In certain types of HPDLC devices, magnetic fields can be used to control the LC orientation. In some HPDLC applications, phase separation of the LC material from the polymer can be accomplished to such a degree that no discernible droplet structure results. An SBG can also be used as a passive grating. In this mode, its chief benefit is a uniquely high refractive index modulation. SBGs can be used to provide transmission or reflection gratings for free space applications. SBGs can be implemented as waveguide devices in which the HPDLC forms either the waveguide core or an evanescently coupled layer in proximity to the waveguide. The glass plates used to form the HPDLC cell provide a total internal reflection ("TIR") light guiding structure. Light can be coupled out of the SBG when the switchable grating diffracts the light at an angle beyond the TIR condition.

One of the known attributes of transmission SBGs is that the LC molecules tend to align with an average direction normal to the grating fringe planes (i.e., parallel to the grating or K-vector). The effect of the LC molecule alignment is that transmission SBGs efficiently diffract P polarized light (i.e., light with a polarization vector in the plane of incidence), but have nearly zero diffraction efficiency for S polarized light (i.e., light with the polarization vector normal to the plane of incidence). As a result, transmission SBGs typically cannot be used at near-grazing incidence as the diffraction efficiency of any grating for P polarization falls to zero when the included angle between the incident and reflected light is small. In addition, illumination light with non-matched polarization is not captured efficiently in holographic displays sensitive to one polarization only.

In some cell designs, adhesives and spacers can be disposed between the substrates to affix the layers of the elements together and to maintain the cell gap, or thickness dimension. In these devices, spacers can take many forms, such as but not limited to different materials, sizes, and geometries. Materials can include, for example, plastics (e.g., divinylbenzene), silica, and conductive spacers. They can take any suitable geometry, such as but not limited to rods and spheres. The spacers can take any suitable size. In many cases, the sizes of the spacers range from 1 to 30 µm. While the use of these adhesive materials and spacers can be necessary in LC cells using conventional materials and methods of manufacture, they can contribute to the haziness of the cells degrading the optical properties and performance of the waveguide and device.

Waveguides and associated optical structures can be fabricated using a variety of different methods. In many embodiments, a waveguide is fabricated by coating a first substrate with an optical recording material. In a number of embodiments, the optical recording material is deposited onto the substrates using spin coating or spraying. A second substrate layer can be included to form the waveguide such that the optical recording material is sandwiched between two substrates. In several embodiments, the second substrate can be a thin protective film coated onto the exposed layer. In various embodiments, the substrates are used to make a cell, which is then filled with the holographic recording material. The filling process can be accomplished using a variety of different methods, such as but not limited vacuum filling methods. In further embodiments, alignment layers and/or polarization layers can be added. As can readily be appreciated, the fabrication methods described can be applied to fabricate a wide variety of waveguides with different optical structures, such as but not limited to diffraction gratings. For example, fabrication methods in accordance with various embodiments of the invention can include recording an SBG by coating an optical recording material onto a substrate, which is exposed and then sealed by a protective overcoat layer.

Various recording methods can be used for fabricating optical structures in accordance with many embodiments of the invention. In mass production, it can be more efficient and cost effective to replace the traditional two beam holographic recording processes with one using contact printing from a master. In some embodiments, the gratings are recorded using mastering and contact copying process. In several embodiments, the grating in a given layer can be recorded in stepwise fashion by scanning or stepping the recording laser beams across the grating area.

In many applications, a waveguide stack of two or more waveguides is implemented for various purposes. For example, two or more waveguides can be stacked to combine different spectral bandwidths, angular bandwidths, and/or optical functions. Such waveguide stacks can be formed with waveguides that are overlaid. In many embodiments, the waveguides are overlaid in contact. In other embodiments, the waveguides are overlaid with air gap(s) or other layer(s) in between. Methods for manufacturing multilayer waveguide devices can include the use of certain materials that allow for the individual recording of the optical structure within each of the layer within the waveguide device. In the case of holographic waveguide embodiments, the optical recording material forming the grating layer can include a liquid crystal ("LC") polymer mixture. Such material systems can allow the grating to be temporarily erased through the application of external stimuli that alter the alignment of the LC so that the LC index matches that of the surrounding polymer. Although discussions may describe the recording of optical structures having at least one holographic grating formed in layers in waveguide devices, various embodiments in accordance with the invention may also be applied to the recording of more general optical structures for modifying at least one of phase, amplitude, or wavefront of incident light in liquid crystal and polymer material systems. Examples of material systems used in the fabrication processes of various optical devices incorporating waveguides with holographic gratings can include PDLC mixtures and formulations. Discussions of PDLC material systems are described in further detail in the sections below. Although the discussions concentrate on LC polymer material systems, various embodiments in accordance with the invention can be applied using other material systems capable of supporting optical structures that can be erased by an external stimulus.

Optical Recording Material Systems

PDLC mixtures in accordance with various embodiments of the invention generally include LC, monomers, photoinitiator dyes, and coinitiators. The mixture (often referred to as syrup) frequently also includes a surfactant. For the purposes of describing the invention, a surfactant is defined as any chemical agent that lowers the surface tension of the total liquid mixture. The use of surfactants in PDLC mixtures is known and dates back to the earliest investigations of PDLCs. For example, a paper by R. L Sutherland et al., SPIE Vol. 2689, 158-169, 1996, the disclosure of which is incorporated herein by reference, describes a PDLC mixture including a monomer, photoinitiator, coinitiator, chain extender, and LCs to which a surfactant can be added. Surfactants are also mentioned in a paper by Natarajan et al, Journal of Nonlinear Optical Physics and Materials, Vol. 5 No. I 89-98, 1996, the disclosure of which is incorporated herein by reference. Furthermore, U.S. Pat. No. 7,018,563 by Sutherland; et al., discusses polymer-dispersed liquid crystal material for forming a polymer-dispersed liquid crystal optical element comprising: at least one acrylic acid monomer; at least one type of liquid crystal material; a photoinitiator dye; a coinitiator; and a surfactant. The disclosure of U.S. Pat. No. 7,018,563 is hereby incorporated by reference in its entirety.

The patent and scientific literature contains many examples of material systems and processes that can be used to fabricate SBGs, including investigations into formulating such material systems for achieving high diffraction efficiency, fast response time, low drive voltage, and so forth. U.S. Pat. No. 5,942,157 by Sutherland, and U.S. Pat. No. 5,751,452 by Tanaka et al. both describe monomer and liquid crystal material combinations suitable for fabricating SBG devices. Examples of recipes can also be found in papers dating back to the early 1990s. Many of these materials use acrylate monomers, including:

- R. L. Sutherland et al., Chem. Mater. 5, 1533 (1993), the disclosure of which is incorporated herein by reference, describes the use of acrylate polymers and surfactants. Specifically, the recipe comprises a crosslinking multifunctional acrylate monomer; a chain extender N-vinyl pyrrolidinone, LC E7, photoinitiator rose Bengal, and coinitiator N-phenyl glycine. Surfactant octanoic acid was added in certain variants.
- Fontecchio et al., SID 00 Digest 774-776, 2000, the disclosure of which is incorporated herein by reference, describes a UV curable HPDLC for reflective display applications including a multi-functional acrylate monomer, LC, a photoinitiator, a coinitiators, and a chain terminator.
- Y. H. Cho, et al., Polymer International, 48, 1085-1090, 1999, the disclosure of which is incorporated herein by reference, discloses HPDLC recipes including acrylates.
- Karasawa et al., Japanese Journal of Applied Physics, Vol. 36, 6388-6392, 1997, the disclosure of which is incorporated herein by reference, describes acrylates of various functional orders.
- T. J. Bunning et al., Polymer Science: Part B: Polymer Physics, Vol. 35, 2825-2833, 1997, the disclosure of which is incorporated herein by reference, also describes multifunctional acrylate monomers.
- G. S. Iannacchione et al., Europhysics Letters Vol. 36 (6). 425-430, 1996, the disclosure of which is incorporated herein by reference, describes a PDLC mixture including a penta-acrylate monomer, LC, chain extender, coinitiators, and photoinitiator.

Acrylates offer the benefits of fast kinetics, good mixing with other materials, and compatibility with film forming processes. Since acrylates are cross-linked, they tend to be mechanically robust and flexible. For example, urethane acrylates of functionality 2 (di) and 3 (tri) have been used extensively for HPDLC technology. Higher functionality materials such as penta and hex functional stems have also been used.

Fabrication Methods for Multilayer Waveguide Stacks

The fabrication of multilayer optical devices in accordance with various embodiments of the invention can include a variety of different techniques. Methods for recording optical structures into layers of optical recording material can be implemented for waveguide stacks with overlapping layers. Such recording methods can include fabricating a stack of optical structures in which a first optical recording material layer deposited on a substrate is exposed to form a first optical structure, which can be temporarily erased so that a second optical structure can be recorded into a second material layer deposited onto the first layer using optical recording beams traversing the first layer. Although the recording methods are discussed primarily with regards to waveguide stacks with two overlapping layers, the basic principle can be applied to waveguide stacks with more than two overlapping layers. Additionally, this principle can be applied to fabricate a variety of different waveguide stack configurations.

Figure 2A:
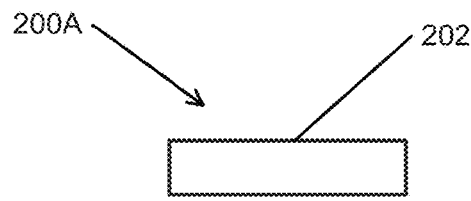
FIG. 2A-2F conceptually illustrate a method for recording a stack of two gratings in accordance with an embodiment of the invention.

The basic principle of a method for recording a stack of two gratings in accordance with various embodiments of the invention is conceptually illustrated in FIGS. 2A-2F. To simplify the description, the substrates or cells supporting the grating layer are not illustrated in FIGS. 2A-2F. As discussed in the sections above, the gratings can be supported by transparent substrates or encapsulated inside cells made from transparent substrates. FIG. 2A shows the first step 200A in which a first layer 202 of optical recording material is provided. The recording material can include material systems capable of supporting optical structures that can be erased by a stimulus. Any of a variety of different types of optical recording material systems, such as but not limited to the material systems described in the sections above, can be utilized. In many embodiments, the optical recording material includes a mixture of liquid crystal and polymer. In some embodiments, the optical recording material can further include a photosensitive dye, a photoinitiator, a surfactant, a multi-function monomer, and/or nanoparticles.

Figure 2B:
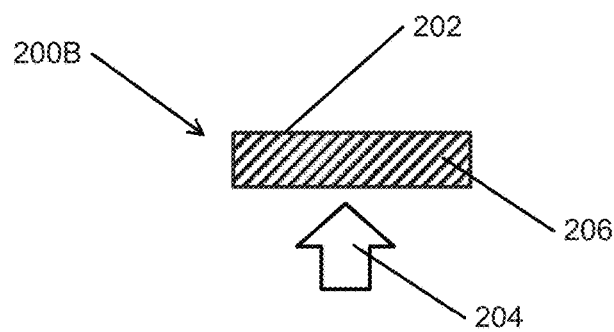

FIG. 2B shows a second step 200B in which an optical exposure process 204 is applied to the first layer 202 to form a first optical structure 206. In embodiments in which the optical structure is a holographic grating, the exposure process can utilize a crossed-beam holographic recording apparatus. In a number of embodiments, the optical recording process uses beams provided by a holographic master, which may be a Bragg hologram recorded in a photopolymer or an amplitude grating. In some embodiments, the exposure process utilizes a single recording beam in conjunction with a master grating to form an interferential exposure beam. In many embodiments, a contact copying apparatus using a master grating or hologram is used. In several embodiments, the optical recording process uses an apparatus for traversing recording beams with a predefined beam cross section along a predefined path across the optical layer. As can readily be appreciated, optical structures can be recorded using a variety of exposure processes. In addition to the processes described, other industrial processes and apparatuses currently used in the field to fabricate holograms can be used.

Figure 2C:
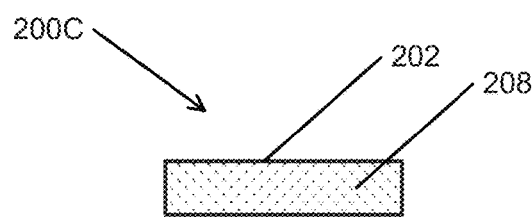

Turning now to FIG. 2C, a third step 200C is illustrated in which the first optical structure 206 is temporarily erased by an external stimulus to produce a cleared first layer 208. External stimulus/stimuli can include optical, thermal, chemical, mechanical, electrical, and/or magnetic stimuli. In many embodiments, the external stimulus is applied at a strength below a predefined threshold to produce optical noise below a predefined level. The specific predefined threshold can depend on the type of material used to form the optical structure. In some embodiments, a sacrificial alignment layer applied to the first optical structure can be used to temporarily erase the first optical structure. In some embodiments, the strength of the external stimulus applied to the first optical structure is controlled to reduced optical noise in the optical device during normal operation. In many embodiments, the optical recording material further includes an additive for facilitating the process of erasing the optical structure, which can include any of the methods described above.

Figure 2D:
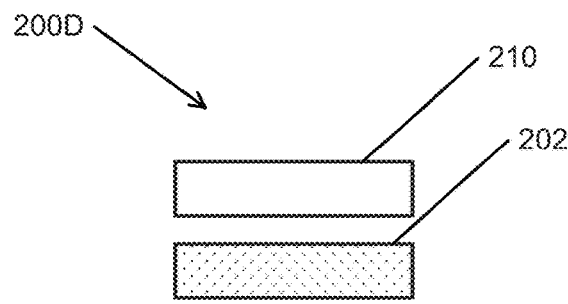

FIG. 2D shows a fourth step 200D in which a second layer 210 of optical recording material is brought into overlap with the exposed first layer 202. In many embodiments, the optical recording materials in both layers are identical. In some embodiments, the first and second layers are fabricated using optical recording materials formulated to be recordable with different spectral and/or angular bandwidths. Such materials can be optimized for different ranges of spectral and/or angular bandwidths.

Figure 2E:
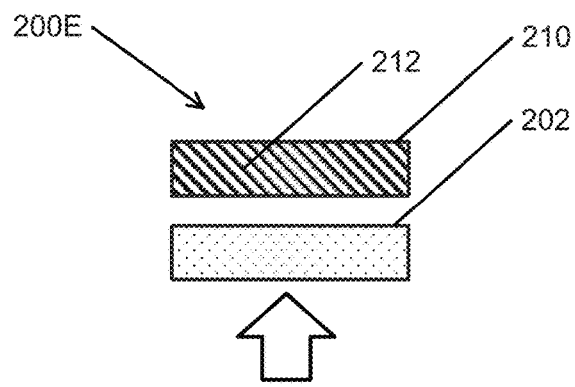

FIG. 2E shows a fifth step 200E in which an optical exposure process is applied through the cleared first layer 202 and to the second layer 210 to form a second optical structure 212. In many embodiments, during the exposure process, at least one light beam traverses through the first layer to record the second optical structure 212 in the second layer 210.

Figure 2F:
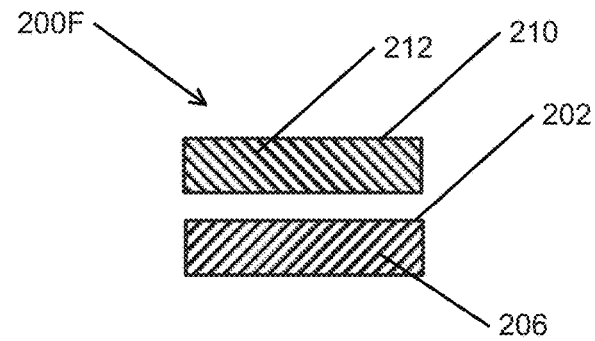

Finally, FIG. 2F shows a final step 200F in which the first optical structure 206 has been restored to its recorded state. As shown, the resulting device includes two layers with optical structures 206, 212 that are overlaid.

Figure 3A:
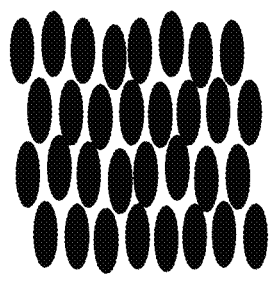
FIG. 3A conceptually illustrates an ordered liquid crystal phase.
Figure 3B:
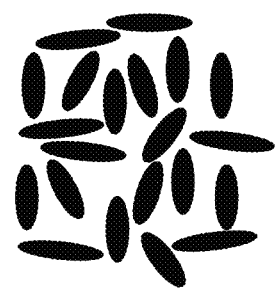
FIG. 3B conceptually illustrates a disordered liquid crystal phase.

The clearing and restoration of a recorded layer described in the process above can be achieved using many different methods. In many embodiments, the first layer is cleared by applying a stimulus continuously during the recording of the second layer. In other embodiments, the stimulus is initially applied, and the grating in the cleared layer can naturally revert to its recorded state over a timescale that allows for the recording of the second grating. In other embodiments, the layer stays cleared after application of an external stimulus and reverts in response to another external stimulus. In several embodiments, the restoration of the first optical structure to its recorded state can be carried out using an alignment layer or an external stimulus. An external stimulus used for such restoration can be any of a variety of different stimuli, including but not limited to the stimulus/stimuli used to clear the optical structure. Depending on the composition material of the optical structure and layer to be cleared, the clearing process can vary. In embodiments utilizing LC materials, the clearing process can be based on changing the order parameter of the liquid crystals. FIGS. 3A and 3B conceptually illustrate examples of an ordered liquid crystal phase and a disordered liquid crystal phase, respectively. As discussed above, changing the order parameter of the liquid crystals can be achieved in various ways, including but not limited to applying an external stimulus such as but not limited to an electrical stimulus.

Multi-layer waveguide stacks can be fabricated using a variety of different methods. Additionally, multi-layer waveguide stacks can be constructed with different materials in many different ways. In some embodiments, the waveguide stack includes at least two layers of exposed optical recording material having optical structures. In further embodiments, the two layers of exposed optical recording material are separated by a substrate. As can readily be appreciated, the specific method implemented can depend on the construction of the waveguide stack. FIGS. 4-7 conceptually illustrate several processes for manufacturing different types of waveguide stacks in accordance with various embodiments of the invention.

Figure 4:
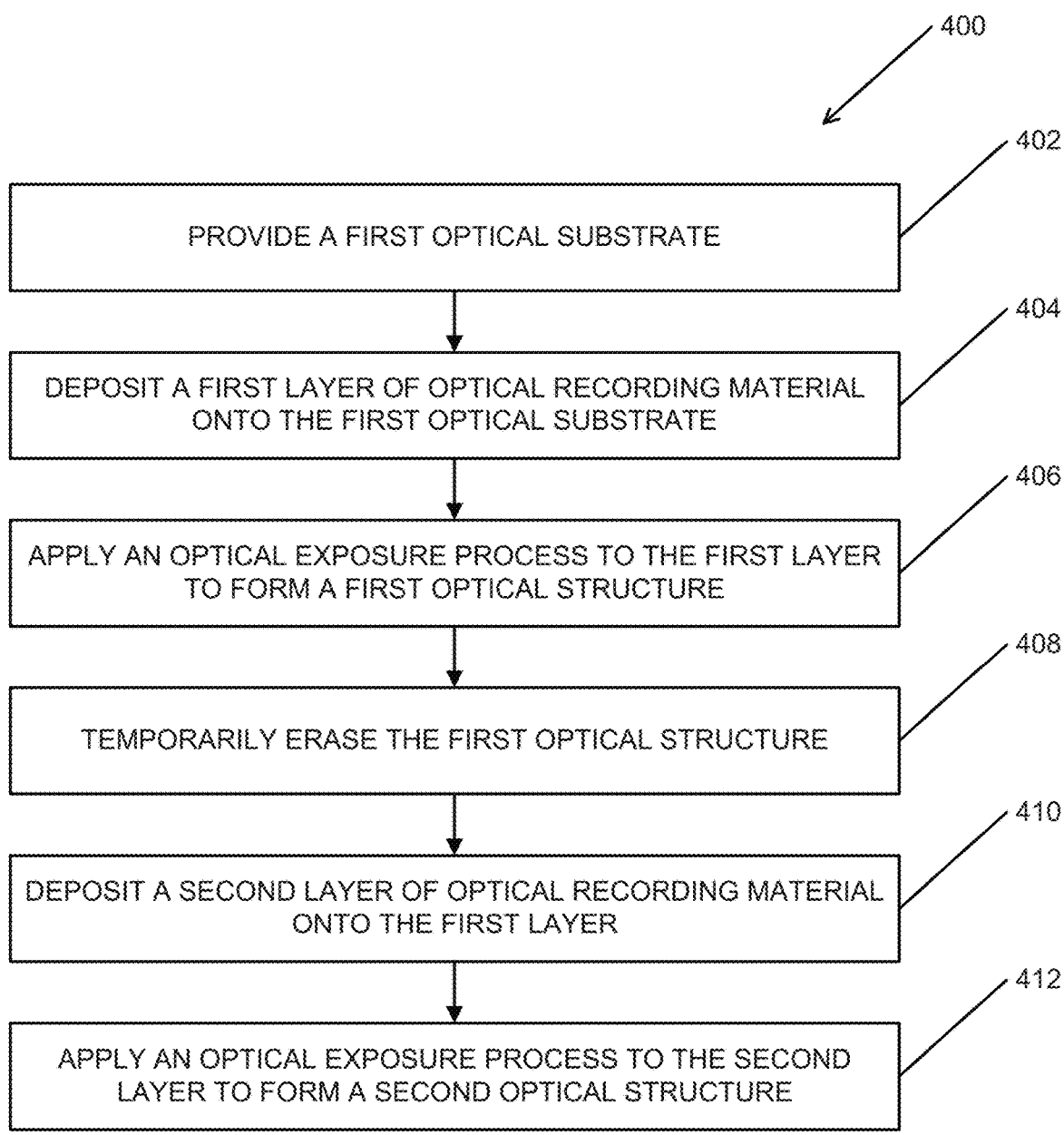
FIG. 4 conceptually illustrates a flow chart of a method for fabricating a multi-waveguide layer stack in accordance with an embodiment of the invention.

FIG. 4 conceptually illustrates a flow chart of a process 400 for fabricating a multi-waveguide layer stack in accordance with an embodiment of the invention, similar to the process conceptually illustrated in FIGS. 2A-2F. In the illustrative embodiment of FIG. 4, the method includes fabricating a waveguide stack in which a first optical recording material layer deposited on a substrate is exposed to form a first optical structure, which is temporarily erased so that a second material layer deposited onto the first layer can be exposed using recording beams traversing the first layer.

Turning now to the specifics of FIG. 4, the process 400 can include providing (402) a first optical substrate. Such optical substrates can vary in form and material, such as but not limited to glass and plastics. In many embodiments, the substrates are planar glass plates. In some embodiments, the substrates are curved. A first layer of optical recording material can then be deposited (404) onto the first optical substrate. Material systems capable of being utilized in accordance with various embodiments of the invention can include any material systems in which optical structures can be recorded, such as but not limited to HPDLC material systems. Further examples and variations of such material systems are described in the sections above. Once the optical recording material is deposited, an optical exposure process can be applied (406) to the first layer of optical recording material to form a first optical structure. Optical exposure processes can include conventional techniques used within the field. In many embodiments, a crossed-beam holographic recording apparatus is utilized for the optical exposure process. In some embodiments, a contact copying apparatus using a master grating or hologram is utilized. In several embodiments, an apparatus for traversing light with a predefined beam cross section is utilized. As can readily be appreciated, any optical exposure process can be used, the specific process of which can depend on the specific requirements of a given application—i.e., different types of optical recording materials can have different preferred optical exposure processes. Once the first optical structure is formed in the first layer, the first optical structure can be temporarily erased (408). Erasing the optical structure, or clearing the layer, can be achieved using any of the methods described above, such as but not limited to applying a stimulus to the first layer. A second layer of an optical recording material can be deposited (410) onto the first layer. In several embodiments, the optical recording material of the second layer is identical to the optical recording material of the first layer. In other embodiments, the optical recording materials of the two layers are different. An optical exposure process can be applied (412) to the second layer to form a second optical structure. Exposure processes can include any of the processes utilized for the exposing the first layer. In many embodiments, the exposure process includes traversing at least one light beam through the first layer to record the second optical structure in the second layer. Once the cleared first layer is restored, the resulting device is a two-layer device with each layer having at least one optical structure.

Figure 5:
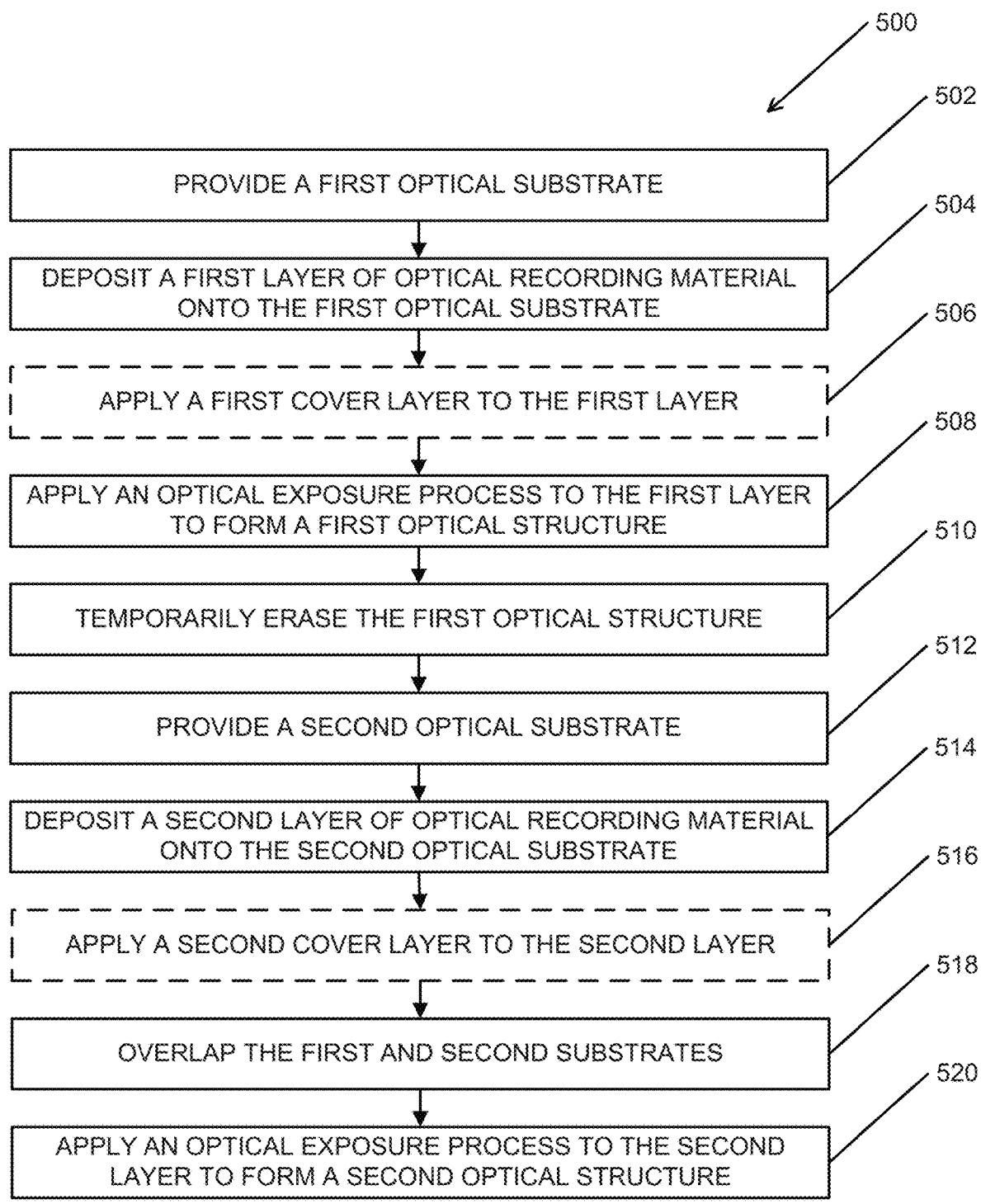
FIG. 5 conceptually illustrates a flow chart of a method for fabricating a multi-waveguide layer stack having two grating layers separated by a substrate in accordance with an embodiment of the invention.

FIG. 5 is a flow chart conceptually illustrating a process 500 for fabricating a multi-waveguide layer stack having two grating layers separated by a substrate in accordance with an embodiment of the invention. As shown, the process 500 can include steps that are similar to the method of FIG. 4. As such, it is to be understood that various ways of performing the steps of the process illustrated in FIG. 4 can be applied similarly to the process 500 of FIG. 5. Referring to FIG. 5, the process 500 can include providing (502) a first optical substrate. Optical substrates can include plates made of transparent materials, such as but not limited to glass and plastics. Additionally, the substrates can be curved or planar. A first layer of optical recording material can be deposited (504) onto the first optical substrate. Various optical recording materials, such as but not limited to HPDLC material systems, can be utilized. A first cover layer can optionally be applied (506) to the first layer. In many embodiments, a cover layer is applied as a substrate. In such cases, the cover layer can include an adhesive layer protected by a peel-off film. In some embodiments, the adhesive layer can be applied to the grating. In several embodiments, the cover layer is a protective layer deposited. Deposition of the cover layer can employ various techniques, such as but not limited to the use of an inkjet coater and other coating processes. Various types of cover layers can also be utilized. In some embodiments, the cover layer is a flexible glass foil, such as but not limited to Corning® Willow® Glass, which is available in various thicknesses including 100 and 200 micrometers. As can readily be appreciated, the specific type of cover layer utilized can depend on the given application. For example, in larger displays, thicker cover glass can be utilized. One example include HUD applications, which can include the use of a 10 mm cover layer. Other materials for cover layers include but are not limited to TAC (cellulose triacetate), TPU (thermoplastic polyurethane), and PET (polyurethane). In several embodiments, the cover layer is a multilayer structure using different materials for greater robustness or for optimizing optical properties, such as but not limited to transmission and/or polarization response. In some applications, the use of a glass or plastic substrate can be eliminated by overcoating the grating layer with a monomeric barrier film that seals the material. In many embodiments, the barrier film is UV curable. In several embodiments, the coating is carried out in a Nitrogen-rich atmosphere. One relevant inkjet coating process, known as the YIELDjet® FLEX system, has been developed by Kateeva Inc. (CA) for OLED display large volume fabrication.

Referring back to FIG. 4, the process 500 can include applying (508) an optical exposure process to the first layer to form a first optical structure. Optical exposure processes can include various holographic recording techniques, such as but not limited to single or two-beam interferential processes. As can readily be appreciated, any optical exposure process can be used and can depend on the specific requirements of a given application. The formed first optical structure can be temporarily erased (510). Erasing the optical structure, or clearing the layer, can be achieved using any of the methods described above, such as but not limited to applying a stimulus to the first layer. A second substrate can be provided (512). A second layer of an optical recording material can be deposited (514) onto the second substrate. In several embodiments, the optical recording material of the second layer is identical to the optical recording material of the first layer. In other embodiments, the optical recording materials of the two layers are different. A second cover layer (516) can optionally be applied to the second layer. In many embodiments, the second cover layer is made of a material identical to the first cover layer. The first and second substrates can be overlaid (518) with each other. In several embodiments, the second substrate is laterally or rotationally displaced relative to the first substrate. An optical exposure process can be applied (520) to the second layer to form a second optical structure. Exposure processes can include any of the processes utilized for the exposing the first layer. In many embodiments, the exposure process includes traversing at least one light beam through the first layer to record the second optical structure in the second layer.

Figure 6:
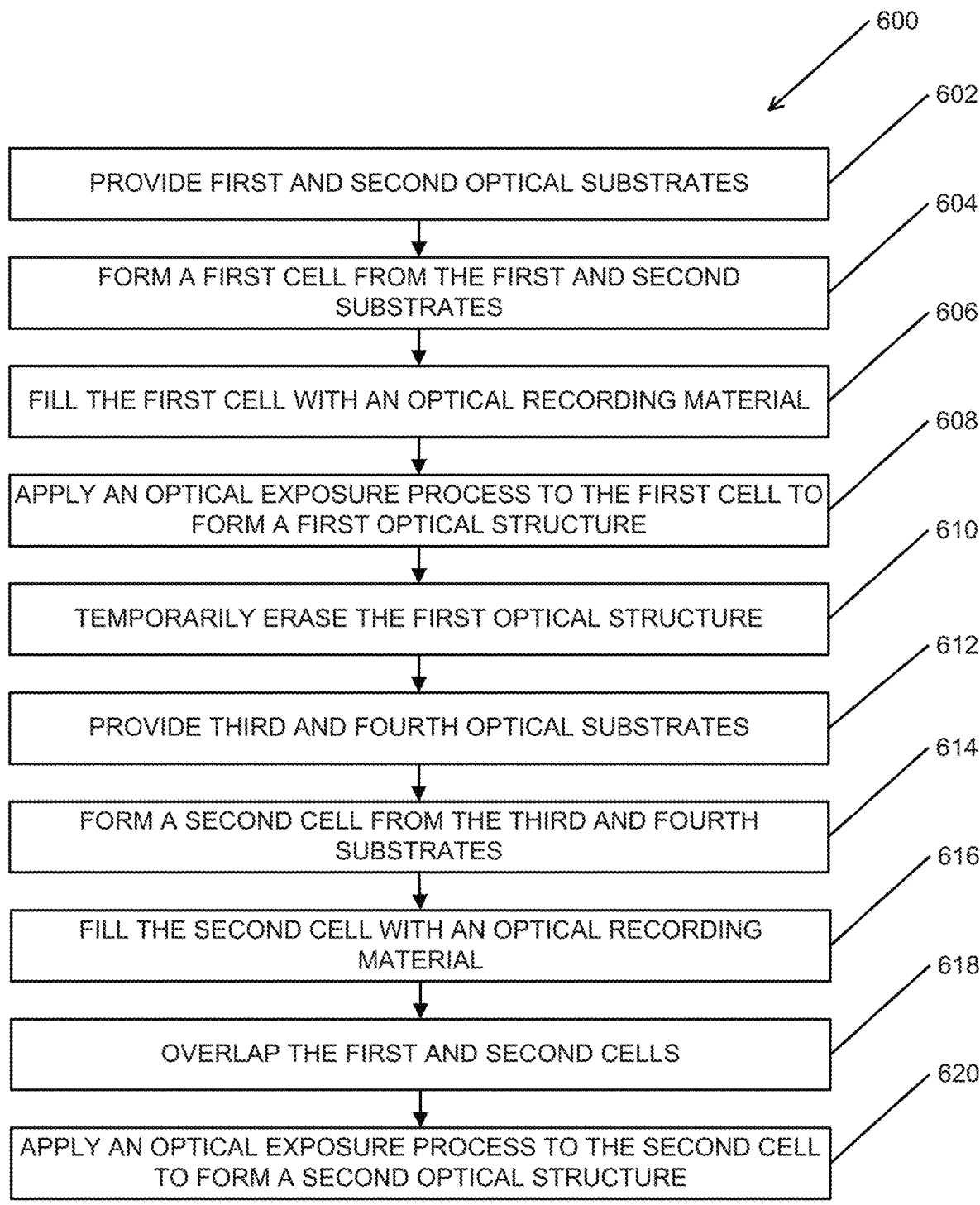
FIG. 6 conceptually illustrates a flow chart of a method for fabricating a multi-waveguide layer stack having two grating layers each encapsulated within a cell in accordance with an embodiment of the invention.

FIG. 6 is a flow chart conceptually illustrating a process 600 for fabricating a multi-waveguide layer stack in which each grating layer is encapsulated within a cell in accordance with an embodiment of the invention. Referring to FIG. 6, the process 600 can include providing (602) a first optical substrate and a second optical substrate. Any type of optical substrates, such as those described in the sections above, can be utilized. In many embodiments, the optical substrates are transparent. A first cell can be formed (604) from the first and second substrates. The first cell can be filled (606) with a first optical recording material. Various optical recording materials, such as but not limited to HPDLC material systems, can be utilized. As can readily be appreciated, the formation of a cell containing optical recording material can be achieved in many different ways. In some embodiments, the cell is formed by depositing the optical recording material onto a first substrate. The deposition technique can include but are not limited to inkjet printing, spin-coating, and various additive manufacturing depositions techniques. A second substrate can be placed on top of the deposited material and the various layers can be laminated to form a cell. Referring back to FIG. 6, the process 600 can include applying (608) an optical exposure process to the first cell to form a first optical structure. As can readily be appreciated, any optical exposure process can be used and can depend on the specific requirements of a given application. The first optical structure can be temporarily erased (610). Erasing the optical structure, or clearing the layer, can be achieved using any of the methods described above, such as but not limited to applying a stimulus to the first layer. A third optical substrate and a fourth optical substrate can be provided (612). A second cell can be formed (614) from the third and fourth substrates. The second cell can be filled (616) with an optical recording material. In several embodiments, the second cell is filled with a type of optical recording material that is identical to the optical recording material in the first cell. The first and second cell can be overlaid (618) with each other. In several embodiments, the second cell is laterally or rotationally displaced relative to the first cell. An optical exposure process can be applied (620) to the optical recording material of the second cell to form a second optical structure. Various optical exposure processes, including but not limited to the exposure processes for the first cell, can be utilized.

Although FIGS. 2A-2F and 4-6 conceptually illustrate specific processes for fabricating optical structures in a stack of two layers of recording material, it is to be understood that the basic principle can be applied to many different fabrication processes and variations of such in accordance with various embodiments of the invention. For example, the processes described above can be extended to allow for the recording of stacks with more than two layers. In many embodiments, the processes described can be implemented iteratively to record optical structures in a stack of more than two layers of recording material. In such embodiments, a third layer of optical recording material can be deposited and an optical exposure process can be applied to the third layer to form an optical structure using a light beam that traverses through the erased first and second layers. In embodiments with processes for fabricating a waveguide stack with more than two layers, the methods for temporarily clearing the optical structures can be applied to more than one layer simultaneously. In some embodiments, layers and substrates that provide a waveguide layer can be separated from other waveguide layers by air gaps or layers of low refractive index material. In several embodiments, nanoporous material can be used to separate the waveguide layers.

As described above, various steps in the processes conceptually illustrated in FIGS. 5 and 6 can be performed similarly to their counterparts in the process conceptually illustrated in FIG. 4. Additionally, some steps can be performed independent of previous steps. Such steps can be performed concurrently or sequentially with other steps. For example, in the process of FIG. 6, the second cell can be formed concurrently with, subsequent to, or prior to the formation of first cell. In some embodiments, the order of some of the steps used in the above processes can be changed.

The above described processes can further include at least one of the steps of: applying electrodes to substrate surfaces for switching optical structures; providing an air gap in the stack of layers; applying a layer of low refractive index material; applying a polarization control layer; and/or applying a liquid crystal alignment layer. In such embodiments where a liquid crystal alignment layer is applied, the liquid crystal alignment layer can be a liquid crystal polymer or a linearly photopolymerizable ("LPP") material. In embodiments where a polarization layer is applied, the polarization control layer can be a half wave plate or a quarter waveplate.

It is to be understood that the various components, such as optical substrates and optical recording materials, utilized in the processes can differ from application to application. Even among a single application, different materials can be used. For example, in a given application, optical substrates utilized can include plates made of a transparent material, such as glass or plastic. The plastic substrates can be fabricated in various ways, such as but not limited to using the materials and processes disclosed in PCT Application No.: PCT/GB2012/000680, entitled IMPROVEMENTS TO HOLOGRAPHIC POLYMER DISPERSED LIQUID CRYSTAL MATERIALS AND DEVICES, the disclosure of which is hereby incorporated by reference in its entirety. In many embodiments, at least one of the substrates can be curved and fabricated from various materials, such as but not limited to plastic and various flexible materials. In some embodiments, the optical layer is formed into a wedge by tilting one of the substrates. In several embodiments, a wedged optical layer is formed by controlling the layer thickness in a coating process. In various embodiments, substrates of similar materials are used. In other embodiments, different substrate materials can be used in the same application.

The same principle discussed above can be applied to the optical recording materials. Various optical recording materials, such as but not limited to HPDLC mixtures, can be used in the processes described above. In several embodiments, the layers having optical structures can be formed from the same type of optical recording material. In other embodiments, each layer is formed from an optical recording material that is formularized for a different application that can differ from the formulation of the optical recording material in a different layer. In many embodiments, the optical recording material can be a low haze material, such as those described in U.S. patent application Ser. No. 16/242,943, entitled LOW HAZE LIQUID CRYSTAL MATERIALS, the disclosure of which is hereby incorporated by reference in its entirety. In some embodiments, the optical recording material can be one optimized for recording holographic gratings with high sensitivity to S and P polarized light, such as those described in U.S. patent application Ser. No. 16/242,954, entitled LIQUID CRYSTAL MATERIALS AND FORMULATIONS, the disclosure of which is hereby incorporated by reference in its entirety.

Many embodiments in accordance with the invention can be applied in various mass production processes. In some embodiments, fabrication processes, such as those described above, are implemented within a roll-to-roll fabrication process. In several embodiments, the processes can be used in the manufacturing of an environmentally isolated waveguide display according to the embodiments and teachings of U.S. patent application Ser. No. 15/543,016, entitled ENVIRONMENTALLY ISOLATED WAVEGUIDE DISPLAY. The disclosure of U.S. patent application Ser. No. 15/543,016 is hereby incorporated by reference in its entirety for all purposes. In a number of embodiments, the fabrication processes can be applied in the manufacture of a waveguide integrated within a window as disclosed in the above reference.

In some embodiments, SBGs are recorded in a uniform modulation material, such as polymer liquid crystal polymer slices ("POLICRYPS") or polymer liquid crystal polymer holograms electrically manageable ("POLIPHEM") mixtures having a matrix of solid liquid crystals dispersed in a liquid polymer. The SBGs can be switching or non-switching in nature. In its non-switching form, an SBG has the advantage over conventional holographic photopolymer materials of providing high refractive index modulation due to its liquid crystal component. Exemplary uniform modulation liquid crystal-polymer material systems, characterized by high refractive index modulation (and hence high diffraction efficiency) and low scatter, are disclosed in United State Patent Application Publication No.: 2007/0019152 by Caputo et al. and PCT Application No.: PCT/EP2005/006950 by Stumpe et al., the disclosures of which are incorporated herein by reference in their entireties for all purposes.

In many embodiments, the gratings are recorded in a reverse mode HPDLC, which differs from conventional HPDLC in that the grating is passive when no electric field is applied and becomes diffractive in the presence of an electric field. The reverse mode HPDLC can be based on any recipes and processes, such as those described in PCT Application No.: PCT/GB2012/000680, entitled IMPROVEMENTS TO HOLOGRAPHIC POLYMER DISPERSED LIQUID CRYSTAL MATERIALS AND DEVICES, the disclosure of which is hereby incorporated by reference in its entirety. The grating can be recorded in any of the above material systems and used in a passive (non-switching) mode. The fabrication process can be identical to that used for switched gratings but with the electrode coating stage being omitted.

Although specific fabrication processes are discussed above, many different processes can be implemented in accordance with many different embodiments of the invention. It is therefore to be understood that the present invention can be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents. Although specific embodiments have been described in detail in this disclosure, many modifications are possible (for example, variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

Doctrine of Equivalents

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A method of fabricating an optical element, the method comprising:
providing a first optical substrate;
depositing a first layer of a first optical recording material onto the first optical substrate;
applying an optical exposure process to the first layer to form a first optical structure;
temporarily erasing the first optical structure;
depositing a second layer of a second optical recording material; and
applying an optical exposure process to the second layer to form a second optical structure, wherein the optical exposure process comprises using at least one light beam traversing the first layer.

2. The method of claim 1, further comprising:
providing a second optical substrate, wherein the second layer is deposited onto the second optical substrate; and
overlapping the second optical substrate with the first optical substrate.

3. The method of claim 2, wherein the second optical substrate is laterally or rotationally displaced relative to the first optical substrate.

4. The method of claim 1, further comprising:
applying a first cover layer to the first layer; and
applying a second cover layer to the second layer.

5. The method of claim 1, wherein the at least one light beam is provided by an apparatus selected from the group consisting of: a crossed-beam holographic recording apparatus; a contact copying apparatus using a master grating or hologram; and an apparatus for traversing light with a predefined beam cross section.

6. The method of claim 1, wherein the first optical structure is temporarily erased by applying an external stimulus.

7. The method of claim 6, wherein the external stimulus comprises a stimulus selected from the group consisting of: an optical stimulus; a thermal stimulus; a chemical stimulus; a mechanical stimulus; an electrical stimulus; and a magnetic stimulus.

8. The method of claim 6, wherein the external stimulus is applied at a strength below a predefined threshold to produce optical noise below a predefined level.

9. The method of claim 1, further comprising:
temporarily erasing the second optical structure;
depositing a third layer of a third optical recording material;
applying an optical exposure process to the third layer to form a third optical structure using at least one light beam traversing the first layer and the second layer.

10. The method of claim 1, wherein at least one of the first and second optical structures modifies at least one of: phase; amplitude; and wavefront of incident light.

11. The method of claim 1, wherein the first optical recording material and the second optical recording material comprise different material formulations.

12. The method of claim 1, wherein the first optical recording material comprises a mixture of liquid crystal and polymer; and wherein the first optical structure comprises at least one grating.

13. The method of claim 12, wherein the first optical recording material further comprises at least one of: a LPP; a dye; a photoinitiator; a surfactant; a multi-function monomer; and nanoparticles.

14. The method of claim 12, wherein temporarily erasing the first optical structure comprises changing the order parameter of the liquid crystal.

15. The method of claim 1, wherein the first optical recording material comprises a liquid crystal, polymer, and an additive for temporarily erasing the first optical structure.

16. The method of claim 1, wherein the first optical recording material is deposited onto the first optical substrate using spin coating or inkjet printing.

17. The method of claim 1, wherein the first optical substrate is curved.

18. The method of claim 1, further comprising at least one of the steps of: forming an air gap; applying a layer of low refractive index material; applying a polarization control layer; and applying a liquid crystal alignment layer.

19. The method of claim 1, forming part of a roll-to-roll fabrication process.

20. A method of fabricating an optical element, the method comprising:
providing first and second optical substrates;
forming a first cell from the first and second substrates;
filling the first cell with a first optical recording material;
applying an optical exposure process to the first cell to form a first optical structure;
temporarily erasing the first optical structure;
providing third and fourth optical substrates;
forming a second cell from the third and fourth substrates;
filling the second cell with a second optical recording material;
overlapping the first and second cells; and
applying an optical exposure process to the second layer to form a second optical structure, wherein the optical exposure process comprises using at least one light beam traversing the first layer.

* * * * *